(12) United States Patent
Tsuji

(10) Patent No.: US 11,887,975 B2
(45) Date of Patent: Jan. 30, 2024

(54) SEMICONDUCTOR DEVICE MANUFACTURING METHOD

(71) Applicant: DAICEL CORPORATION, Osaka (JP)

(72) Inventor: Naoko Tsuji, Tokyo (JP)

(73) Assignee: DAICEL CORPORATION, Osaka (JP)

( * ) Notice: Subject to any disclaimer, the term of this patent is extended or adjusted under 35 U.S.C. 154(b) by 208 days.

(21) Appl. No.: 17/287,922

(22) PCT Filed: Oct. 18, 2019

(86) PCT No.: PCT/JP2019/041197
§ 371 (c)(1),
(2) Date: Apr. 22, 2021

(87) PCT Pub. No.: WO2020/085257
PCT Pub. Date: Apr. 30, 2020

(65) Prior Publication Data
US 2021/0384184 A1    Dec. 9, 2021

(30) Foreign Application Priority Data

Oct. 23, 2018  (JP) ................................ 2018-199011
Oct. 23, 2018  (JP) ................................ 2018-199012

(51) Int. Cl.
*H01L 21/683* (2006.01)
*H01L 25/00* (2006.01)
(Continued)

(52) U.S. Cl.
CPC .......... *H01L 25/50* (2013.01); *H01L 21/6835* (2013.01); *H01L 24/00* (2013.01);
(Continued)

(58) Field of Classification Search
CPC ..... H01L 25/50; H01L 21/6835; H01L 24/29; H01L 24/33; H01L 24/83; H01L 24/94;
(Continued)

(56) References Cited

U.S. PATENT DOCUMENTS 7,494,845 B2 *  2/2009  Hwang ................. H01L 23/481
                                                                438/455
8,017,439 B2 *  9/2011  Takahashi ................. C09J 5/06
                                                                438/459

(Continued)

FOREIGN PATENT DOCUMENTS

JP    2013-77767 A     4/2013
JP    2015-119110 A    6/2015
(Continued)

OTHER PUBLICATIONS

U.S. Notice of Allowance for U.S. Appl. No. 17/286,738, dated Feb. 17, 2023.
(Continued)

*Primary Examiner* — Vu A Vu
(74) *Attorney, Agent, or Firm* — Birch, Stewart, Kolasch & Birch, LLP

(57) ABSTRACT

Provided is a semiconductor device manufacturing method in which semiconductor elements are formed into multiple layers through the lamination of wafers in which the semiconductor elements are fabricated, the method being suited for efficiently creating multiple layers of thin wafers while suppressing warping of a wafer laminate. The method of the present invention includes a preparation step, a thinning step, a bonding step, a removal step, and a multilayering step. In the preparation step, a reinforced wafer is prepared, the reinforced wafer having a laminated structure that includes: a wafer including an element forming surface and a back surface opposite from the element forming surface; a supporting substrate; and a temporary adhesive layer for (Continued)

forming temporary adhesion, the temporary adhesive layer being provided between the element forming surface side of the wafer and the supporting substrate.

21 Claims, 23 Drawing Sheets

(51) Int. Cl.
  *H01L 23/00* (2006.01)
  *H01L 21/304* (2006.01)
  *H01L 21/768* (2006.01)
  *H01L 25/065* (2023.01)

(52) U.S. Cl.
  CPC .............. *H01L 24/29* (2013.01); *H01L 24/83* (2013.01); *H01L 24/94* (2013.01); *H01L 24/98* (2013.01); *H01L 21/304* (2013.01); *H01L 21/76898* (2013.01); *H01L 24/32* (2013.01); *H01L 25/0657* (2013.01); *H01L 2221/68327* (2013.01); *H01L 2221/68386* (2013.01); *H01L 2224/2919* (2013.01); *H01L 2224/32145* (2013.01); *H01L 2224/32225* (2013.01); *H01L 2224/33181* (2013.01); *H01L 2224/83005* (2013.01); *H01L 2224/83203* (2013.01); *H01L 2225/06541* (2013.01); *H01L 2924/3511* (2013.01)

(58) Field of Classification Search
  CPC . H01L 24/98; H01L 21/304; H01L 21/76898; H01L 24/32; H01L 25/0657; H01L 2221/68327; H01L 2221/68386; H01L 2224/2919; H01L 2224/32145; H01L 2224/32225; H01L 2224/33181; H01L 2224/83005; H01L 2224/83203; H01L 2225/06541; H01L 2924/3511; H01L 23/481; H01L 2221/68318; H01L 2221/68381; H01L 21/02216; H01L 21/02282; H01L 21/185; H01L 21/02164; H01L 21/02; H01L 25/074; H01L 25/18; H01L 2221/68359; C08L 83/06; C09J 135/08; C09J 2203/326
  USPC ........................................................ 438/459
  See application file for complete search history.

(56) References Cited

U.S. PATENT DOCUMENTS

| | | | | |
|---|---|---|---|---|
| 8,076,788 | B2* | 12/2011 | Haba ........................ | H01L 24/97 257/777 |
| 8,415,202 | B2* | 4/2013 | Ohba ................... | B81C 1/00238 438/109 |
| 8,415,235 | B2* | 4/2013 | Kawata ................... | C09J 175/16 438/464 |
| 8,415,807 | B2 | 4/2013 | Wang | |
| 9,070,729 | B2 | 6/2015 | Ji et al. | |
| 9,391,049 | B2* | 7/2016 | Lin ......................... | H01L 25/50 |
| 9,406,748 | B1* | 8/2016 | Balakrishnan .... | H01L 29/66439 |
| 9,543,257 | B2 | 1/2017 | Tsai et al. | |
| 9,640,531 | B1 | 5/2017 | Or-Bach et al. | |
| 9,960,080 | B2 | 5/2018 | Beyne | |
| 10,014,292 | B2* | 7/2018 | Or-Bach ............... | H01L 25/117 |
| 10,163,864 | B1 | 12/2018 | England | |
| 10,947,425 | B2 | 3/2021 | Koduma et al. | |
| 10,964,576 | B2* | 3/2021 | Yamamoto ........ | H01L 21/67092 |
| 11,069,560 | B2 | 7/2021 | Konishi et al. | |
| 2003/0157748 | A1 | 8/2003 | Kim et al. | |
| 2006/0102993 | A1 | 5/2006 | Tsai et al. | |
| 2010/0109164 | A1 | 5/2010 | Kang et al. | |
| 2011/0165730 | A1 | 7/2011 | Ohba | |
| 2012/0025362 | A1* | 2/2012 | Chandrasekaran ... | H01L 21/565 257/E23.116 |
| 2013/0234339 | A1 | 9/2013 | Higashi et al. | |
| 2014/0183728 | A1* | 7/2014 | Han ..................... | H01L 25/0652 257/737 |
| 2016/0163579 | A1 | 6/2016 | Nakamura et al. | |
| 2017/0372935 | A1* | 12/2017 | Val .......................... | H01L 24/97 |
| 2018/0047619 | A1* | 2/2018 | Lehnert ................... | H01L 21/78 |
| 2019/0119534 | A1 | 4/2019 | Koduma et al. | |
| 2019/0206844 | A1 | 7/2019 | Lee | |
| 2019/0311964 | A1 | 10/2019 | Nakamura et al. | |
| 2020/0062996 | A1 | 2/2020 | Kikuchi | |

FOREIGN PATENT DOCUMENTS

| | | |
|---|---|---|
| JP | 2016-4835 A | 1/2016 |
| JP | 2016-178162 A | 10/2016 |
| JP | 2017-132919 A | 8/2017 |
| KR | 10-2010-0068942 A | 6/2010 |
| KR | 10-2017-0140985 A | 12/2017 |
| WO | WO 2010/032729 A1 | 3/2010 |
| WO | WO 2016/204115 A1 | 12/2016 |
| WO | WO 2017/061416 A1 | 4/2017 |

OTHER PUBLICATIONS

Written Opinion of the International Searching Authority and International Search Report dated Dec. 3, 2019, for International Application No. PCT/JP2019/041196, with English translations.
Written Opinion of the International Searching Authority and International Search Report dated Jan. 7, 2020, for International Application No. PCT/JP2019/041197, with English translations.
Written Opinion of the International Searching Authority and International Search Report dated Jan. 7, 2020, for International Application No. PCT/JP2019/041198, with English translations.
Written Opinion of the International Searching Authority and International Search Report dated Jan. 7, 2020, for International Application No. PCT/JP2019/041202, with English translations.
Korean Office Action dated Jul. 25, 2022 for Application No. 10-2021-7014956.
U.S. Office Action dated Sep. 30, 2022 for U.S. Appl. No. 17/286,738.
U.S. Office Action for U.S. Appl. No. 17/286,725, dated May 26, 2023.
Korean Office Action dated May 30, 2023 for Application No. 10-2021-7014991.
U.S. Notice of Allowance dated Oct. 13, 2023 for U.S. Appl. No. 17/286,725.
U.S. Office Action dated Oct. 20, 2023 for U.S. Appl. No. 17/287,187.

* cited by examiner (a)

(b)

(c)

(a)

(b)

(a)

(b)

SEMICONDUCTOR DEVICE MANUFACTURING METHOD

TECHNICAL FIELD

The present invention relates to a method of manufacturing a semiconductor device having a laminated structure including a plurality of semiconductor elements. The present application claims the rights of priority on the basis of JP 2018-199011 and JP 2018-199012 filed in Japan on Oct. 23, 2018, the entire contents of which are incorporated herein by reference.

BACKGROUND ART

In recent years, technology for manufacturing semiconductor devices having a three-dimensional structure in which a plurality of semiconductor chips or semiconductor elements are integrated in the thickness direction thereof has been developed primarily, for the purpose of further increasing the density of semiconductor devices. One of such a technology widely known is a wafer-on-wafer (WOW) process. In the WOW process, a structure is formed such that a predetermined number of semiconductor wafers are laminated in order, within which a plurality of semiconductor elements are fabricated for each of the semiconductor wafers. In such a structure, the semiconductor elements are arranged in multilayers in their thickness direction, and the wafer laminate is divided into individual semiconductor devices through dicing. Technology relating to such a WOW process is described, for example, in Patent Documents 1 and 2 listed below.

CITATION LIST

Patent Document

Patent Document 1: WO 2010/032729
Patent Document 2: JP 2016-178162 A

SUMMARY OF INVENTION

Technical Problem

The typical WOW process is performed, for example, as follows. First, each of a plurality of semiconductor wafers including: an element forming surface on which a plurality of semiconductor elements are formed through a transistor formation step, a wiring formation step, and the like; and a back surface opposite from the element forming surface, is thinned by grinding the back surface side. Next, the back surface side of one wafer that has undergone thinning is bonded to an element forming surface side of a thick base wafer, and the thin wafer is laminated onto the base wafer. Next, the back surface side of another wafer that has undergone thinning is bonded to the element forming surface side of the thin wafer bonded on the base wafer, thereby further laminating another thin wafer. Such additional wafer lamination is implemented a predetermined number of times. The wafer laminate obtained in this manner is divided into individual semiconductor devices having a structure in which a plurality of semiconductor chips are laminated, and this division is implemented by collectively cutting the plurality of wafers in the thickness direction of the wafer laminate.

However, according to such a method, a wafer laminate having an asymmetric laminated configuration in the thickness direction is formed. The bonding mode between thin wafers sequentially laminated according to the method described above is bonding between an element forming surface of a wafer laminated in advance onto the base wafer and a back surface side of a wafer to be further laminated, that is, face-to-back bonding. In the wafer laminate to be formed, such bonding mode is continuous in the lamination direction. That is, the formed wafer laminate has an asymmetric laminated configuration in the thickness direction thereof. Wafer laminates having asymmetric laminated configurations are prone to warping. The extent of warping tends to accumulate and increase as the total number of wafers (that is, the total number of bonds between wafers) of the wafer laminate increases. Warping of the wafer laminate is not desirable as the wafer laminate is subjected to various processing steps that require high precision.

The present invention was conceived on the basis of the circumstances described above, and an object of the present invention is to provide a semiconductor device manufacturing method in which semiconductor elements are formed into multiple layers through lamination of wafers in which the semiconductor elements are fabricated, the method being suited for efficiently creating multiple layers of thin wafers while suppressing warping of the wafer laminate.

Solution to Problem

A semiconductor device manufacturing method provided by the present invention includes at least a preparation step, a thinning step, a bonding step, a removal step and a multilayering step as described below.

In the preparation step, a reinforced wafer is prepared, the reinforced wafer having a laminated structure that includes: a wafer including an element forming surface and a back surface opposite from the element forming surface; a supporting substrate; and a temporary adhesive layer for forming temporary adhesion, the temporary adhesive layer being provided between the element forming surface side of the wafer and the supporting substrate. In the thinning step, the wafer of the reinforced wafer is ground from the back surface side to form a thinned wafer. In the bonding step, the surface of the reinforced wafer and the surface of another wafer including an element forming surface and a back surface opposite from the element forming surface are bonded to form a wafer laminate. In the removal step, the supporting substrate of the wafer laminate is removed. In the multilayering step, the surface of the wafer laminate that has been subjected to the removal step; and the surface of another wafer laminate are bonded to form a wafer laminate With the semiconductor device manufacturing method according to the present invention, the wafer laminate obtained through the multilayering step is a wafer laminate having a symmetrical laminated configuration in the thickness direction thereof. Here, a wafer laminate having a symmetrical laminated configuration in the thickness direction means that the layered configuration of part or all of the wafer laminate is symmetrical in the thickness direction.

A semiconductor device manufacturing method according to a first aspect of the present invention will be described below.

In a preparation step, two reinforced wafers are prepared. Each reinforced wafer has a laminated structure that includes a wafer including an element forming surface and a back surface opposite from the element forming surface, a supporting substrate, and a temporary adhesive layer between the element forming surface side of the wafer and the supporting substrate. The element forming surface of the wafer is a side of the surface on which a plurality of semiconductor elements are formed through a transistor formation step, a wiring formation step, or the like. The temporary adhesive layer is used to achieve temporary adhesion between the wafer and the supporting substrate, and the temporary adhesion can be subsequently released.

In a thinning step, the wafer of each reinforced wafer is ground from the back surface side thereof and thinned. This forms a thinned wafer in a state of being supported by the supporting substrate.

In the bonding step, an element forming surface side of a base wafer including the element forming surface and a back surface opposite therefrom is bonded through an adhesive to the back surface side of the above-described thinned wafer of the reinforced wafer (face-to-back bonding), and a first wafer laminate is formed. In this step, adhesive bonding with one base wafer is implemented for each reinforced wafer, and two first wafer laminates are obtained. In each bonding step, for example, the adhesive is coated onto one or both surfaces to be bonded (the element forming surface of the base wafer, the back surface of the thinned wafer), the surfaces to be bonded are affixed through the adhesive, and the adhesive is cured after the affixing. In addition, in each bonding step, one or both of the surfaces to be bonded may be treated with a silane coupling agent prior to application of the adhesive.

In the removal step, the supporting substrate is removed from each of the first wafer laminates. Specifically, the temporary adhesion created by the temporary adhesive layer between the thinned wafer and the supporting substrate of each first wafer laminate obtained through the above-described bonding step is released, and the supporting substrate is removed.

In the multilayering step, a second wafer laminate is formed by bonding (face-to-face bonding), through an adhesive, the element forming surface sides of thinned wafers of two first wafer laminates that have undergone the removal step, or by bonding (back-to-back bonding), through an adhesive, the back surface sides of the base wafers of two first wafer laminates that have undergone the removal step.

In the present semiconductor device manufacturing method, as described above, the wafer (the wafer of the reinforced wafer) affixed to the supporting substrate through the temporary adhesive layer to achieve temporary adhesion is thinned and then adhesive bonded to the base wafer (bonding step), and then the supporting substrate is removed from the thinned wafer (removal step). Such a configuration is suitable for adhesive bonding a thin wafer to a thicker, mechanically strong base wafer while avoiding wafer damage and thus is suitable for forming structures in which thin wafers are arranged in multiple layers.

In addition, with the present semiconductor device manufacturing method, as described above, the element forming surface sides of thinned wafers of two first wafer laminates that have been subjected to the removal step are adhesively bonded (face-to-face bonding), or the back surface sides of the base wafers of two first wafer laminates that have undergone the removal step are adhesively bonded (back-to-back bonding), and multilayering of thin wafers is achieved. The wafer laminate (the second wafer laminate) thus obtained has a symmetrical laminated configuration in the thickness direction thereof. In the second wafer laminate obtained by the aforementioned face-to-face bonding in the multilayering step, the element forming surfaces of all of the wafers included in the second wafer laminate face the face-to-face bonding site side (inner side). In the second wafer laminate obtained by the aforementioned back-to-back bonding in the multilayering step, the back surfaces of all of the wafers included in the second wafer laminate face the back-to-back bonding site side (inner side). Wafer laminates (second wafer laminates) having such a symmetrical laminated configuration in the thickness direction are less prone to warping.

As described above, the present semiconductor device manufacturing method is suitable for multilayering thin wafers through adhesive bonding while suppressing warping of the wafer laminate.

The present method of manufacturing a semiconductor device preferably further includes a step of thinning the base wafer by grinding the back surface side in the base wafer. The present thinning step allows the base wafer to be thinned to a predetermined thickness. This type of base wafer thinning step may be performed after the above-described bonding step and before the removal step, may be performed sometime between the removal step and the multilayering step, or may be performed after the multilayering step. This configuration in which the semiconductor device manufacturing method includes a base wafer thinning step is suitable for reducing the thickness of the semiconductor device to be manufactured.

The present method of manufacturing a semiconductor device preferably further includes a step of preparing at least one additional reinforced wafer, a thinning step for each additional reinforced wafer, at least one additional bonding step for each additional reinforced wafer, and a removal step after the additional bonding step. The additional reinforced wafer has a laminated structure that includes a wafer including an element forming surface and a back surface opposite from the element forming surface, a supporting substrate, and a temporary adhesive layer for forming temporary adhesion between the element forming surface side of the wafer and the supporting substrate. In the thinning step for each additional reinforced wafer, the wafer in such an additional reinforced wafer is ground from the back surface side of the wafer to form a thinned wafer. In the additional bonding step, the back surface side of the thinned wafer in the additional reinforced wafer is bonded (face-to-back bonding) through an adhesive to the element forming surface side of the thinned wafer in the first wafer laminate. The thinned wafer in the first wafer laminate is a thinned wafer bonded to the base wafer in the bonding step described above or is a thinned wafer additionally laminated on a thinned wafer in a preceding additional bonding step. In such an additional bonding step, for example, the adhesive is coated onto one or both surfaces to be bonded (the element forming surface of one thinned wafer, the back surface of the other thinned wafer), the surfaces to be bonded are affixed through the adhesive, and the adhesive is cured after the affixing. In addition, in the additional bonding step, prior to the coating of the adhesive, one or both of the surfaces to be bonded may be treated with a silane coupling agent. Then, in the removal step after the additional bonding step, in the first wafer laminate having a thinned wafer further laminated through the additional bonding step, the temporary adhesion created by the temporary adhesive layer between the supporting substrate and the thinned wafer is released, and the supporting substrate is removed. The configuration as described above is suitable for further multilayering thin wafers via adhesive bonding while avoiding wafer damage.

The present method for manufacturing a semiconductor device preferably further includes, after the above-described multilayering step, a step of forming a through electrode extending through a plurality of thinned wafers and at least one base wafer in the second wafer laminate. Alternatively, the method of manufacturing a semiconductor device may further include, before the multilayering step, a step of forming a through electrode extending through the inside of a first wafer laminate from an element forming surface of a thinned wafer located at one end of each first wafer laminate in the lamination direction to an element forming surface of a base wafer located at the other end thereof. According to these configurations, semiconductor elements can be appropriately electrically connected at short distances in a semiconductor device to be manufactured. Thus, these configurations are suitable for achieving efficient digital signal processing, for reducing attenuation of the high-frequency signal, and also for reducing power consumption in a semiconductor device to be manufactured.

The adhesive used in the bonding step and the adhesive used in the additional bonding step preferably contain a polymerizable group-containing polyorganosilsesquioxane (that is, a polyorganosilsesquioxane having a polymerizable functional group). The polymerizable group-containing polyorganosilsesquioxane is suitable for achieving a relatively low polymerization temperature or curing temperature of, for example, approximately 30 to 200° C. and is suitable for achieving high heat resistance after curing. Thus, the wafer-to-wafer adhesive bonding with the adhesive containing the polymerizable group-containing polyorganosilsesquioxane is suitable for achieving high heat resistance in an adhesive layer to be formed between the wafers as well as for achieving a lower curing temperature for forming the adhesive layer and thus suppressing damage to the elements in the wafer as an adherend.

The temporary adhesive for forming a temporary adhesive layer within the reinforced wafer preferably contains: a polyvalent vinyl ether compound; a compound that has two or more hydroxy groups or carboxy groups that are capable of forming an acetal bond by reacting with a vinyl ether group of the polyvalent vinyl ether compound, the compound capable of forming a polymer with the polyvalent vinyl ether compound; and a thermoplastic resin. That is, the temporary adhesive layer in the reinforced wafer is preferably formed by solidifying the polymer that is produced in this type of temporary adhesive interposed between the wafer and the supporting substrate. In the form of a temporary adhesive layer cured and formed between the supporting substrate and the wafer, the temporary adhesive thus configured is suitable for achieving a relatively high softening temperature of, for example, approximately 130 to 250° C. while ensuring high adhesive strength that can withstand the grinding or the like in the thinning step of the wafer.

The temporary adhesive layer inside the reinforced wafer to be subjected to the bonding step or the additional bonding step has the above-described composition suited for achieving a relatively high softening temperature, and if the adhesive used in these bonding steps contains a polymerizable group-containing polyorganosilsesquioxane suited for realizing a relatively low curing temperature and high heat resistance after curing, such composite configuration is suitable for implementing the bonding step and additional bonding step and for implementing the subsequent removal step. That is, the composite configuration thereof is suitable for implementing the bonding step and additional bonding step at a relatively low temperature condition, and achieving good adhesive bonding of the thinned wafer to the other wafer (base wafer in the bonding step, or another thinned wafer that is one constituent element of the first wafer laminate in the additional bonding step) while maintaining the temporary adhesion of the supporting substrate and the thinned wafer in the reinforced wafer. The composite configuration is also suitable for implementing the subsequent removal step at a relatively high temperature condition to soften the temporary adhesive layer and remove the supporting substrate from the thinned wafer while maintaining the adhesive bonding between the thinned wafer and the other wafer. The configuration of releasing the temporary adhesion by the temporary adhesive layer by softening the temporary adhesive layer when removing the supporting substrate from the thinned wafer is suitable for avoiding or suppressing a strong stress applied locally to the thinned wafer, and thereby avoiding damage to the wafer.

In the present semiconductor device manufacturing method, the bonding step preferably includes curing treatment to cure the adhesive at a temperature lower than the softening point of the polymer in the temporary adhesive layer, and the removal step after the bonding step preferably includes softening treatment to soften the temporary adhesive layer at a temperature higher than the softening point of the polymer in the temporary adhesive layer. In addition, in the present semiconductor device manufacturing method, the above-described additional bonding step preferably includes curing treatment to cure the adhesive at a temperature lower than the softening point of the polymer in the temporary adhesive layer, and the removal step after the additional bonding step preferably includes softening treatment to soften the temporary adhesive layer at a temperature higher than the softening point of the polymer in the temporary adhesive layer.

A semiconductor device manufacturing method according to a second aspect of the present invention will be described below.

In the preparation step, at least four (that is, a necessary quantity of four or more) reinforced wafers are prepared. Each reinforced wafer has a laminated structure that includes a wafer including an element forming surface and a back surface opposite therefrom, a supporting substrate, and a temporary adhesive layer for forming temporary adhesion between the element forming surface side of the wafer and the supporting substrate of the wafer. The element forming surface of the wafer is the surface of a side on which a plurality of semiconductor elements are formed through a transistor formation step, and if necessary, a wiring formation step, or the like. In the thinning step, the wafer is thinned by grinding the back surface side of the wafer in each of the reinforced wafers. In the bonding step, the back surface sides of wafers in two reinforced wafers that have undergone the thinning step are bonded, for example, through an adhesive layer or by direct bonding, and thereby at least two (that is, a necessary quantity of two or more) wafer double-layer bodies having the supporting substrate are formed. In the removal step, at least one supporting substrate in each of the wafer double-layer bodies is removed. In the multilayering step, the element forming surfaces exposed through the removal step in at least two (that is, a desired quantity of two or more) wafer double-layer bodies are bonded together through, for example, an adhesive layer or by direct bonding, and a wafer multi-laminate is formed.

In the bonding step of the present semiconductor device manufacturing method, as described above, the back surface sides of wafers of two reinforced wafers that have undergone the thinning step are bonded together (back-to-back bonding), and a wafer double-layer body is formed. In other words, the wafer double-layer body formed in the bonding step has a laminated configuration in which the back surfaces of the wafers are bonded together, and thus the laminated configuration is symmetrical in the thickness direction thereof. The wafer double-layer body (wafer laminate) having a symmetrical laminated configuration in the thickness direction is less prone to warping.

In addition, in the multilayering step of the present method, as described above, a wafer multi-laminate in which four or more wafers are laminated is formed by bonding the exposed element forming surface sides of wafers of a desired quantity of two or more wafer double-layer bodies, the element forming surface side thereof being exposed through the removal step. The wafer multi-laminate that is formed has a laminated configuration in which the element forming surface sides exposed in the wafer double-layer bodies are bonded together, and thereby the laminated configuration is symmetrical in the thickness direction thereof. For example, in a case in which two wafer double-layer bodies in which only one of the two supporting substrates has been removed in the aforementioned removal step are subjected to the multilayering step, the wafer multi-laminate formed in the multilayering step thereof includes two supporting substrates and four thinned wafers interposed between the supporting substrates, and has a laminated configuration that is symmetrical in the thickness direction with one face-to-face bonding site located between two back-to-back bonding sites in the laminate thickness direction. A wafer multi-laminate (wafer laminate) having a symmetrical laminated configuration in the thickness direction is less prone to warping.

Accordingly, the present semiconductor device manufacturing method is suitable for manufacturing a semiconductor device while suppressing warping of the wafer laminate (wafer double-layer body or wafer multi-laminate).

In addition, in the present semiconductor device manufacturing method, as described above, a thinning step is implemented in which the wafer to be laminated is thinned by grinding the back surface side of the wafer thereof. In order to properly implement this thinning, specifically, as described above, the wafer is subjected to a thinning step in a state of being bonded to a supporting substrate through a temporary adhesive layer in order to avoid damage to the wafer during thinning. Furthermore, in the bonding step described above, a wafer double-layer body is formed by bonding together the back surface sides of thin wafers of two reinforced wafers that have undergone this thinning step. The present semiconductor device manufacturing method configured in this manner is suitable for multilayering thin wafers.

As described above, the present semiconductor device manufacturing method is suitable for multilayering thin wafers while suppressing warping of the wafer laminate.

The present method for manufacturing the semiconductor device preferably further includes, further after the multilayering step, a step of removing the supporting substrate located at one end in the lamination direction of the wafer multi-laminate (a removal step after the multilayering step). From the perspective of handling a thin wafer that has been subjected to the thinning step, such a configuration in which the temporary adhesion between predetermined wafers is released after the multilayering step and the supporting substrate is removed is preferred.

The semiconductor device manufacturing method preferably further includes an additional multilayering step in which an exposed element forming surface side of a wafer of the wafer double-layer body, the wafer thereof being exposed by being subjected to the removal step, is bonded to an exposed element forming surface side of a wafer located at one end in the lamination direction of a wafer multi-laminate that has undergone the multilayering step or the subsequent removal step. Such a configuration is suitable for achieving further multilayering of a wafer in the wafer multi-laminate.

The present method of manufacturing a semiconductor device preferably further includes a step of forming a through electrode in a wafer multi-laminate. The through electrode formed in this step extends through an inside of a wafer multi-laminate from an element forming surface of a wafer located at one end in the lamination direction of the wafer multi-laminate to an element forming surface of a wafer located at the other end thereof. Such a configuration allows the semiconductor elements to be appropriately electrically connected at short distances in a semiconductor device to be manufactured. Thus, the configuration is suitable for achieving an efficient digital signal processing, for reducing attenuation of the high-frequency signal, and also for reducing power consumption in a semiconductor device to be manufactured.

In the present semiconductor device manufacturing method, the bonding of the back surface sides in the bonding step is preferably implemented using an adhesive containing, as a thermosetting resin, a polymerizable group-containing polyorganosilsesquioxane (that is, a polyorganosilsesquioxane having a polymerizable functional group). In such a bonding step, for example, the adhesive is coated onto one or both of the two back surfaces to be bonded, the back surfaces are affixed through the adhesive, and the adhesive is cured after the affixing. In addition, in the bonding step, prior to the coating of the adhesive, one or both of the surfaces to be bonded may be treated with a silane coupling agent.

In the present semiconductor device manufacturing method, the bonding of the element forming surface sides in the multilayering step is preferably implemented using an adhesive containing, as a thermosetting resin, a polymerizable group-containing polyorganosilsesquioxane (that is, a polyorganosilsesquioxane having a polymerizable functional group). In such a multilayering step, for example, the adhesive is coated onto one or both of the two element forming surfaces to be bonded, the element forming surfaces are affixed through the adhesive, and the adhesive is cured after the affixing. In addition, in the multilayering step, prior to the coating of the adhesive, one or both of the two element forming surfaces to be bonded may be treated with a silane coupling agent.

In comparison to direct bonding, adhesive bonding as described above between the wafers in the bonding step or the multilayering step is preferable from the perspective of the flatness required in the bonding surfaces of the wafers being low. In direct bonding, a high level of flatness on, for example, in the order of nanoscale is required on the wafer bonding surface. In contrast, with adhesive bonding, the adhesive layer that is formed exhibits a function of substantially absorbing, reducing and eliminating inclining and deviation of the wafer bonding surface from an ideal plane, and thus the requirement for flatness of the wafer bonding surface is alleviated compared to direct bonding. Such a configuration is preferable from the perspective of the ease of manufacturing a semiconductor device produced through multilayering of thin wafers, and also from the perspective of improving the manufacturing yield of semiconductor devices.

Thus, the above-described wafer-to-wafer adhesive bonding in the bonding step or multilayering step using an adhesive containing a polymerizable group-containing polyorganosilsesquioxane is suitable for achieving high heat resistance in the adhesive layer that is formed, and also for reducing the curing temperature for forming the adhesive layer and thus suppressing damage to the elements in the wafer as an adherend.

In the bonding step and the multilayering step described above, preferably, the affixing is implemented at a temperature of from room temperature to 80° C., and after this affixing, the adhesive is cured at a temperature of from 30 to 200° C. Such a configuration is suitable for suppressing dimensional changes of the adhesive interposed between the wafers when affixing, and also for achieving a lower curing temperature for forming the adhesive layer and thus suppressing damage to the elements in the wafer as an adherend.

DESCRIPTION OF EMBODIMENTS

Figure 1:
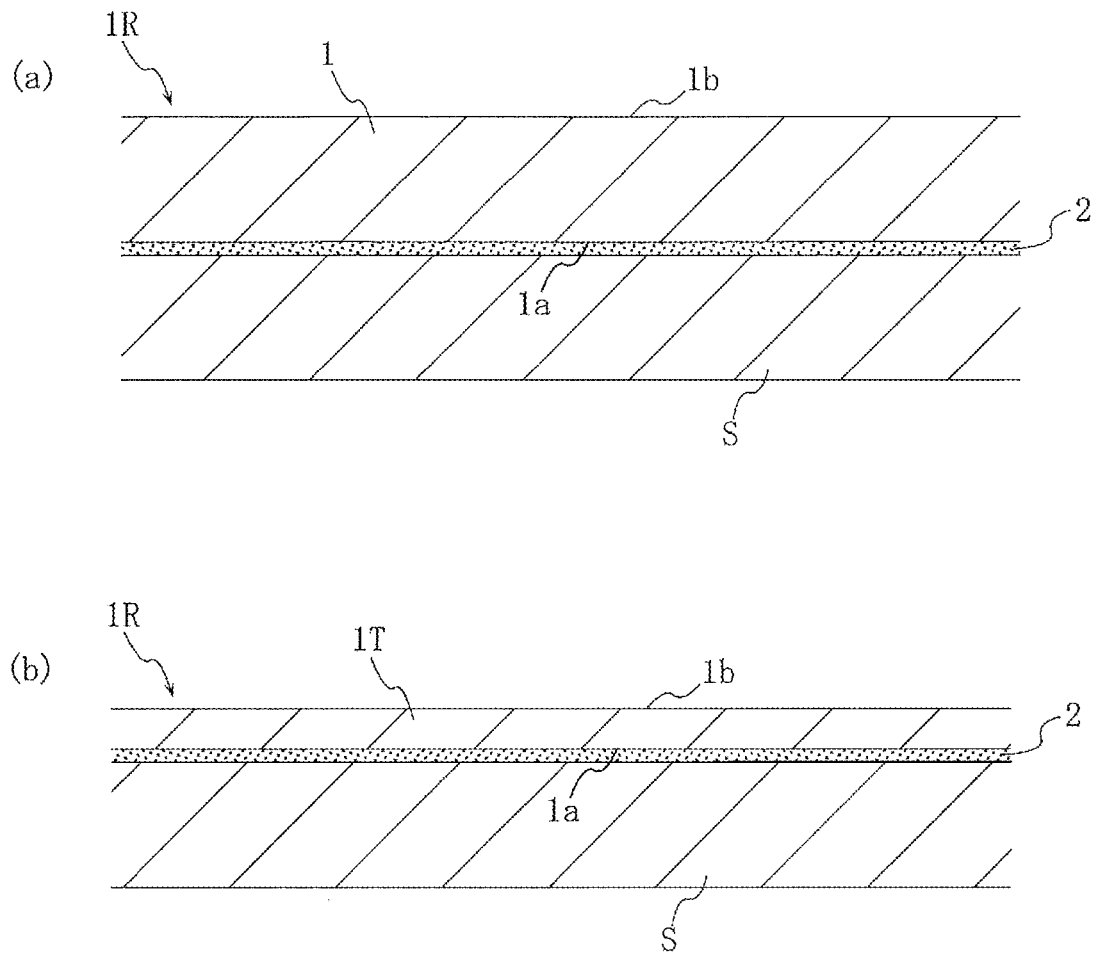
FIG. 1 illustrates some of the steps in a semiconductor device manufacturing method according to one embodiment of a first aspect of the present invention.
Figure 2:
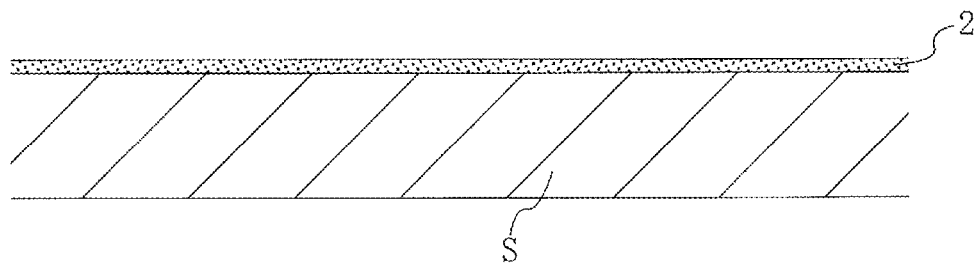
FIG. 2 illustrates some of the steps in the semiconductor device manufacturing method according to one embodiment of the first aspect of the present invention.
Figure 2:
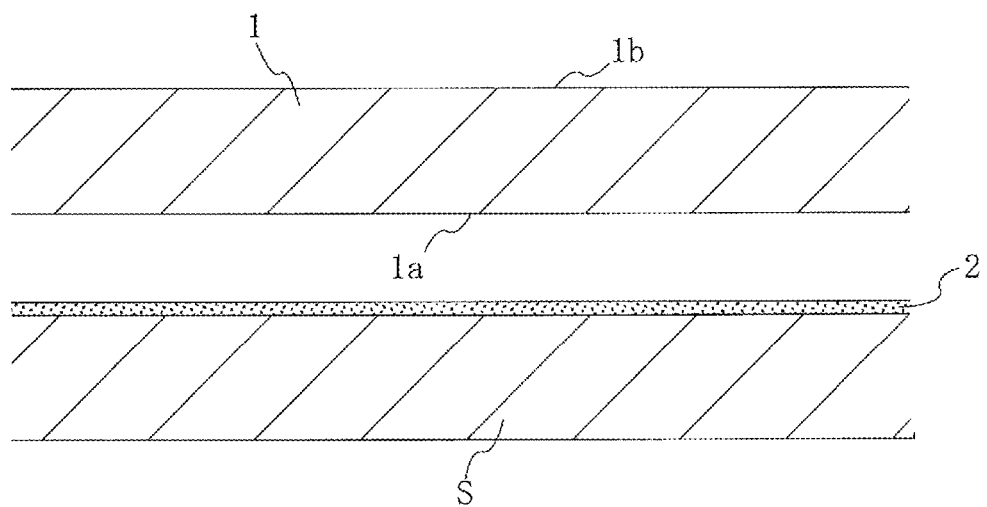
Figure 2:
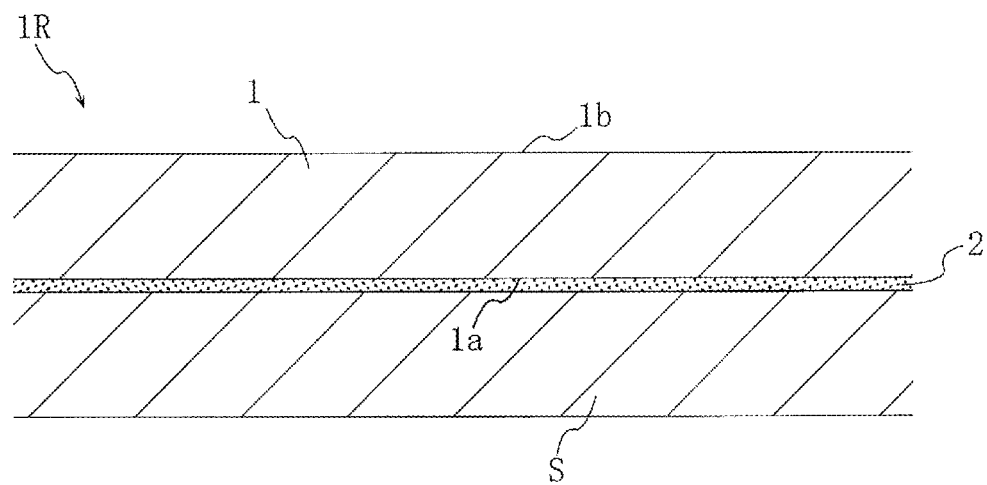
Figure 3:
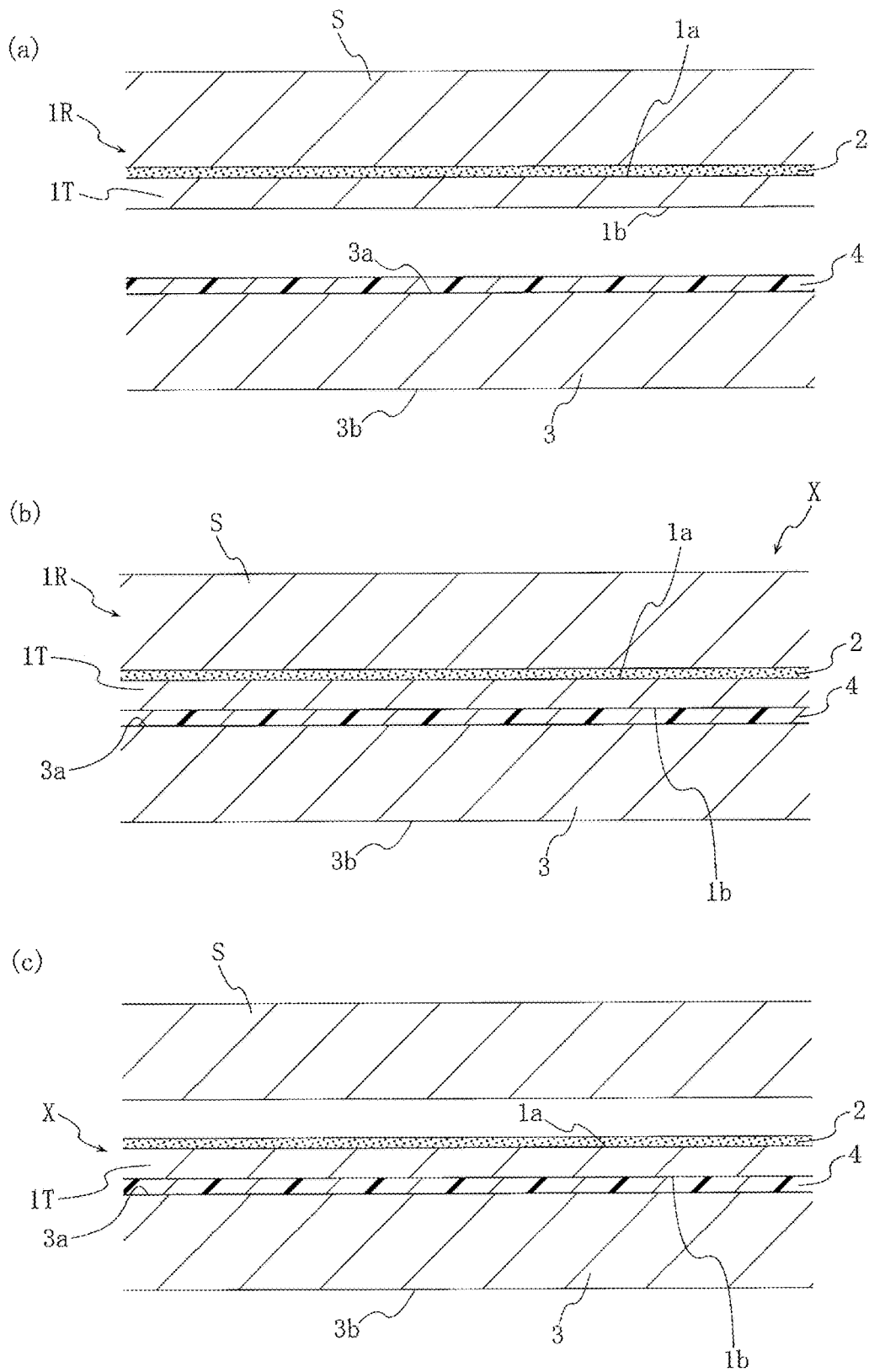
FIG. 3 illustrates some of the steps in the semiconductor device manufacturing method according to one embodiment of the first aspect of the present invention.
Figure 4:
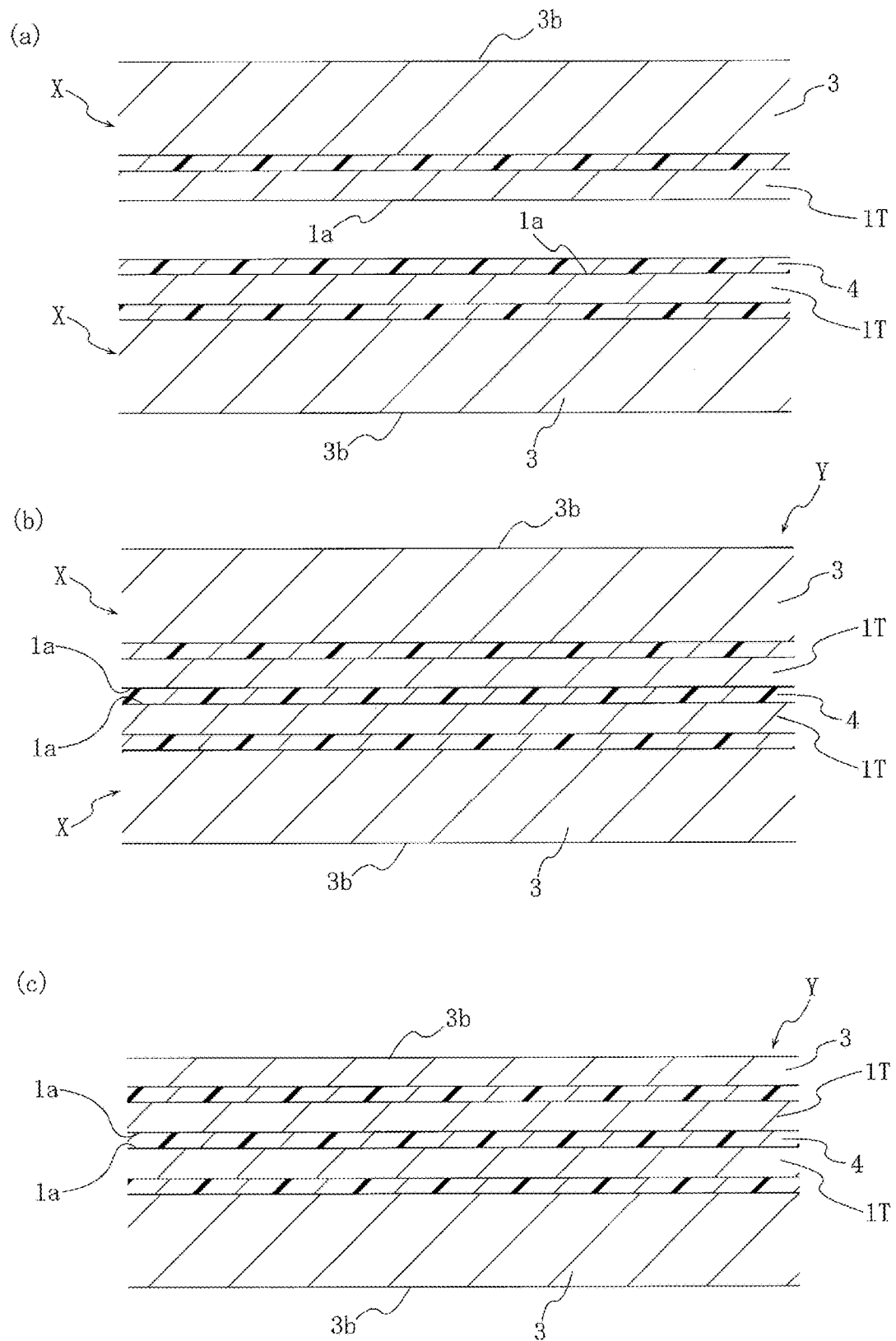
FIG. 4 illustrates some of the steps in the semiconductor device manufacturing method according to one embodiment of the first aspect of the present invention.

A semiconductor device manufacturing method according to a first aspect of the present invention will be described below.

FIG. 1 to FIG. 6 illustrate a semiconductor device manufacturing method according to one embodiment of the first aspect of the present invention. This manufacturing method is a method of manufacturing a semiconductor device having a three-dimensional structure in which semiconductor elements are integrated in the thickness direction thereof, and FIG. 1 to FIG. 6 illustrate the manufacturing steps in partial cross-sectional views.

In the present semiconductor device manufacturing method, first, two reinforced wafers 1R as illustrated in FIG. 1(a) are prepared (preparation step). The reinforced wafer 1R has a laminated structure that includes: a wafer 1; a supporting substrate S; and a temporary adhesive layer 2 between the wafer 1 and the supporting substrate S.

The wafer 1 is a wafer including a semiconductor wafer main body in which a semiconductor element can be fabricated and includes an element forming surface 1a and a back surface 1b opposite from the element forming surface 1a. In the present embodiment, the element forming surface of the wafer is a surface on the side on which a plurality of semiconductor elements (not illustrated) are formed in the wafer through a transistor formation step. Each semiconductor element of the wafer 1 includes, for example, a multi-layered wiring structure portion including an exposed electrode pad on a surface. Alternatively, the wafer 1 may be a wafer in which various semiconductor elements are already fabricated on the side of the element forming surface 1a, and a wiring structure necessary for the semiconductor elements is subsequently formed on the element forming surface 1a. Examples of a constituent material for forming the semiconductor wafer main body of the wafer 1 include silicon (Si), germanium (Ge), silicon carbide (SiC), gallium arsenide (GaAs), gallium nitride (GaN), and indium phosphide (InP). The thickness of such a wafer 1 is preferably not greater than 1000 µm, more preferably not greater than 900 µm, and more preferably not greater than 800 µm from the perspective of reducing the grinding time in grinding described later. In addition, the thickness of the wafer 1 is, for example, not less than 500 µm.

The supporting substrate S in the reinforced wafer 1R is for reinforcing the wafer 1 to be thinned through a thinning step described below. Examples of the supporting substrate S include silicon wafers and glass wafers. From the perspective of ensuring a function as a reinforcing element, the thickness of the supporting substrate S is preferably not less than 300 μm, more preferably not less than 500 μm, and more preferably not less than 700 μm. In addition, the thickness of the supporting substrate S is, for example, not greater than 800 μm. Such a supporting substrate S is bonded to the side of the element forming surface 1a of the wafer 1 via the temporary adhesive layer 2.

The temporary adhesive layer 2 is for achieving temporary adhesion between the wafer 1 and the supporting substrate S, and the temporary adhesion can be subsequently released. In the present embodiment, the temporary adhesive for forming such a temporary adhesive layer 2 contains at least: a polyvalent vinyl ether compound (A); a compound (B) having two or more hydroxy groups or carboxy groups that are capable of forming an acetal bond by reacting with a vinyl ether group of the polyvalent vinyl ether compound (A), the compound (B) capable of forming a polymer with the polyvalent vinyl ether compound (A); and a thermoplastic resin (C). Each component in the temporary adhesive is as specifically described later. As a temporary adhesive for forming the temporary adhesive layer 2, a silicone-based tacky adhesive, an acrylic-based tacky adhesive, or a wax-type adhesive may be used instead of such a temporary adhesive.

The reinforced wafer 1R thus configured can be produced, for example, through the following steps. First, as illustrated in FIG. 2(a), the temporary adhesive layer 2 is formed on the supporting substrate S. Specifically, a temporary adhesive for forming the temporary adhesive layer 2 is coated on the supporting substrate S, for example, by spin coating to form a temporary adhesive coating. The coating is dried by heating, and the temporary adhesive layer 2 can be formed. The temperature of the heating is, for example, from 100 to 300° C., and may be constant or may be changed stepwise. The heating time is, for example, from 30 seconds to 30 minutes. Next, as illustrated in FIGS. 2(b) and 2(c), the supporting substrate S and the wafer 1 are bonded via the temporary adhesive layer 2. As described above, the wafer 1 includes the element forming surface 1a and the back surface 1b opposite from the element forming surface 1a. In the present step, for example, the supporting substrate S and the wafer 1 are affixed via the temporary adhesive layer 2 under pressure, then the temporary adhesive layer 2 is solidified through heating to form a polymer having a softening point in a high-temperature range, and the supporting substrate S and the wafer 1 are adhered with the temporary adhesive layer 2. In the affixing, the pressure is, for example, from 300 to 5000 g/cm², and the temperature is, for example, from 30 to 200° C. In addition, in the adhesion with the temporary adhesive layer 2, the heating temperature is, for example, from 100 to 300° C. and preferably from 100 to 250° C., and the heating time is, for example, from 30 seconds to 30 minutes and preferably from 3 to 12 minutes. The heating temperature may be constant or may be changed stepwise. As described above, the reinforced wafer 1R having a laminated structure including the wafer 1, the supporting substrate S, and the temporary adhesive layer 2 between the wafer 1 and the supporting substrate S can be fabricated.

The polyvalent vinyl ether compound (A) described above in the temporary adhesive is a compound having two or more vinyl ether groups in a molecule and is represented, for example, by Formula (a) below.

[Chem. 1]

(a)

In Formula (a), $Z_1$ represents a group in which a quantity of $n_1$ hydrogen atoms are removed from a structural formula of a saturated or unsaturated aliphatic hydrocarbon, a saturated or unsaturated alicyclic hydrocarbon, an aromatic hydrocarbon, a heterocyclic compound, or a bonded body in which any of these are bonded via a single bond or a linking group. In addition, in Formula (a), $n_1$ represents an integer of 2 or greater, for example, an integer of 2 to 5, and preferably an integer of 2 or 3.

Among the groups in which $n_1$ hydrogen atoms are removed from a structural formula of a saturated or unsaturated aliphatic hydrocarbon, examples of the group in which two hydrogen atoms are removed from a structural formula of a saturated or unsaturated aliphatic hydrocarbon may include linear or branched alkylene groups, such as a methylene group, an ethylene group, a propylene group, a trimethylene group, a tetramethylene group, a pentamethylene group, a hexamethylene group, an octamethylene group, a decamethylene group, and a dodecamethylene group; and linear or branched alkenylene groups, such as a vinylene group, a 1-propenylene group, and 3-methyl-2-butenylene group. The alkylene group has, for example, from 1 to 20 carbon atoms and preferably has from 1 to 10 carbon atoms. The alkenylene group has, for example, from 2 to 20 carbon atoms and preferably has from 2 to 10 carbon atoms. Examples of the group in which three or more hydrogen atoms are removed from a structural formula of a saturated or unsaturated aliphatic hydrocarbon may include groups in which one or more hydrogen atoms are further removed from the structural formula of any of these groups exemplified.

Among the groups in which $n_1$ hydrogen atoms are removed from a structural formula of a saturated or unsaturated alicyclic hydrocarbon, examples of the group in which two hydrogen atoms are removed from a structural formula of a saturated or unsaturated alicyclic hydrocarbon may include: cycloalkylene groups of a 3- to 15-membered ring, such as a 1,2-cyclopentylene group, a 1,3-cyclopentylene group, a 1,2-cyclohexylene group, a 1,3-cyclohexylene group, and a 1,4-cyclohexylene group; cycloalkenylene groups of a 3- to 15-membered ring, such as a cyclopentenylene group and a cyclohexenylene group; cycloalkylidene groups of a 3- to 15-membered ring, such as a cyclopentylidene group and a cyclohexylidene group; and divalent bridged cyclic hydrocarbon groups of a 4- to 15-membered ring, such as an adamantanediyl group, a norbornanediyl group, a norbornenediyl group, an isobornanediyl group, a tricyclodecanediyl group, a tricycloundecanediyl group, and a tetracyclododecanediyl group. Examples of the group in which three or more hydrogen atoms are removed from a structural formula of a saturated or unsaturated alicyclic hydrocarbon may include groups in which one or more hydrogen atoms are further removed from the structural formula of any of these groups exemplified.

Examples of the aromatic hydrocarbon may include benzene, naphthalene, and anthracene.

The heterocyclic compound includes aromatic heterocyclic compounds and non-aromatic heterocyclic compounds. Examples of such heterocyclic compounds may include: heterocyclic compounds containing an oxygen atom as a heteroatom (e.g., 5-membered rings, such as furan, tetrahydrofuran, oxazole, isooxazole, and γ-butyrolactone; 6-membered rings, such as 4-oxo-4H-pyran, tetrahydropyran, and morpholine; fused rings, such as benzofuran, isobenzofuran, 4-oxo-4H-chromene, chroman, and isochroman; and bridged rings, such as 3-oxatricyclo[4.3.1.1$^{4,8}$]undecan-2-one and 3-oxatricyclo[4.2.1.0$^{4,8}$]nonan-2-one), heterocyclic compounds containing a sulfur atom as a heteroatom (e.g., 5-membered rings, such as thiophene, thiazole, isothiazole, and thiadiazole; 6-membered rings, such as 4-oxo-4H-thiopyran; and fused rings, such as benzothiophene), and heterocyclic compounds containing a nitrogen atom as a heteroatom (e.g., 5-membered rings, such as pyrrole, pyrrolidine, pyrazole, imidazole, and triazole; 6-membered rings, such as pyridine, pyridazine, pyrimidine, pyrazine, piperidine, and piperazine; and fused rings, such as indole, indoline, quinoline, acridine, naphthyridine, quinazoline, and purine).

Examples of the linking group may include divalent to tetravalent hydrocarbon groups, a carbonyl group (—CO—), an ether bond (—O—), a sulfide bond (—S—), an ester bond (—COO—), an amide bond (—CONH—), a carbonate bond (—OCOO—), a urethane bond (—NHCOO—), an —NR— bond (R represents a hydrogen atom, an alkyl group, or an acyl group), and groups in which a plurality of these groups are linked. Among the divalent to tetravalent hydrocarbon groups, examples of the divalent hydrocarbon group may include: linear or branched alkylene groups having from 1 to 10 carbon atoms, such as a methylene group, a methylmethylene group, a dimethylmethylene group, an ethylene group, a propylene group, and a trimethylene group; and alicyclic hydrocarbon groups having from 4 to 15 carbon atoms (in particular, cycloalkylene groups), such as a 1,2-cyclopentylene group, a 1,3-cyclopentylene group, a cyclopentylidene group, a 1,2-cyclohexylene group, a 1,3-cyclohexylene group, a 1,4-cyclohexylene group, and a cyclohexylidene group. Examples of the trivalent hydrocarbon group may include a group in which one hydrogen atom is removed from a structural formula of the divalent hydrocarbon group. Examples of the tetravalent hydrocarbon group may include a group in which two hydrogen atoms are removed from a structural formula of the divalent hydrocarbon group.

$Z_1$ may have one or more types of substituents. Examples of the substituent may include alkyl groups, cycloalkyl groups, alkenyl groups, cycloalkenyl groups, aryl groups, hydroxy groups, carboxy groups, nitro groups, amino groups, mercapto groups, halogen atoms, $C_{2-10}$ hydrocarbon groups substituted with a halogen atom, hydrocarbon groups containing a functional group containing a heteroatom (such as oxygen or sulfur), and a group in which two or more of these groups are bonded. Examples of the alkyl groups include $C_{1-4}$ alkyl groups, such as a methyl group and an ethyl group. Examples of the cycloalkyl groups include $C_{3-10}$ cycloalkyl groups. Examples of the alkenyl groups include $C_{2-10}$ alkenyl groups, such as a vinyl group. Examples of the cycloalkenyl groups include $C_{3-10}$ cycloalkenyl groups. Examples of the aryl groups include $C_{6-15}$ aryl groups, such as a phenyl group and a naphthyl group. Examples of the hydrocarbon groups containing a heteroatom-containing functional group include $C_{1-4}$ alkoxy groups and $C_{2-6}$ acyloxy groups.

Specific examples of the polyvalent vinyl ether compound (A) may include 1,4-butanediol divinyl ether, diethylene glycol divinyl ether, and triethylene glycol divinyl ether, and compounds represented by Formulas (a-1) to (a-21) below.

[Chem. 2]

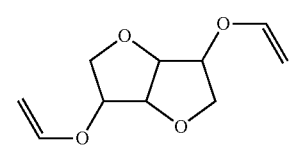
(a-1)

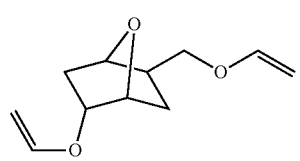
(a-2)

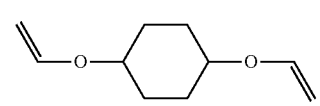
(a-3)

(a-4)

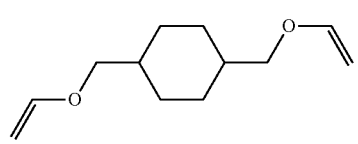
(a-5)

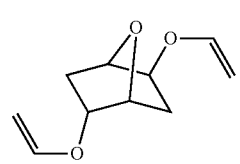
(a-6)

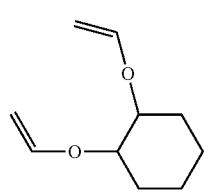
(a-7)

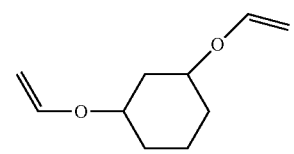
(a-8)

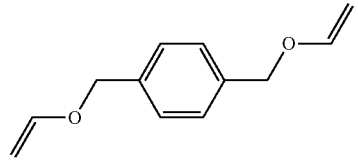
(a-9)

[Chem. 3]
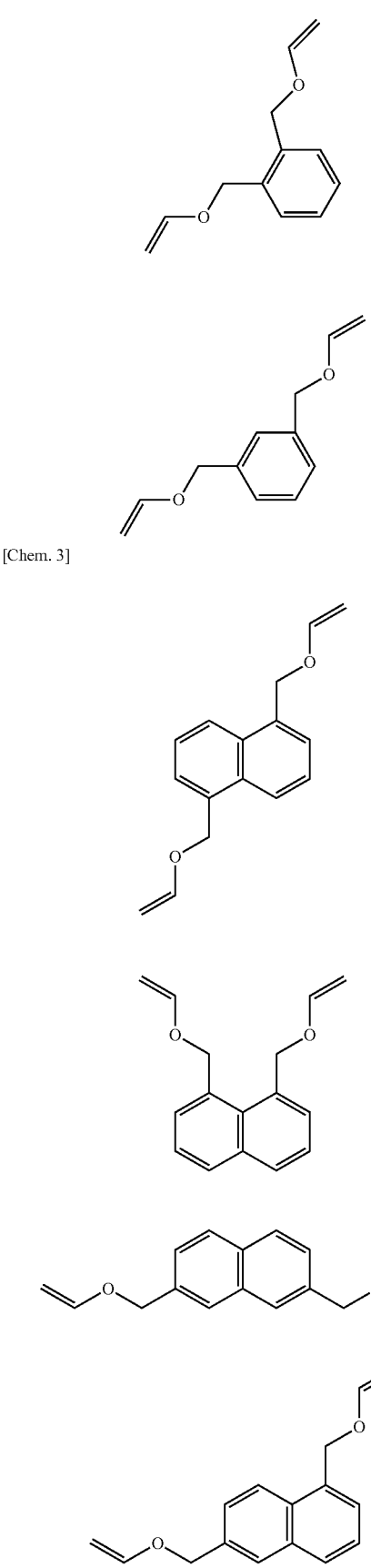
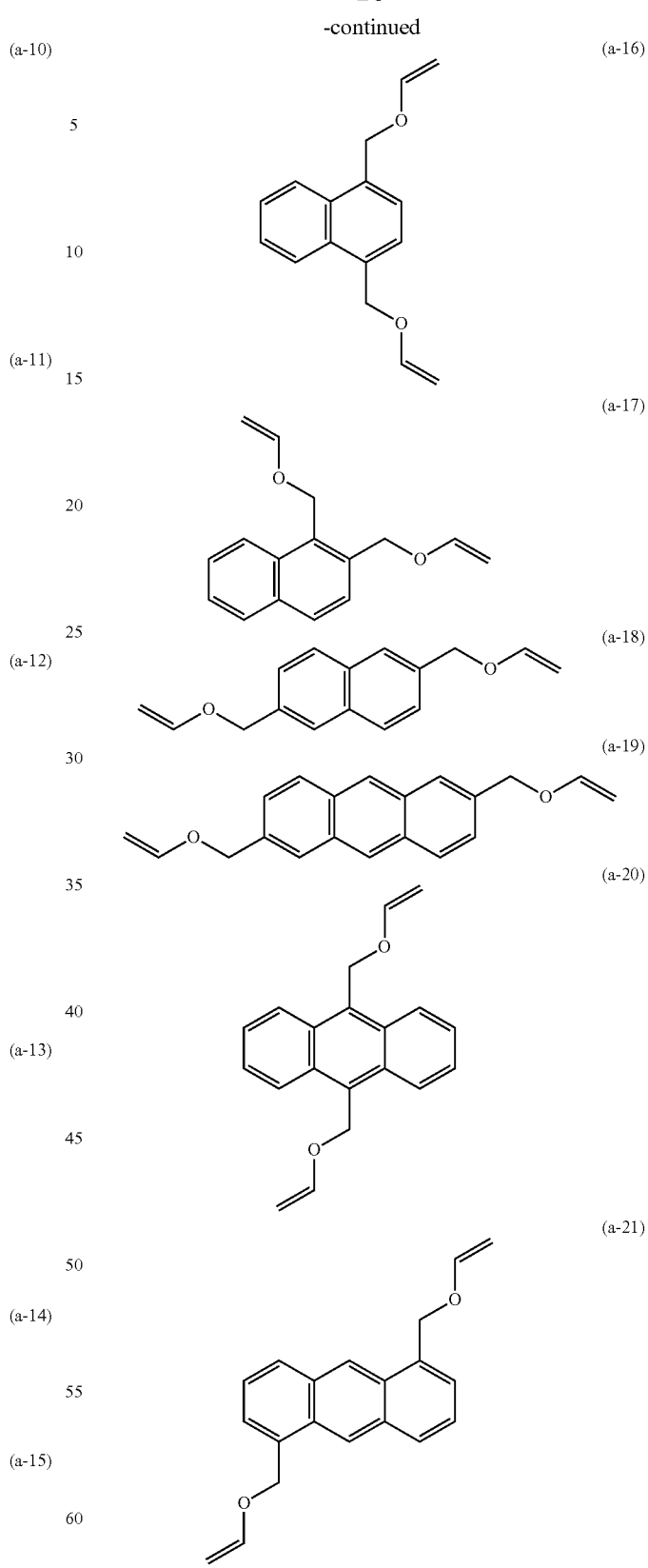
From the perspective of forming a polymer having a high softening point in the temporary adhesive described above, $Z_1$ above in the polyvalent vinyl ether compound (A) is: preferably a group in which $n_1$ hydrogen atoms are removed from a structural formula of a saturated or unsaturated aliphatic hydrocarbon or a bonded body in which a plurality of the hydrocarbons are bonded via a linking group; more preferably a group in which $n_1$ hydrogen atoms are removed from a structural formula of a saturated aliphatic hydrocarbon or a bonded body in which a plurality of the hydrocarbons are bonded via a linking group; and more preferably a group in which m hydrogen atoms are removed from a structural formula of a linear alkylene group having from 1 to 20 carbon atoms, a branched alkylene group having from 2 to 20 carbon atoms, or a bonded body in which a plurality of the alkylene groups are bonded via a linking group.

The polyvalent vinyl ether compound (A) is most preferably at least one compound selected from the group consisting of 1,4-butanediol divinyl ether, diethylene glycol divinyl ether, and triethylene glycol divinyl ether.

As described above, the compound (B) in the temporary adhesive is a compound having two or more hydroxy groups or carboxy groups that are capable of forming an acetal bond by reacting with a vinyl ether group of the polyvalent vinyl ether compound (A), the compound (B) capable of forming a polymer with the polyvalent vinyl ether compound (A), and, for example, a compound having two or more constituent units (repeating units) represented by Formula (b) below.

[Chem. 4]

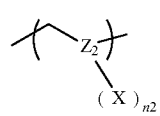
(b)

In Formula (b), X represents a hydroxy group or a carboxy group. The X's of the quantity of $n_2$ may be identical or different from each other.

In Formula (b), $n_2$ represents an integer of 1 or greater. From the perspective of ease of obtaining and ease of dissolving in a solvent in preparing the temporary adhesive described above, and from the perspective of forming a polymer having a high softening point in the temporary adhesive, $n_2$ is preferably an integer of 1 to 3 and more preferably an integer of 1 or 2.

The number of constituent units (repeating units) represented by Formula (b) above in the compound (B) is 2 or greater, and from the perspective of forming a polymer having a high softening point in the temporary adhesive described above, the number is preferably an integer of 2 to 40 and more preferably an integer of 10 to 30.

In Formula (b), $Z_2$ represents a group in which $(n_2+2)$ hydrogen atoms are removed from a structural formula of a saturated or unsaturated aliphatic hydrocarbon, a saturated or unsaturated alicyclic hydrocarbon, an aromatic hydrocarbon, a heterocyclic compound, or a bonded body in which any of these are bonded via a single bond or a linking group. Examples of the structural formula of a saturated or unsaturated aliphatic hydrocarbon, a saturated or unsaturated alicyclic hydrocarbon, an aromatic hydrocarbon, a heterocyclic compound, or a bonded body in which any of these are bonded via a single bond or a linking group may include examples similar to the examples in $Z_1$ described above.

The compound (B) is preferably a styrene polymer, a (meth)acrylic polymer, a polyvinyl alcohol, a novolac resin, and a resol resin, and more preferably a compound having two or more of at least one type of constituent unit (repeating unit) selected from the group consisting of Formulas (b-1) to (b-6) below.

[Chem. 5]

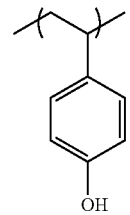
(b-1)

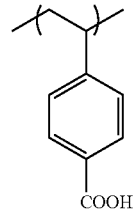
(b-2)

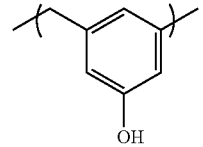
(b-3)

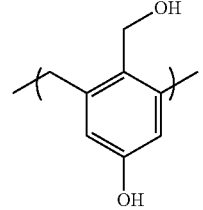
(b-4)

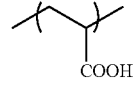
(b-5)

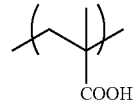
(b-6)

When a compound in which X in Formula (b) is a hydroxy group is employed as the compound (B), the proportion of the constituent units represented by Formula (b) in the total amount of the compound (B) is preferably not less than 30 mass %, more preferably not less than 50 mass %, and more preferably not less than 60 mass %. In addition, the proportion of the constituent units represented by Formula (b) in the total amount of the compound (B) is preferably not less than 30 mol % and more preferably not less than 50 mol %.

When a compound in which X in Formula (b) is a carboxy group is employed as the compound (B), the proportion of the constituent units represented by Formula (b) in the total amount of the compound (B) is preferably not less than 1 mass %, more preferably not less than 5 mass %, and more preferably not less than 10 mass %.

The proportion of the constituent units represented by Formula (b) is preferably within the above range in order to ensure a sufficient distance between crosslinking points and a sufficient number of crosslinking points in the compound (B). Thus, the abovementioned proportion is suitable for ensuring the weight average molecular weight and a high softening point of the polymer obtained through polymerization of the compound (B) and the above-described polyvalent vinyl ether compound (A) in the temporary adhesive described above. In addition, the proportion thereof is also suitable for ensuring high adhesion retentivity in the temporary adhesive layer 2 formed from the temporary adhesive in high temperature environments.

The compound (B) may be a homopolymer having only the constituent units represented by Formula (b) or may be a copolymer having the constituent unit represented by Formula (b) and any other constituent unit. When the compound (B) is a copolymer, the compound (B) may be any of a block copolymer, a graft copolymer, and a random copolymer.

The any other constituent unit in the compound (B) is a constituent unit derived from a polymerizable monomer, the constituent unit having neither a hydroxy group nor a carboxy group, and examples of the polymerizable monomer include olefins, aromatic vinyl compounds, unsaturated carboxylic acid esters, carboxylic acid vinyl esters, and unsaturated dicarboxylic acid diesters. Examples of the olefins include chain olefins (in particular, $C_{2-12}$ alkenes), such as ethylene, propylene, and 1-butene; and cyclic olefins (in particular, $C_{3-10}$ cycloalkenes), such as cyclopentene, cyclohexene, cycloheptene, norbornene, 5-methyl-2-norbornene, and tetracyclododecene. Examples of the aromatic vinyl compounds include $C_{6-14}$ aromatic vinyl compounds, such as styrene, vinyl toluene, α-methylstyrene, 1-propenylbenzene, 1-vinylnaphthalene, 2-vinylnaphthalene, 3-vinylpyridine, 3-vinylfuran, 3-vinylthiophene, indene, methylindene, ethylindene, and dimethylindene. Examples of the unsaturated carboxylic acid esters include: esters, such as ethyl (meth)acrylate, butyl (meth)acrylate, isobutyl (meth) acrylate, 2-ethylhexyl (meth)acrylate, and dicyclopentanyl (meth)acrylate, obtained by reacting an unsaturated carboxylic acid (e.g., (meth)acrylic acid) with an alcohol (R"—OH). (The R" is a group in which one hydrogen atom is removed from a structural formula of a saturated or unsaturated aliphatic hydrocarbon, a saturated or unsaturated alicyclic hydrocarbon, an aromatic hydrocarbon, a heterocyclic compound, or a bonded body in which any of these are bonded through a single bond or a linking group. Examples of R" may include monovalent groups corresponding to the divalent groups exemplified for $Z_1$ in Formula (a) above.) Examples of the carboxylic acid vinyl esters include $C_{1-16}$ fatty acid vinyl esters, such as vinyl acetate, vinyl propionate, vinyl caprylate, and vinyl caproate. Examples of the unsaturated dicarboxylic acid diesters may include maleic acid di $C_{1-10}$ alkyl esters, such as diethyl maleate, dibutyl maleate, dioctyl maleate, and 2-ethylhexyl maleate; and fumaric acid diesters corresponding to these esters. One of these polymerization accelerators can be used alone or two or more in combination.

When the compound (B) is a copolymer, the compound (B) is preferably a compound containing: the constituent units represented by Formula (b) above; and a constituent unit derived from at least one polymerizable monomer selected from the group consisting of a chain olefin, a cyclic olefin, an aromatic vinyl compound, an unsaturated carboxylic acid ester, a carboxylic acid vinyl ester, and an unsaturated dicarboxylic acid diester.

A softening point ($T_1$) of the compound (B) is, for example, not lower than 50° C., preferably not lower than 80° C., and more preferably not lower than 100° C. Such a configuration is suitable for achieving a high softening point for a polymer obtained by polymerization of the compound (B) and the polyvalent vinyl ether compound (A) described above. In addition, from the perspective of ensuring proper fluidity to achieve good coating properties in the temporary adhesive described above, $T_1$ is, for example, not higher than 250° C., preferably not higher than 200° C., and more preferably not higher than 150° C.

$T_1$ can be adjusted for example, by controlling the weight average molecular weight (by the GPC method calibrated with polystyrene standards) of the compound (B). The weight average molecular weight of the compound (B) is, for example, not lower than 1500, preferably from 1800 to 10000, and more preferably from 2000 to 5000.

The thermoplastic resin (C) described above in the temporary adhesive needs to be a compound having thermoplasticity and capable of imparting flexibility to an adhesive composition when contained in the adhesive composition. Examples of such a thermoplastic resin (C) may include polycondensation resins, such as polyvinyl acetal resins, polyester resins, polyurethane resins, polyamide resins, poly(thio)ether resins, polycarbonate resins, polysulfone resins, and polyimide resins; vinyl polymerized resins, such as polyolefin resins, (meth)acrylic resins, styrene resins, and vinyl resins; and resins derived from natural products, such as cellulose derivatives. One of these polymerization accelerators can be used alone or two or more in combination. The configuration in which the temporary adhesive described above contains such a thermoplastic resin (C) is suitable for imparting flexibility or pliability in the temporary adhesive layer 2 to be formed, suitable for preventing the occurrence of spontaneous peeling or a crack also in an environment where the temperature changes rapidly, and is suitable for ensuring excellent adhesiveness.

The thermoplastic resin (C) in the temporary adhesive is preferably at least one selected from the group consisting of polyvinyl acetal resins, polyester resins, polyurethane resins, and polyamide resins. From the perspective of easily imparting flexibility in the temporary adhesive or the temporary adhesive layer 2, and from the perspective of easily removing a glue residue if chemical interaction to an adherend, such as a wafer, reduces, and a glue residue remains on the adherend after peeling, the temporary adhesive preferably contains a polyester resin as the thermoplastic resin (C). Furthermore, in addition to the perspective of easily imparting flexibility in the temporary adhesive or the temporary adhesive layer 2 and the perspective of easily removing a glue residue on an adherend, from the perspective of ensuring high adhesion to an adherend, the temporary adhesive preferably contains a polyester resin and a polyvinyl acetal resin as the thermoplastic resins (C).

Examples of the polyvinyl acetal resin may include resins having at least a constituent unit represented by the formula below, the constituent unit obtained by reacting an aldehyde (RCHO) with a polyvinyl alcohol. Examples of the aldehyde (RCHO) include compounds in which R in the structural formula (R in the formula below is also the same) is a hydrogen atom, a linear $C_{1-5}$ alkyl group, a branched $C_{2-5}$ alkyl group, or a $C_{6-10}$ aryl group. Examples specifically include formaldehyde, butyraldehyde, and benzaldehyde. Such a polyvinyl acetal resin may have any other constituent unit in addition to the constituent unit represented by the formula below. That is, the polyvinyl acetal resin includes a homopolymer and a copolymer. Examples of such a polyvinyl acetal resin may specifically include polyvinyl formal and polyvinyl butyral, and a commercially available product, for example, "S-LEC KS-1 (trade name)" or "S-LEC KS-10 (trade name)" (both available from Sekisui Chemical Co., Ltd.) can be used.

[Chem. 6]

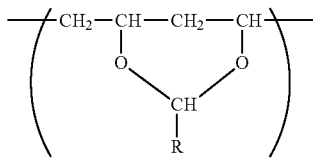

Examples of the polyester resin include polyesters obtained by polycondensation of a diol component and a dicarboxylic acid component. Examples of the diol component include aliphatic $C_{2-12}$ diols, such as ethylene glycol; polyoxy $C_{2-4}$ alkylene glycols, such as diethylene glycol; alicyclic $C_{5-15}$ diols, such as cyclohexanedimethanol; and aromatic $C_{6-20}$ diols, such as bisphenol A. Examples of the dicarboxylic acid component include aromatic $C_{8-20}$ dicarboxylic acids, such as terephthalic acid; aliphatic $C_{2-40}$ dicarboxylic acids, such as adipic acid; and alicyclic $C_{8-15}$ dicarboxylic acids, such as cyclohexanedicarboxylic acid. Examples of the polyester resin also include polyesters obtained by polycondensation of oxycarboxylic acid. Examples of the oxycarboxylic acid include aliphatic $C_{2-6}$ oxycarboxylic acids, such as lactic acid, and aromatic $C_{7-19}$ oxycarboxylic acids, such as hydroxybenzoic acid. Examples of the polyester resin also include polyesters obtained by ring-opening polymerization of lactone. Examples of the lactone include $C_{4-12}$ lactones, such as ε-caprolactone, δ-valerolactone, and γ-butyrolactone. Examples of the polyester resin also include polyesters containing a urethane bond obtained by reacting a polyester diol and a diisocyanate. The polyester resin includes a homopolyester and a copolyester. In addition, as the polyester resin, a commercially available product, for example, "Placed H1P (trade name)" (available from Daicel Corporation) can be used.

Examples of the polyurethane resins may include resins obtained by reaction between a diisocyanate and a polyol and a chain extender used as necessary. Examples of the diisocyanate include aliphatic diisocyanates, such as hexamethylene diisocyanate; alicyclic diisocyanates, such as isophorone diisocyanate; and aromatic diisocyanates, such as tolylene diisocyanate. Examples of the polyol include polyester diols, polyether diols, and polycarbonate diols. Examples of the chain extender include $C_{2-10}$ alkylene diols, such as ethylene glycol; aliphatic diamines, such as ethylene diamine; alicyclic diamines, such as isophorone diamine; and aromatic diamines, such as phenylene diamine.

Examples of the polyamide resins may include: polyamides obtained by polycondensation of a diamine component and a dicarboxylic acid component; polyamides obtained by polycondensation of an aminocarboxylic acid; polyamides obtained by ring-opening polymerization of a lactam; and polyesteramides obtained by polycondensation of a diamine component, a dicarboxylic acid component, and a diol component. Examples of the diamine component include $C_{4-10}$ alkylene diamines, such as hexamethylene diamine. Examples of the dicarboxylic acid component include $C_{4-20}$ alkylene dicarboxylic acids, such as adipic acid. Examples of the aminocarboxylic acids include $C_{4-20}$ aminocarboxylic acids, such as ω-aminoundecanoic acid. Examples of the lactam include $C_{4-20}$ lactams, such as ω-laurolactam. Examples of the diol component include $C_{2-12}$ alkylene diols, such as ethylene glycol. In addition, the polyamide resins include homopolyamides and copolyamides.

A softening point ($T_2$) of the thermoplastic resin (C) is preferably at least 10° C. higher than the heat curing temperature of a permanent adhesive described later used in combination with the temporary adhesive containing the thermoplastic resin (C) in the method of manufacturing a semiconductor device according to an embodiment of the present invention. The difference between the heat curing temperature of the permanent adhesive and $T_2$ is, for example, from 10 to 40° C. and preferably from 20 to 30° C.

$T_2$ can be adjusted, for example, by controlling the weight average molecular weight (Mw: by the GPC method calibrated with polystyrene standards) of the thermoplastic resin (C). The weight average molecular weight of the thermoplastic resin (C) is, for example, from 1500 to 100000, preferably from 2000 to 80000, more preferably from 3000 to 50000, more preferably from 10000 to 45000, and more preferably from 15000 to 35000.

In the temporary adhesive containing at least the polyvalent vinyl ether compound (A), the compound (B), and the thermoplastic resin (C) as described above, a softening point ($T_3$) of the polymer of the polyvalent vinyl ether compound (A) and the compound (B) is at least 10° C. higher than the heat curing temperature of a permanent adhesive described later used in combination with the temporary adhesive in the method of manufacturing a semiconductor device according to an embodiment of the present invention. The difference between the heat curing temperature of the permanent adhesive and $T_3$ is, for example, from 10 to 40° C. and preferably from 20 to 30° C.

When the heat curing temperature of the permanent adhesive described later is, for example, 120° C., the content of the polyvalent vinyl ether compound (A) in the temporary adhesive is an amount at which the molar amount of the vinyl ether groups in the polyvalent vinyl ether compound (A), per a total of 1 mol of hydroxy groups and carboxy groups in the compound (B) in the temporary adhesive, becomes, for example, from 0.01 to 10 mol, preferably from 0.05 to 5 mol, more preferably from 0.07 to 1 mol, and even more preferably of from 0.08 to 0.5 mol.

The content of the thermoplastic resin (C) in the temporary adhesive is, for example, from 0.1 to 3 parts by mass, preferably from 0.2 to 2 parts by mass, and more preferably from 0.3 to 1 part by mass, relative to 1 part by mass of the compound (B) in the temporary adhesive.

The total content of the polyvalent vinyl ether compound (A), the compound (B), and the thermoplastic resin (C) in the temporary adhesive is, for example, from 70 to 99.9 mass %, preferably from 80 to 99 mass %, more preferably from 85 to 95 mass %, and more preferably from 85 to 90 mass % of the total non-volatile content of the temporary adhesive.

The temporary adhesive may further contain a polymerization accelerator. Examples of the polymerization accelerator may include a monovalent carboxylic acid represented by Formula (d) below and a monovalent alcohol represented by Formula (e) below. One of these polymerization accelerators can be used alone or two or more in combination. The configuration in which the temporary adhesive contains a polymerization accelerator is suitable for accelerating the polymerization reaction of the polyvalent vinyl ether compound (A) and the compound (B). The configuration is suitable for forming a polymer having an equivalent softening point or higher softening point even in lowering the heating temperature during polymerization in comparison with using an adhesive containing no polymerization accelerator and thus is suitable for ensuring adhesiveness in the temporary adhesive 2 in high temperature environments (e.g., approximately from 160 to 180° C.).

$$Z_3\text{—COOH} \qquad (d)$$

(Wherein, $Z_3$ represents a group that may have a substituent other than a carboxy group, the group in which one hydrogen atom is removed from a structural formula of one selected from the group consisting of saturated or unsaturated aliphatic hydrocarbons, saturated or unsaturated alicyclic hydrocarbons, and aromatic hydrocarbons.)

$$Z_4\text{—OH} \qquad (e)$$

(Wherein, $Z_4$ represents a group that may have a substituent other than a hydroxy group, the group in which one hydrogen atom is removed from a structural formula of an aromatic hydrocarbon.)

Examples of the saturated or unsaturated aliphatic hydrocarbon, saturated or unsaturated alicyclic hydrocarbon, and aromatic hydrocarbon in $Z_3$ in Formula (d) above may include saturated or unsaturated aliphatic hydrocarbons, saturated or unsaturated alicyclic hydrocarbons, and aromatic hydrocarbons exemplified for $Z_1$ in Formula (a) above. Examples of the substituent that may be included in $Z_3$ may include examples of the substituent that may be included in $Z_1$ excluding a carboxy group. In addition, examples of the aromatic hydrocarbon in $Z_4$ in Formula (e) above may include aromatic hydrocarbons exemplified for $Z_1$ in Formula (a) above. Examples of the substituent that may be included in Li may include examples of the substituent that may be included in $Z_1$ excluding a hydroxy group.

When a polymerization accelerator is contained in the temporary adhesive, the pKa (acid dissociation constant) of the polymerization accelerator is preferably from 3 to 8 and more preferably from 4 to 6. Such a configuration is suitable for inhibiting unintended polymerization and the resulting increase in viscosity or the like in the temporary adhesive to ensure storage stability, as well as for ensuring the polymerization promoting effect by the polymerization accelerator in forming the temporary adhesive layer 2 from the temporary adhesive.

The monovalent carboxylic acid represented by Formula (d) is preferably a compound (including geometric isomers) shown below.

[Chem. 7]

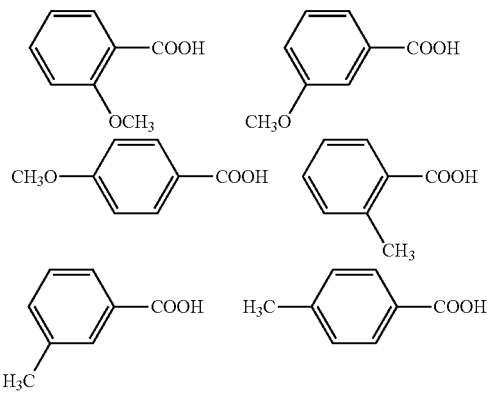

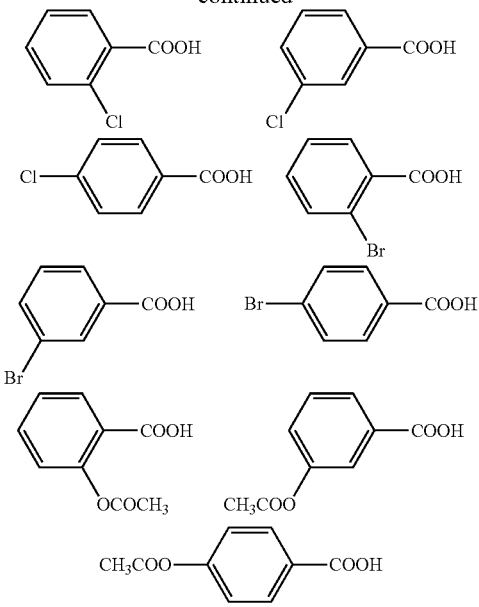

[Chem. 8]

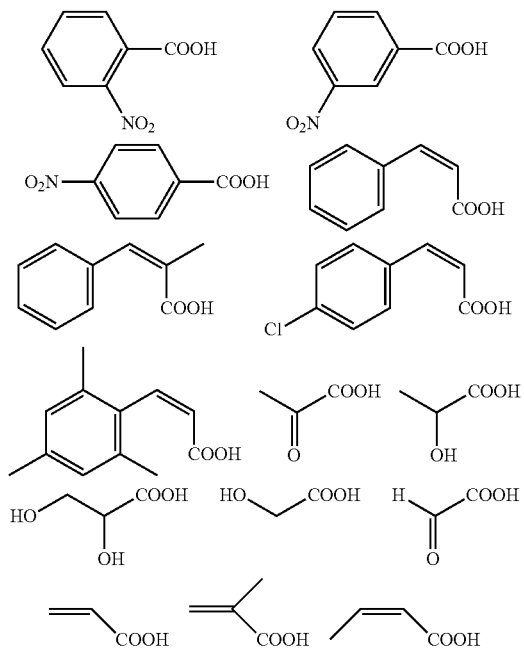

The monovalent alcohol represented by Formula (e) is preferably a compound shown below.

[Chem. 9]

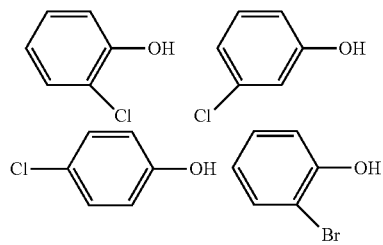

-continued

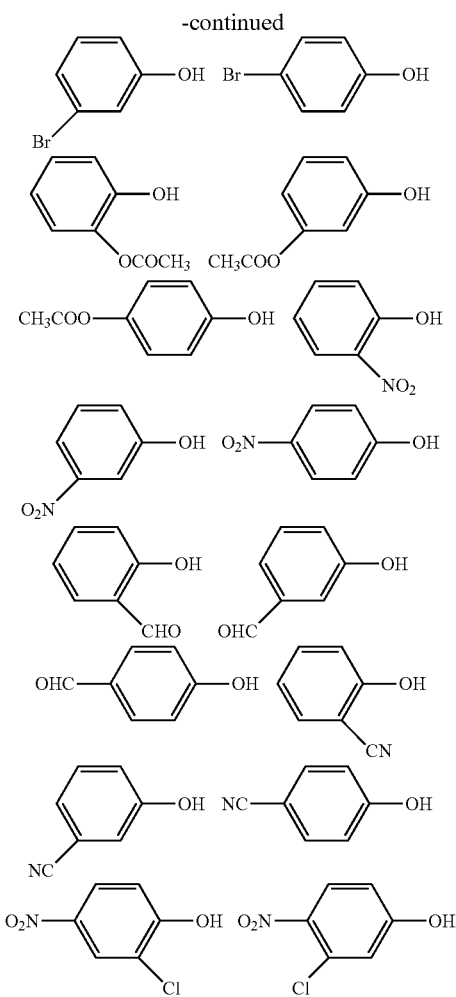

When a polymerization accelerator is contained in the temporary adhesive, the content of the polymerization accelerator is, for example, approximately from 0.01 to 5 parts by mass, preferably from 0.1 to 3 parts by mass, and more preferably from 0.3 to 1 part by mass, relative to 1 part by mass of the polyvalent vinyl ether compound (A) contained in the temporary adhesive.

The temporary adhesive may further contain an antioxidant. The configuration in which the temporary adhesive contains an antioxidant is suitable for preventing oxidation of the compound (B) and the thermoplastic resin (C) described above in the temporary adhesive during heat treatment of the temporary adhesive. The antioxidation of the compound (B) and the thermoplastic resin (C) in the temporary adhesive is suitable for ensuring solubility of a softened composition obtained by heat-treating the temporary adhesive layer 2 formed from the temporary adhesive. Thus, the antioxidation is suitable for removing a glue residue if remains on an adherend, such as a wafer, after peeling the temporary adhesive layer 2 from the adherend through heat treatment.

Examples of the antioxidant may include phenolic antioxidants, phosphorus antioxidants, thioester antioxidants, and amine antioxidants. One of these antioxidants can be used alone or two or more in combination. Phenolic antioxidants have a particularly excellent antioxidant effect during heat treatment and thus are preferred as an antioxidant in the temporary adhesive.

Examples of the phenolic antioxidants may include: pentaerythritol tetrakis[3(3,5-di-t-butyl-4-hydroxyphenyl)propionate]; thiodiethylene bis[3-(3,5-di-t-butyl-4-hydroxyphenyl)propionate]; octadecyl 3-(3,5-di-t-butyl-4-hydroxyphenyl)propionate; N,N'-hexamethylene bis[3-(3,5-di-t-butyl-4-hydroxyphenyl)propionamide]; octyl 3-(4-hydroxy-3,5-diisopropylphenyl)propionate; 1,3,5-tris(4-hydroxy-3,5-di-t-butylbenzyl)-2,4,6-trimethylbenzene; 2,4-bis(dodecylthiomethyl)-6-methylphenol; and calcium bis[3,5-di(t-butyl)-4-hydroxybenzyl(ethoxy)phosphinate]. As the phenolic antioxidant, a commercially available product under the trade name, for example, "Irganox 1010", "Irganox 1035", "Irganox 1076", "Irganox 1098", "Irganox 1135", "Irganox 1330", "Irganox 1726", or "Irganox 1425WL" (all available from BASF) can be used.

When an antioxidant is contained in the temporary adhesive, the content of the antioxidant is, for example, from 0.01 to 15 parts by mass, preferably from 0.1 to 12 parts by mass, and more preferably from 0.5 to 10 parts by mass, relative to 100 parts by mass of the total of the compound (B) and the thermoplastic resin (C) contained in the temporary adhesive.

The temporary adhesive may further contain an additional component as necessary. Examples of the additional component may include an acid generator, a surfactant, a solvent, a leveling agent, a silane coupling agent, and a foaming agent. One of these additional components can be used alone or two or more in combination.

When a surfactant is contained in the temporary adhesive, the content of the surfactant in the temporary adhesive is preferably approximately from 0.01 to 1 mass %. Such a configuration is suitable for preventing repelling during the coating of the temporary adhesive and is suitable for ensuring the uniformity of the coating. Examples of such a surfactant include products under the trade names "F-444", "F-447", "F-554", "F-556", and "F-557" (all are fluorine oligomers available from DIC Corporation), a product under the trade name "BYK-350" (an acrylic polymer available from BYK), and products under the trade names "A-1420", "A-1620", and "A-1630" (all are fluorine-containing alcohols available from Daikin Industries, Ltd.). One of these surfactants can be used alone or two or more in combination.

The temporary adhesive preferably contains a solvent from the perspective of adjusting the viscosity of the temporary adhesive. Examples of the solvent include toluene, hexane, isopropanol, methyl isobutyl ketone, cyclopentanone, cyclohexanone, propylene glycol monomethyl ether acetate, propylene glycol monomethyl ether, and γ-butyrolactone. One of these solvents can be used alone or two or more in combination. When the temporary adhesive contains a solvent, the solvent content in the temporary adhesive is, for example, from 55 to 80 mass %.

The temporary adhesive can be prepared by stirring and mixing the components while air bubbles are removed under vacuum as necessary. The temperature of the mixture during stirring and mixing is preferably approximately from 10 to 80° C. For stirring and mixing, a rotation-revolution mixer, a single-axis or multi-axis extruder, a planetary mixer, a kneader, or a resolver can be used.

The viscosity of the temporary adhesive (viscosity measured under conditions of 25° C. and a shear rate of 50/s) is, for example, approximately from 30 to 2000 mPa·s, preferably from 300 to 1500 mPa·s, and more preferably from 500 to 1500 mPa·s. Such a configuration is suitable for ensuring the coating properties of the temporary adhesive and uniformly coating the temporary adhesive on the surface of an adherend, such as a wafer.

The temporary adhesive as described above is coated on the surface of an adherend, such as a wafer, and then heat-treated. This allows vinyl ether groups of the polyvalent vinyl ether compound (A) and hydroxy groups and/or carboxy groups of the compound (B) in the temporary adhesive to be bonded with acetal bonds to form a polymer from the polyvalent vinyl ether compound (A) and the compound (B). For example, when a temporary adhesive containing a compound represented by Formula (a') below as the polyvalent vinyl ether compound (A) and containing a compound having a constituent unit represented by Formula (b') below as the compound (B) is heat-treated to polymerize both compounds, a polymer represented by Formula (P) below is produced.

[Chem. 10]

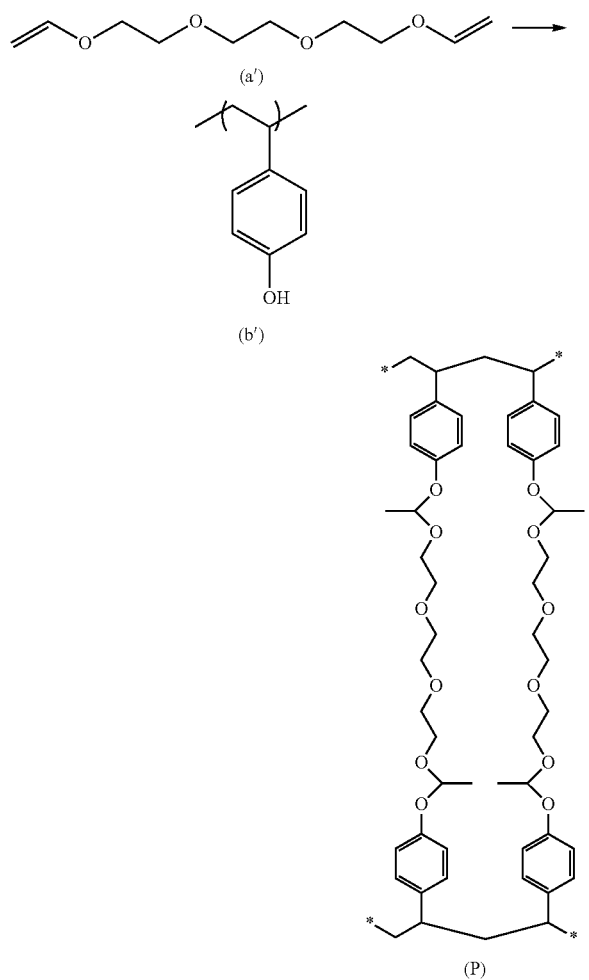

The softening point ($T_3$) of the polymer obtained by heat-treating the temporary adhesive can be controlled by adjusting the relative amounts of the polyvalent vinyl ether compound (A) and the compound (B). When the heat curing temperature of a permanent adhesive described later used in combination with the temporary adhesive is 120° C., the softening point ($T_3$) of the polymer is, for example, not lower than 130° C., preferably from 130 to 170° C., and more preferably from 140 to 160° C.

Each softening point of: the polymer of the polyvalent vinyl ether compound (A) and the compound (B), the polyvalent vinyl ether compound (A), the compound (B), and the thermoplastic resin (C) can be measured using a Koka flow tester under the flow conditions below.

Flow Conditions
  Pressure: 100 kg/cm$^2$
  Speed: 6° C./min
  Nozzle: 1 mm $\phi$×10 mm In addition, the softening point of the temporary adhesive layer formed from the temporary adhesive is set to the temperature determined as follows. First, 0.1 g of the temporary adhesive is coated on a first glass plate at a thickness of 10 μm to form a coating of the temporary adhesive. Then, a second glass plate is overlaid on the coating. Then, this is heat-treated to polymerize the polyvalent vinyl ether compound (A) and the compound (B) in the temporary adhesive between the first and second glass plates to cure the temporary adhesive, thus bonding both glass plates via the temporary adhesive. The heat treatment includes, for example, heating at 140° C. for 2 minutes, followed by heating at 200° C. for 2 minutes, and followed by heating at 230° C. for 4 minutes. Such adhesive bonding provides a laminate having a laminated structure of the first glass plate, the second glass plate, and the temporary adhesive layer between the first and second glass plates. For this laminate, in a state where the second glass plate is fixed, the first glass plate is pulled in the horizontal direction (in-plane direction of the glass plate) by applying a stress of 2 kg under heating, and the temperature at which the first glass plate starts to move is measured. The temperature determined as described above is taken as the softening point.

In the present method of manufacturing a semiconductor device, as illustrated in FIG. 1(b) next, the wafer 1 of each reinforced wafer 1R is thinned (thinning step). Specifically, in each reinforced wafer 1R, the wafer 1 in a state of being supported by the supporting substrate S is thinned to a predetermined thickness by grinding from the back surface 1b side of the wafer 1 using a grinder to form a thinned wafer 1T. The thickness of the wafer 1 after thinning (thinned wafer 1T) is, for example, from 1 to 20 μm.

Then, for example, as illustrated in FIGS. 3(a) and 3(b), the thinned wafer 1T side of the reinforced wafer 1R is bonded to a wafer 3, which is a base wafer, through an adhesive 4 (bonding step). The bonding step is performed for each of the two reinforced wafers 1R.

The wafer 3 is a base wafer including a semiconductor wafer main body in which a semiconductor element can be fabricated and includes an element forming surface 3a and a back surface 3b opposite from the element forming surface 3a. As the constituent material for forming the semiconductor wafer main body of the wafer 3, for example, the materials listed above as constituent materials for forming the semiconductor wafer main body of the wafer 1 can be employed. The thickness of the wafer 3, which is the base wafer, is preferably not less than 300 μm, more preferably not less than 500 μm, and more preferably not less than 700 μm from the perspective of ensuring strength of the wafer 3 during the manufacturing process. From the perspective of reducing the grinding time in grinding on the wafer 3, the grinding described later, the thickness of the wafer 3 is preferably not greater than 1000 μm, more preferably not greater than 900 μm, and more preferably not greater than 800 μm.

The adhesive 4 is a thermosetting adhesive for achieving a wafer-to-wafer bonded state, and in the present embodiment, the adhesive 4 contains a polymerizable group-containing polyorganosilsesquioxane (that is, a polyorganosilsesquioxane having a polymerizable functional group) as a thermosetting resin. The polymerizable functional group contained in the polymerizable group-containing polyorganosilsesquioxane is preferably an epoxy group or a (meth) acryloyloxy group. The polymerizable group-containing polyorganosilsesquioxane is suitable for achieving a relatively low polymerization temperature or curing temperature of, for example, approximately 30 to 200° C. and is suitable for achieving high heat resistance after curing. Thus, the wafer-to-wafer adhesive bonding with the adhesive containing the polymerizable group-containing polyorganosilsesquioxane is suitable for achieving high heat resistance in an adhesive layer to be formed between the wafers as well as achieving lower curing temperature for forming the adhesive layer and thus suppressing damages to the elements in the wafer as an adherend. The content ratio of the polymerizable group-containing polyorganosilsesquioxane in the adhesive 4 is, for example, not less than 70 mass %, preferably from 80 to 99.8 mass %, and more preferably from 90 to 99.5 mass %. As the thermosetting resin in the adhesive 4, a benzocyclobutene (BCB) resin or a novolac-based epoxy resin may be used instead of the polymerizable group-containing polyorganosilsesquioxane.

In the present embodiment, the polymerizable group-containing polyorganosilsesquioxane contained in the adhesive 4 contains, as siloxane constituent units, a first constituent unit [RSiO$_{3/2}$] containing at least a constituent unit represented by Formula (1) below and a second constituent unit [RSiO$_{2/2}$(OR')] containing at least a constituent unit represented by Formula (2) below (R and R' in the second constituent unit may be identical or different). These constituent units belong to what are called T units in the siloxane constituent units, and in the present embodiment, the constituent unit [RSiO$_{3/2}$] is a T3 form, and the constituent unit [RSiO$_{2/2}$(OR')] is a T2 form. In the T3 form, the silicon atom is bonded to three oxygen atoms, each oxygen atom also bonded to a silicon atom in another siloxane constituent unit. In the T2 form, the silicon atom is bonded to two oxygen atoms, each oxygen atom also bonded to a silicon atom in another siloxane constituent unit, and bonded to an oxygen of an alkoxy group. Both such a T3 form and a T2 form belong to T units as siloxane constituent units as described above and are partial structures of polymerizable group-containing polyorganosilsesquioxanes that can be formed by hydrolysis of a silane compound having three hydrolyzable functional groups and a subsequent condensation reaction.

[Chem. 11]

(1)

(2)

R$^1$ in Formula (1) and R$^1$ in Formula (2) each represent a group containing an epoxy group or a (meth)acryloyloxy group, and R$^2$ in Formula (2) represents a hydrogen atom or an alkyl group having from 1 to 4 carbon atoms.

Examples of R$^1$ in Formula (1) and Formula (2), when each R$^1$ is an epoxy group-containing group, include groups represented by Formulas (3) to (6) below. Each of R$^3$, R$^4$, R$^5$, and R$^6$ in Formulas (3) to (6) represents a linear or branched alkylene group having, for example, from 1 to 10 carbon atoms. Examples of such an alkylene group include a methylene group, a methylmethylene group, a dimethylmethylene group, an ethylene group, a propylene group, a trimethylene group, a tetramethylene group, a pentamethylene group, a hexamethylene group, and a decamethylene group. From the perspective of achieving high heat resistance and reducing shrinkage during curing in the adhesive layer to be formed from the adhesive 4, each R$^1$ as an epoxy group-containing group in Formula (1) and Formula (2) is preferably an epoxy group-containing group represented by Formula (3) or an epoxy group-containing group represented by Formula (4) and more preferably a 2-(3,4-epoxycyclohexyl)ethyl group, which is a group represented by Formula (3) where R$^3$ is an ethylene group.

[Chem. 12]

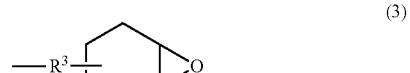
(3)

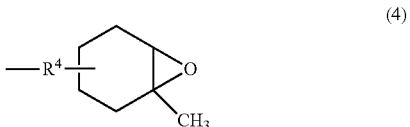
(4)

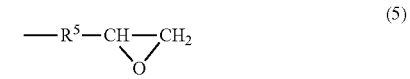
(5)

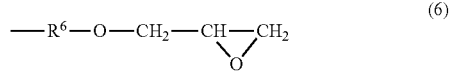
(6)

As described above, R$^2$ in Formula (2) above represents a hydrogen atom or an alkyl group having from 1 to 4 carbon atoms, and thus, OR$^2$ in Formula (2) represents a hydroxy group or an alkoxy group having from 1 to 4 carbon atoms. Examples of the alkoxy group having from 1 to 4 carbon atoms include a methoxy group, an ethoxy group, a propoxy group, an isopropoxy group, a butoxy group, and an isobutyloxy group.

The polymerizable group-containing polyorganosilsesquioxane contained in the adhesive 4 may contain one type of constituent unit represented by Formula (1) above or may contain two or more types. The polymerizable group-containing polyorganosilsesquioxane may contain one type of constituent unit represented by Formula (2) above or may contain two or more types.

The polymerizable group-containing polyorganosilsesquioxane described above contained in the adhesive 4 may contain, as the above T3 form, a constituent unit represented by Formula (7) below in addition to the constituent unit represented by Formula (1). R$^7$ in Formula (7) represents a hydrogen atom, a substituted or unsubstituted alkyl group, a substituted or unsubstituted alkenyl group, a substituted or unsubstituted cycloalkyl group, a substituted or unsubstituted aryl group, or a substituted or unsubstituted aralkyl group. R$^7$ in Formula (7) is preferably a substituted or unsubstituted alkyl group, a substituted or unsubstituted alkenyl group, or a substituted or unsubstituted aryl group, and more preferably a phenyl group.

[Chem. 13]

(7)

Examples of the alkyl group described above for R$^7$ include a methyl group, an ethyl group, a propyl group, an n-butyl group, an isopropyl group, an isobutyl group, an s-butyl group, a t-butyl group, and an isopentyl group. Examples of the alkenyl group described above for R$^7$ include a vinyl group, an allyl group, and an isopropenyl group. Examples of the cycloalkyl group described above for R$^7$ include a cyclobutyl group, a cyclopentyl group, and a cyclohexyl group. Examples of the aryl group described above for $R^7$ include a phenyl group, a tolyl group, and a naphthyl group. Examples of the aralkyl group described above for $R^7$ include a benzyl group and a phenethyl group.

Examples of the substituent of the alkyl group, alkenyl group, cycloalkyl group, aryl group, and aralkyl group described above for $R^7$ include: an ether group; an ester group; a carbonyl group; a siloxane group; a halogen atom, such as a fluorine atom; an acryl group; a methacryl group; a mercapto group; an amino group; and a hydroxyl group.

The polymerizable group-containing polyorganosilsesquioxane described above contained in the adhesive 4 may contain, as the above T2 form, a constituent unit represented by Formula (8) below in addition to the constituent unit represented by Formula (2). $R^7$ in Formula (8) represents a hydrogen atom, a substituted or unsubstituted alkyl group, a substituted or unsubstituted alkenyl group, a substituted or unsubstituted cycloalkyl group, a substituted or unsubstituted aryl group, or a substituted or unsubstituted aralkyl group and is specifically the same as $R^7$ in Formula (7) above. $R^2$ in Formula (8) represents a hydrogen atom or an alkyl group having from 1 to 4 carbon atoms and is specifically the same as $R^2$ in Formula (2) above.

[Chem. 14]

$$[R^7SiO_{2/2}(OR^2)] \quad (8)$$

The above-described polymerizable group-containing polyorganosilsesquioxane contained in the adhesive 4 may contain, in the siloxane constituent unit thereof, at least one type selected from the group consisting of $[RSiO_{1/2}]$, which is called an M unit, $[R_2SiO_{2/2}]$, which is called a D unit, and $[SiO_{4/2}]$, which is called a Q unit, in addition to the first and second constituent units described above, which are T units.

The polymerizable group-containing polyorganosilsesquioxane may have any of a cage, incomplete cage, ladder, or random silsesquioxane structure or may have a combined structure of two or more of these silsesquioxane structures.

In all the siloxane constituent units of the polymerizable group-containing polyorganosilsesquioxane in the adhesive 4, the value of the molar ratio of the T3 form to the T2 form (i.e., T3 form/T2 form) is, for example, from 5 to 500, and the lower limit is preferably 10. The upper limit is preferably 100 and more preferably 50. For the polymerizable group-containing polyorganosilsesquioxane, adjustment of the value of [T3 form/T2 form] to the range improves compatibility with components other than the polymerizable group-containing polyorganosilsesquioxane contained in the adhesive 4, improving handleability. The value of [T3 form/T2 form] in the polymerizable group-containing polyorganosilsesquioxane of 5 to 500 means that the presence amount of the T2 form is relatively small relative to the T3 form, and the hydrolysis and the condensation reaction of silanol are more advanced.

The value of the molar ratio (T3 form/T2 form) in the polymerizable group-containing polyorganosilsesquioxane can be determined, for example, by $^{29}$Si-NMR spectroscopy measurements. In the $^{29}$Si-NMR spectrum, the silicon atom in the first constituent unit (T3 form) described above and the silicon atom in the second constituent unit (T2 form) described above indicate peaks or signals with different chemical shifts. The value of the molar ratio can be determined from the area ratio of these peaks. The $^{29}$Si-NMR spectrum of the polymerizable group-containing polyorganosilsesquioxane can be measured, for example, with the following instrument according to the following conditions.

Measuring instrument: "JNM-ECA500NMR (trade name)" (available from JEOL Ltd.)
Solvent: Deuterochloroform
Number of accumulation: 1800 scans
Measurement temperature: 25° C.

The number average molecular weight (Mn) of the polymerizable group-containing polyorganosilsesquioxane contained in the adhesive 4 is preferably from 1000 to 50000, more preferably from 1500 to 10000, more preferably from 2000 to 8000, and more preferably from 2000 to 7000. The polymerizable group-containing polyorganosilsesquioxane with a number average molecular weight of not lower than 1000 improves insulating properties, heat resistance, crack resistance, and adhesiveness of a cured product or the adhesive layer to be formed. On the other hand, the polymerizable group-containing polyorganosilsesquioxane with a molecular weight of not higher than 50000 improves compatibility of the polymerizable group-containing polyorganosilsesquioxane in the adhesive 4 with other components and improves insulating properties, heat resistance, and crack resistance of a cured product or the adhesive layer to be formed.

The molecular weight dispersity (Mw/Mn) of the polymerizable group-containing polyorganosilsesquioxane contained in the adhesive 4 is preferably from 1.0 to 4.0, more preferably from 1.1 to 3.0, and more preferably from 1.2 to 2.7. The polymerizable group-containing polyorganosilsesquioxane with a molecular weight dispersity of not greater than 4.0 further increases heat resistance, crack resistance, and adhesiveness of a cured product or the adhesive layer to be formed. On the other hand, the polymerizable group-containing polyorganosilsesquioxane with a molecular weight dispersity of not less than 1.0 allows the adhesive composition to easily become liquid, tending to improve its handleability.

The number average molecular weight (Mn) and the weight average molecular weight (Mw) of the polymerizable group-containing polyorganosilsesquioxane are values determined by gel permeation chromatography (GPC) and calculated by polystyrene standards. The number average molecular weight (Mn) and the weight average molecular weight (Mw) of the polymerizable group-containing polyorganosilsesquioxane can be measured using, for example, an HPLC instrument ("LC-20AD (trade name)" available from Shimadzu Corporation) according to the following conditions.

Column: Two Shodex KF-801 (upstream side, available from Showa Denko K.K.), Shodex KF-802 (available from Showa Denko K.K.), and Shodex KF-803 (downstream side, available from Showa Denko K.K.) are connected in series
Measurement temperature: 40° C.
Eluent: Tetrahydrofuran (THF)
Sample concentration: From 0.1 to 0.2 mass %
Flow rate: 1 mL/min
Standard sample: Polystyrene
Detector: A UV-VIS detector ("SPD-20A (trade name)" available from Shimadzu Corporation)

The polymerizable group-containing polyorganosilsesquioxane as described above can be manufactured by hydrolysis of a silane compound having three hydrolyzable functional groups and a subsequent condensation reaction. The raw material used in the manufacturing includes at least a compound represented by Formula (9) below and, as necessary, a compound represented by Formula (10) below. The compound represented by Formula (9) is for forming the constituent unit represented by Formula (1) above and the constituent unit represented by Formula (2) above. The compound represented by Formula (10) is for forming the constituent unit represented by Formula (7) above and the constituent unit represented by Formula (8) above.

[Chem. 15]

$$R^1SiX^1_3 \quad (9)$$

$$R^7SiX^2_3 \quad (10)$$

$R^1$ in Formula (9) represents a group containing a polymerizable group and is specifically the same as $R^1$ in Formulas (1) and (2) above. $X^1$ in Formula (9) represents an alkoxy group or a halogen atom. Examples of the alkoxy group include alkoxy groups having from 1 to 4 carbon atoms, such as a methoxy group, an ethoxy group, a propoxy group, an isopropyloxy group, a butoxy group, and an isobutyloxy group. Examples of the halogen atom as $X^1$ include a fluorine atom, a chlorine atom, a bromine atom, and an iodine atom. X' is preferably an alkoxy group and more preferably a methoxy group or an ethoxy group. In Formula (9), three $X^1$'s may be identical or different from each other.

$R^7$ in Formula (10) represents a substituted or unsubstituted aryl group, a substituted or unsubstituted aralkyl group, a substituted or unsubstituted cycloalkyl group, a substituted or unsubstituted alkyl group, or a substituted or unsubstituted alkenyl group and is specifically the same as $R^7$ in Formulas (7) and (8) above. $X^2$ in Formula (10) represents an alkoxy group or a halogen atom and is specifically the same as $X^1$ in Formula (9) above.

The raw material used in the manufacturing of the polymerizable group-containing polyorganosilsesquioxane described above may further contain an additional hydrolyzable silane compound. Examples of such a compound include a hydrolyzable trifunctional silane compound other than the compounds represented by Formulas (9) and (10) above, a hydrolyzable monofunctional silane compound that is to form an M unit, a hydrolyzable bifunctional silane compound that is to form a D unit, and a hydrolyzable tetrafunctional silane compound that is to form a Q unit.

The amount of the hydrolyzable silane compound as the raw material to be used and its composition is appropriately adjusted according to a structure of the polymerizable group-containing polyorganosilsesquioxane to be manufactured. For example, the amount of the compound represented by Formula (9) above to be used is, for example, from 55 to 100 mol % and preferably from 65 to 100 mol % relative to the total amount of the hydrolyzable silane compound to be used. The amount of the compound represented by Formula (10) above to be used is, for example, from 0 to 70 mol % relative to the total amount of the hydrolyzable silane compound to be used. The total amount of the compound represented by Formula (9) and the compound represented by Formula (10) to be used relative to the total amount of the hydrolyzable silane compound to be used is, for example, from 60 to 100 mol %, preferably from 70 to 100 mol %, and more preferably from 80 to 100 mol %.

In using two or more types of hydrolyzable silane compounds in the manufacturing of the polymerizable group-containing polyorganosilsesquioxane, the hydrolysis and the condensation reaction for each type of hydrolyzable silane compound can be performed simultaneously or sequentially.

The hydrolysis and the condensation reaction described above are preferably performed in the presence of one type or two or more types of solvents. Examples of a preferred solvent include ethers, such as diethyl ether, dimethoxyethane, tetrahydrofuran, and dioxane; and ketones, such as acetone, methyl ethyl ketone, and methyl isobutyl ketone.

The amount of the solvent to be used is appropriately adjusted according to the reaction time and the like within a range of, for example, not greater than 2000 parts by mass per 100 parts by mass of the hydrolyzable silane compound.

The hydrolysis and the condensation reaction described above are preferably allowed to proceed in the presence of one type or two or more types of catalysts and water. The catalyst may be an acid catalyst or may be an alkali catalyst. The amount of the catalyst to be used is appropriately adjusted within a range of, for example, 0.002 to 0.2 mol per mol of the hydrolyzable silane compound. The amount of the water to be used is appropriately adjusted within a range of, for example, 0.5 to 20 mol per mol of the hydrolyzable silane compound.

The hydrolysis and the condensation reaction of the hydrolyzable silane compound may be performed in one stage or may be performed in two or more stages. In manufacturing the polymerizable group-containing polyorganosilsesquioxane having a value of the molar ratio (T3 form/T2 form) of not less than 5, the reaction temperature of the hydrolysis and the condensation reaction in the first stage is, for example, from 40 to 100° C. and preferably from 45 to 80° C. The reaction time of the hydrolysis and the condensation reaction in the first stage is, for example, from 0.1 to 10 hours and preferably from 1.5 to 8 hours. The reaction temperature of the hydrolysis and the condensation reaction in the second stage is preferably from 5 to 200° C. and more preferably from 30 to 100° C. Control of the reaction temperature in the above range tends to enable more efficient control of the value of the molar ratio (T3 form/T2 form) and the number average molecular weight in the desired ranges. In addition, the reaction time of the hydrolysis and the condensation reaction in the second stage is not particularly limited but is preferably from 0.5 to 1000 hours and more preferably from 1 to 500 hours. Furthermore, the hydrolysis and the condensation reaction described above can be performed under normal pressure, under increased pressure, or under reduced pressure. The hydrolysis and the condensation reaction described above is preferably performed under an atmosphere of an inert gas, such as nitrogen or argon.

The hydrolysis and the condensation reaction of the hydrolyzable silane compound as described above provide the polymerizable group-containing polyorganosilsesquioxane described above. After the completion of the reaction, the catalyst is preferably neutralized to prevent ring-opening of the polymerizable group. The polymerizable group-containing polyorganosilsesquioxane thus obtained is purified as necessary.

The adhesive 4 preferably contains at least one type of curing catalyst in addition to the polymerizable group-containing polyorganosilsesquioxane, for example, manufactured as described above.

Examples of the curing catalyst, when the adhesive 4 contains an epoxy group-containing polyorganosilsesquioxane, include thermal cationic polymerization initiators. Examples of the curing catalyst, when the adhesive 4 contains a (meth)acryloyloxy group-containing polyorganosilsesquioxane, include thermal radical polymerization initiators. The content of the curing catalyst in the adhesive 4 is preferably from 0.1 to 3.0 parts by mass per 100 parts by mass of the polymerizable group-containing polyorganosilsesquioxane.

Examples of the thermal cationic polymerization initiator described above include various types of thermal cationic polymerization initiators, such as arylsulfonium salts, aluminum chelates, and boron trifluoride amine complexes.

Examples of the arylsulfonium salts include hexafluoroantimonate salts. Examples of the aluminum chelates include ethyl acetoacetate aluminum diisopropylate and aluminum tris(ethyl acetoacetate). Examples of the boron trifluoride amine complexes include a boron trifluoride monoethyl amine complex, a boron trifluoride imidazole complex, and a boron trifluoride piperidine complex.

Examples of the thermal radical polymerization initiators described above include thermal radical polymerization initiators of types, such as azo compounds and peroxides. Examples of the azo compounds include 2,2'-azobisisobutyronitrile, 2,2'-azobis(2,4-dimethylvaleronitrile), 2,2'-azobis(4-methoxy-2,4-dimethylvaleronitrile), dimethyl-2,2'-azobis(2-methylpropionate), dimethyl 2,2'-azobis (isobutyrate), diethyl-2,2'-azobis(2-methylpropionate), and dibutyl-2,2'-azobis(2-methylpropionate). Examples of the peroxides include benzoyl peroxide, t-butyl peroxy-2-ethylhexanoate, 2,5-dimethyl-2,5-di(2-ethylhexanoyl) peroxyhexane, t-butyl peroxybenzoate, t-butyl peroxide, cumene hydroperoxide, dicumyl peroxide, di-t-butyl peroxide, 2,5-dimethyl-2,5-dibutyl peroxyhexane, 2,4-dichlorobenzoyl peroxide, 1,4-di(2-t-butylperoxyisopropyl) benzene, 1,1-bis(t-butylperoxy)-3,3,5-trimethylcyclohexane, methyl ethyl ketone peroxide, and 1,1,3,3-tetramethylbutyl peroxy-2-ethylhexanoate.

The adhesive 4 may contain one type or two or more types additional curable compounds in addition to the polymerizable group-containing polyorganosilsesquioxane described above. Examples of the curable compound include epoxy compounds other than the polymerizable group-containing polyorganosilsesquioxane described above, (meth)acryloyloxy group-containing compounds, vinyl group-containing compounds, oxetane compounds, and vinyl ether compounds.

Examples of the epoxy compounds other than the polymerizable group-containing polyorganosilsesquioxane described above include alicyclic epoxy compounds (alicyclic epoxy resins), aromatic epoxy compounds (aromatic epoxy resins), and aliphatic epoxy compounds (aliphatic epoxy resins). Examples of the alicyclic epoxy compounds include 3,4,3',4'-diepoxybicyclohexane, 2,2-bis(3,4-epoxycyclohexyl)propane, 1,2-bis(3,4-epoxycyclohexyl)ethane, 2,3-bis(3,4-epoxycyclohexyl)oxirane, bis(3,4-epoxycyclohexylmethyl)ether, and an 1,2-epoxy-4-(2-oxiranyl)cyclohexane adduct of 2,2-bis(hydroxymethyl)-1-butanol (e.g., "EHPE3150" available from Daicel Corporation).

Examples of the aromatic epoxy compounds include epibis-type glycidyl ether epoxy resins and novolac-alkyl-type glycidyl ether epoxy resins.

Examples of the aliphatic epoxy compounds include glycidyl ethers of a q-hydric alcohol (q is a natural number) having no cyclic structure, glycidyl esters of a monocarboxylic acid or a polycarboxylic acid, and epoxy compounds of fat and oil having a double bond. Examples of the epoxy compounds of fat and oil having a double bond include epoxidized linseed oil, epoxidized soybean oil, and epoxidized castor oil.

Examples of the (meth)acryloyloxy group-containing compounds described above include: trimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, glycerin tri(meth)acrylate, tris(2-hydroxyethyl) isocyanurate tri(meth)acrylate, ethylene glycol di(meth)acrylate, 1,3-butanediol di(meth)acrylate, 1,4-butanediol di(meth)acrylate, 1,6-hexanediol di(meth)acrylate, neopentyl glycol di(meth)acrylate, diethylene glycol di(meth)acrylate, triethylene glycol di(meth)acrylate, dipropylene glycol di(meth)acrylate, bis(2-hydroxyethyl) isocyanurate di(meth)acrylate, dicyclopentanyl diacrylate, epoxy acrylate, urethane acrylate, unsaturated polyester, polyester acrylate, polyether acrylate, vinyl acrylate, silicone acrylate, and polystyrylethyl methacrylate. In addition, examples of the (meth)acryloyloxy group-containing compounds described above also include "DA-141" available from Nagase ChemteX Corporation, "Aronix M-211B" and "Aronix M-208" available from Toagosei Co., Ltd., and "NK Ester", "ABE-300", "A-BPE-4", "A-BPE-10", "A-BP E-20", "A-BPE-30", "BPE-100", "BPE-200", "BPE-500", "BPE-900", and "BPE-1300N" available from Shin-Nakamura Chemical Co., Ltd.

Examples of the vinyl group-containing compounds include styrene and divinylbenzene.

Examples of the oxetane compounds include: 3,3-bis(vinyloxymethyl)oxetane, 3-ethyl-3-(hydroxymethyl)oxetane, 3-ethyl-3-(2-ethythexyloxymethyl)oxetane, 3-ethyl-3-(hydroxymethyl)oxetane, 3-ethyl-3-[(phenoxy)methyl] oxetane, 3-ethyl-3-(hexyloxymethyl)oxetane, 3-ethyl-3-(chloromethyl)oxetane, and 3,3-bis(chloromethyl)oxetane.

Examples of the vinyl ether compounds include: 2-hydroxyethyl vinyl ether, 3-hydroxypropyl vinyl ether, 2-hydroxypropyl vinyl ether, 2-hydroxyisopropyl vinyl ether, 4-hydroxybutyl vinyl ether, 3-hydroxybutyl vinyl ether, 2-hydroxybutyl vinyl ether, 3-hydroxyisobutyl vinyl ether, 2-hydroxyisobutyl vinyl ether, 1-methyl-3-hydroxypropyl vinyl ether, 1-methyl-2-hydroxypropyl vinyl ether, 1-hydroxymethylpropyl vinyl ether, 4-hydroxycyclohexyl vinyl ether, 1,6-hexanediol monovinyl ether, 1,6-hexanediol divinyl ether, 1,8-octanediol divinyl ether, p-xylene glycol monovinyl ether, p-xylene glycol divinyl ether, m-xylene glycol monovinyl ether, m-xylene glycol divinyl ether, o-xylene glycol monovinyl ether, o-xylene glycol divinyl ether, diethylene glycol monovinyl ether, diethylene glycol divinyl ether, triethylene glycol monovinyl ether, and triethylene glycol divinyl ether.

The adhesive 4 preferably contains a solvent to adjust its coating properties or the like. Examples of the solvent include propylene glycol monomethyl ether acetate, methyl ethyl ketone, methyl isobutyl ketone, cyclohexanone, toluene, xylene, ethyl acetate, butyl acetate, 3-methoxybutyl acetate, methoxypropyl acetate, ethylene glycol monomethyl ether acetate, methanol, ethanol, isopropyl alcohol, 1-butanol, 1-methoxy-2-propanol, 3-methoxybutanol, ethoxyethanol, diisopropyl ether, ethylene glycol dimethyl ether, and tetrahydrofuran.

The adhesive 4 may further contain an additive of various types, such as a silane coupling agent, an antifoaming agent, an antioxidant, an anti-blocking agent, a leveling agent, a surfactant, an extender, an anti-corrosive agent, an antistatic agent, and a plasticizer.

With regard to the heat resistance of the adhesive 4, the pyrolysis temperature of the adhesive 4 is preferably not lower than 200° C., more preferably not lower than 260° C., and more preferably not lower than 300° C. The pyrolysis temperature is a temperature in a curve obtained by thermogravimetric analysis performed using a differential thermal-thermogravimetric simultaneous analyzer, that is, a curve representing temperature dependence of thermal gravity in a predetermined temperature range for a sample to be analyzed, the temperature indicated by a point of intersection of a tangent to a portion where there is no weight loss or the weight is gradually decreasing at a constant rate at the initial temperature increasing process and a tangent at an inflection point within a portion where a significant weight loss is occurring at the middle temperature increasing process subsequent to the initial temperature increasing process. As the differential thermal-thermogravimetric simultaneous analyzer, for example, "TG-DTA6300 (trade name)" available from Seiko Instruments Inc. can be used.

In the bonding step of the present method of manufacturing a semiconductor device, as illustrated in FIG. 3(b), the back surface 1b side of the thinned wafer 1T in the reinforced wafer 1R is bonded to the element forming surface 3a side of the wafer 3 through the adhesive 4 (face-to-back bonding), and a wafer laminate X (first wafer laminate) is formed.

Specifically, first, the adhesive 4 is coated by spin coating on one or both surfaces to be bonded (the element forming surface 3a of the wafer 3, the back surface 1b of the thinned wafer 1T) to form an adhesive layer. FIG. 3(a) illustrates by way of example coating the adhesive 4 on the element forming surface 3a of the wafer 3. In addition, prior to the coating of the adhesive 4, one or both surfaces to be bonded may be treated with a silane coupling agent. Then, the adhesive 4 (adhesive layer) is dried and solidified by heating. The heating temperature in the heating is, for example, from 50 to 150° C., and the heating time is, for example, from 5 to 120 minutes. The heating temperature may be constant or may be changed stepwise. Then, the surfaces to be bonded are affixed via the adhesive 4 (adhesive layer). In this affixing, the pressure is, for example, from 300 to 5000 g/cm², and the temperature is, for example, from 30 to 200° C. and preferably in a range of not lower than room temperature and not higher than 80° C. Thereafter, the adhesive 4 is cured by heating between the surfaces to be bonded. The heating temperature for curing is, for example, from 30 to 200° C. and preferably from 50 to 190° C., and the heating time for curing is, for example, from 5 to 120 minutes. The heating temperature may be constant or may be changed stepwise. The thickness of the adhesive layer after curing the adhesive 4 is, for example, from 0.5 to 20 µm. The above configuration of curing the adhesive 4 at a relatively low temperature in the present additional bonding step to achieve adhesive bonding is suitable for reducing dimensional change of the adhesive 4 interposed between the wafers during affixing and also suitable for suppressing damage to the elements in the wafer as an adherend.

In the present method for manufacturing a semiconductor device, the supporting substrate S is then removed from each wafer laminate X as illustrated in FIG. 3(c) (removal step). Specifically, the temporary adhesion created by the temporary adhesive layer 2 between the thinned wafer 1T and the supporting substrate S of each wafer laminate X obtained through the above-described bonding step is released, and the supporting substrate S is removed. The removal step preferably includes softening treatment to soften the temporary adhesive layer 2 at a temperature higher than the softening point ($T_3$) of the polymer described above in the temporary adhesive layer 2, that is, the polymer of the polyvalent vinyl ether compound (A) and the compound (B). The heating temperature of the temporary adhesive layer in this softening treatment is preferably not lower than 170° C., and, for example, not higher than 250° C., preferably not higher than 240° C., and more preferably not higher than 230° C. In the present removal step, for example, after such a softening treatment, the supporting substrate S is slid relative to the wafer 1, and the supporting substrate S is separated or removed. After removing the reinforced wafer 1R, if the temporary adhesive remains on the wafer 1, the temporary adhesive is removed. In this removing operation, one or two or more solvents in which the temporary adhesive is readily soluble can be used. Examples of such solvents include cyclohexanone, propylene glycol monomethyl ether, propylene glycol monomethyl ether acetate, acetone, ethyl acetate, butyl acetate, and methyl isobutyl ketone. For the wafer 1 in the reinforced wafer 1R described above not including a wiring structure including an insulating film or a wiring pattern on the element forming surface 1a side of the wafer 1, a wiring structure is formed on the element forming surface 1a of the thinned wafer 1T after the present removal step. The same applies after the removal step described below.

Next, a multilayering step like that illustrated in FIGS. 4(a) and 4(b) is performed. Specifically, the element forming surface 1a sides of the thinned wafers 1T in two wafer laminates X that have undergone the aforementioned removal step are bonded (face-to-face bonding) through the adhesive 4 to form a wafer laminate Y (second wafer laminate). In the adhesive bonding in this step, the adhesive 4 is applied by spin coating to one or both of the surfaces to be bonded (the element forming surfaces 1a of the two thinned wafers 1T). FIG. 4(a) illustrates by way of example a case in which the adhesive 4 is coated onto one element forming surface 1a. In addition, prior to the coating of the adhesive 4, one or both surfaces to be bonded may be treated with a silane coupling agent. The heating temperature, heating time, and pressure conditions for the adhesive bonding in this step are the same as the heating temperature, heating time, and pressure conditions for the adhesive bonding in the bonding step described above with reference to FIGS. 3(a) and 3(b).

Next, as illustrated in FIG. 4(c), the wafer 3 located at one end in the lamination direction of the wafer laminate Y is thinned. Specifically, one wafer 3 is ground from the back surface 3b side using a grinder, and the wafer 3 is thereby thinned to a predetermined thickness. The thickness of the wafer 3 after thinning is, for example, from 1 to 20 µm.

Figure 5:
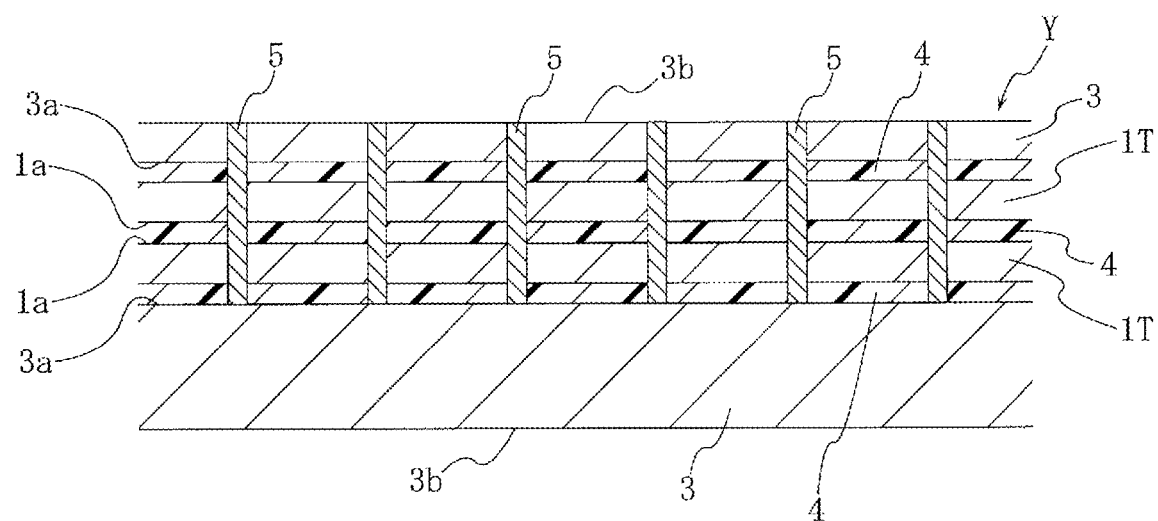
FIG. 5 illustrates some of the steps in the semiconductor device manufacturing method according to one embodiment of the first aspect of the present invention.

Next, as illustrated in FIG. 5, through electrodes 5 are formed (through electrode forming step). The through electrodes 5 are used to electrically connect semiconductor elements formed in different wafers in the wafer laminate that is formed. In the present embodiment, the through electrodes 5 extend through the inside of the wafer laminate from the back surface 3b of the wafer 3 located at one end of the wafer laminate in the lamination direction to the element forming surface 3a of the wafer 3 located at the other end. In the present step, the through electrodes 5 can be formed, for example, by: forming openings that pass through the thinned wafer 3, all of the thinned wafers 1T, and the adhesives 4 (adhesive layers); forming insulating films (not illustrated) on inner wall surfaces of the openings; forming barrier layers (not illustrated) on the insulating film surfaces; forming seed layers (not illustrated) for electroplating on the barrier layer surfaces; and filling the openings with a conductive material, such as copper, by an electroplating method. In addition, a technique described, for example, in JP 2016-004835 A may be employed to form the through electrodes 5. The through electrodes 5 to be formed electrically connect specifically wiring structures (not illustrated) each formed on the element forming surface 1a side of each thinned wafer 1T and a wiring structure (not illustrated) formed on the element forming surface 3a side of the wafer 3 to each other. Such through electrodes 5 can appropriately electrically connect the semiconductor elements at short distances in a semiconductor device to be manufactured. Thus, the configuration of forming such through electrodes 5 is suitable for achieving an efficient digital signal processing, for reducing attenuation of the high-frequency signal, and also for reducing power consumption in a semiconductor device to be manufactured.

Figure 6:
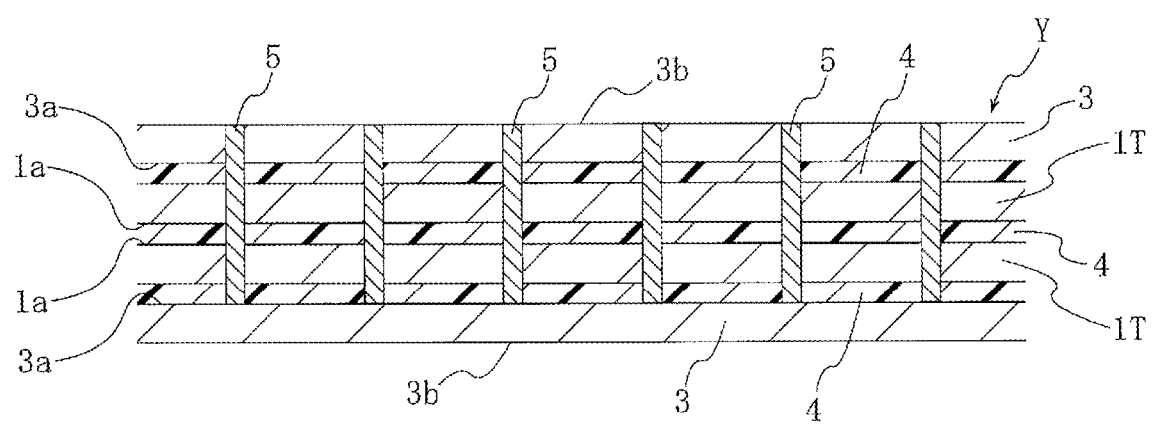
FIG. 6 illustrates some of the steps in the semiconductor device manufacturing method according to one embodiment of the first aspect of the present invention.

In the present method of manufacturing a semiconductor device, as illustrated in FIG. 6 next, the other wafer 3 (wafer 3 of the lower side in FIG. 6) may then be thinned. In the present thinning step, the wafer 3 is thinned to a predetermined thickness, for example, by grinding on the back surface 3b side of the wafer 3. The thickness of the wafer 3 after thinning is, for example, from 5 to 400 µm. Such a configuration is suitable for reducing the thickness of a semiconductor device to be manufactured.

Subsequently, an external connection bump (not illustrated) may be formed on the back surface 3b of the wafer 3 positioned at the upper side in FIG. 6. Alternatively, a through electrode (not illustrated) extending through the wafer 3 positioned at the lower side in FIG. 6 and electrically connecting with a wiring structure (not illustrated) of the element forming surface 3a side of the wafer 3 may be formed, and an external connection bump (not illustrated) electrically connected to the through electrode thereof may be formed on the back surface 3b side of the wafer 3.

As described above, the semiconductor device having a three-dimensional structure in which semiconductor elements are integrated in their thickness direction can be manufactured. This semiconductor device may be divided into individual pieces by dicing.

With the present method for manufacturing a semiconductor device, it is also possible to further laminate the thinned wafer 1T of each wafer laminate X before the multilayering step by bonding together the wafer laminates X. Specifically, the further lamination is implemented as follows.

First, a predetermined number of the reinforced wafers 1R (illustrated in FIG. 1(a)) are additionally prepared separately from the reinforced wafer 1R described above. As described above, the reinforced wafer 1R has a laminated structure including the wafer 1 having the element forming surface 1a and the back surface 1b, the supporting substrate S, and the temporary adhesive layer 2 between the wafer 1 and the supporting substrate S. The temporary adhesive layer 2 is formed from the temporary adhesive described above. Then, in each reinforced wafer 1R, the wafer 1 is thinned as illustrated in FIG. 1(b). Specifically, in each reinforced wafer 1R, the wafer 1 in a state of being supported by the supporting substrate S is thinned to a predetermined thickness by grinding from the back surface 1b side of the wafer 1 using a grinder to form a thinned wafer 1T. The thickness of the wafer 1 after thinning (thinned wafer 1T) is, for example, from 1 to 20 µm.

Figure 7:
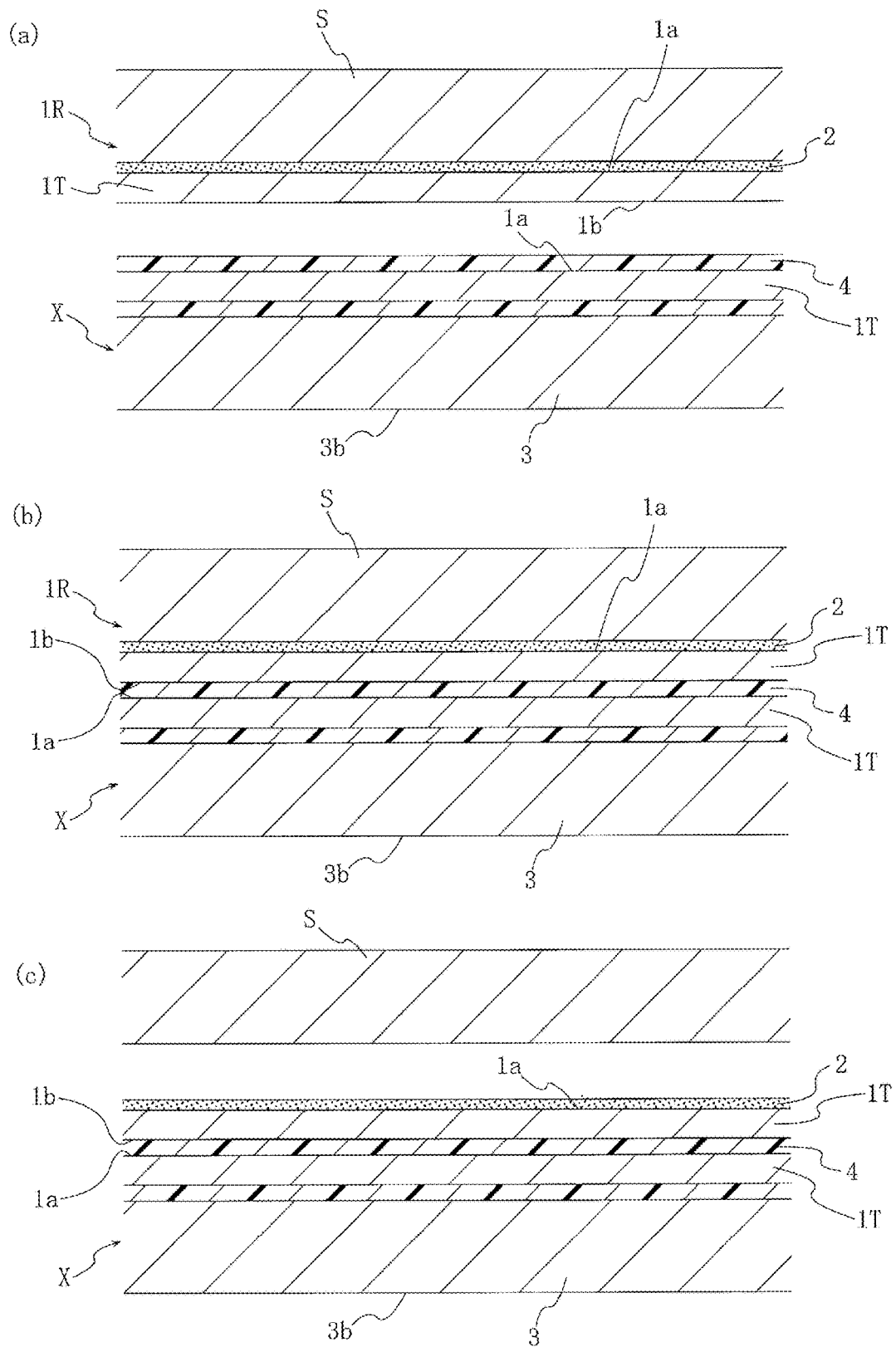
FIG. 7 illustrates some of the steps in a semiconductor device manufacturing method according to another embodiment of the first aspect of the present invention.

Next, as illustrated in FIGS. 7(a) and 7(b), for example, the back surface 1b side of the thinned wafer 1T in the reinforced wafer 1R, which was thus separately prepared, is bonded (additional bonding step, face-to-back bonding) through the adhesive 4 to the element forming surface 1a side of the thinned wafer 1T in the wafer laminate X that has been subjected to the aforementioned removal step. In the adhesive bonding in this step, the adhesive 4 is applied by spin coating to one or both of the surfaces to be bonded (the element forming surface 1a of one thinned wafer 1T and the back surface 1b of the other thinned wafer 1T). FIG. 7(a) illustrates by way of example a case in which the adhesive 4 is coated onto the element forming surface 1a of one thinned wafer 1T. In addition, prior to the coating of the adhesive 4, one or both surfaces to be bonded may be treated with a silane coupling agent. The heating temperature, heating time, and pressure conditions for the adhesive bonding in this step are the same as the heating temperature, heating time, and pressure conditions for the adhesive bonding in the bonding step described above with reference to FIGS. 3(a) and 3(b).

Next, as illustrated in FIG. 7(c), the supporting substrate S is removed from each of the wafer laminates X that have undergone the additional bonding step (removal step after the additional bonding step). Specifically, the temporary adhesion created by the temporary adhesive layer 2 between the thinned wafer 1T and the supporting substrate S of each wafer laminate X obtained through the above-described additional bonding step is released, and the supporting substrate S is removed. The removal step preferably includes softening treatment to soften the temporary adhesive layer 2 at a temperature higher than the softening point ($T_3$) of the polymer described above in the temporary adhesive layer 2, that is, the polymer of the polyvalent vinyl ether compound (A) and the compound (B). The temporary adhesive layer heating temperature in this softening treatment and the technique for removing the supporting substrate are the same as in the removal step described above with reference to FIG. 3(c).

Figure 8:
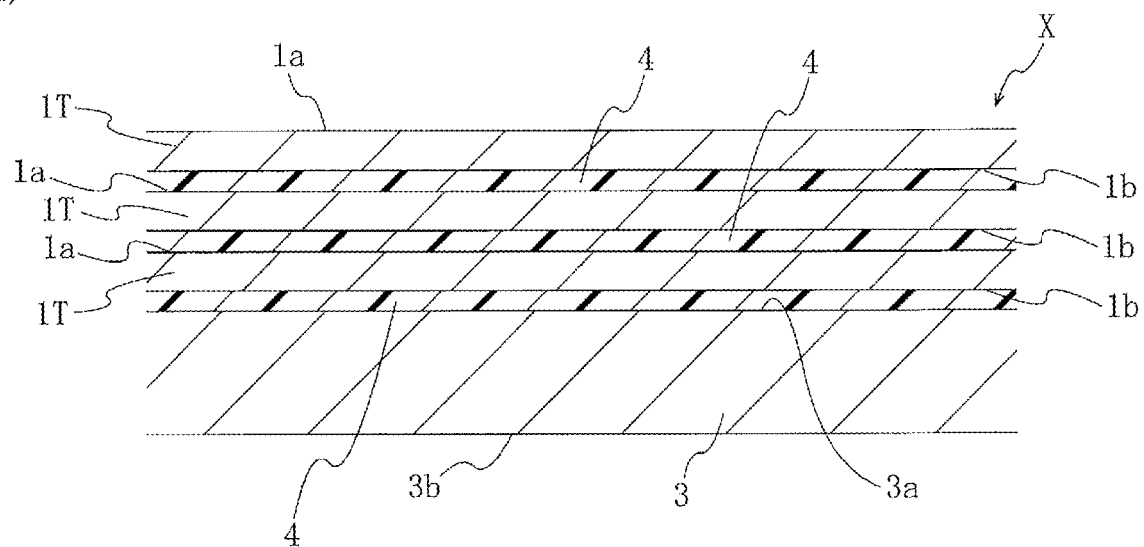
FIG. 8 illustrates some of the steps in the semiconductor device manufacturing method according to another embodiment of the first aspect of the present invention.
Figure 8:
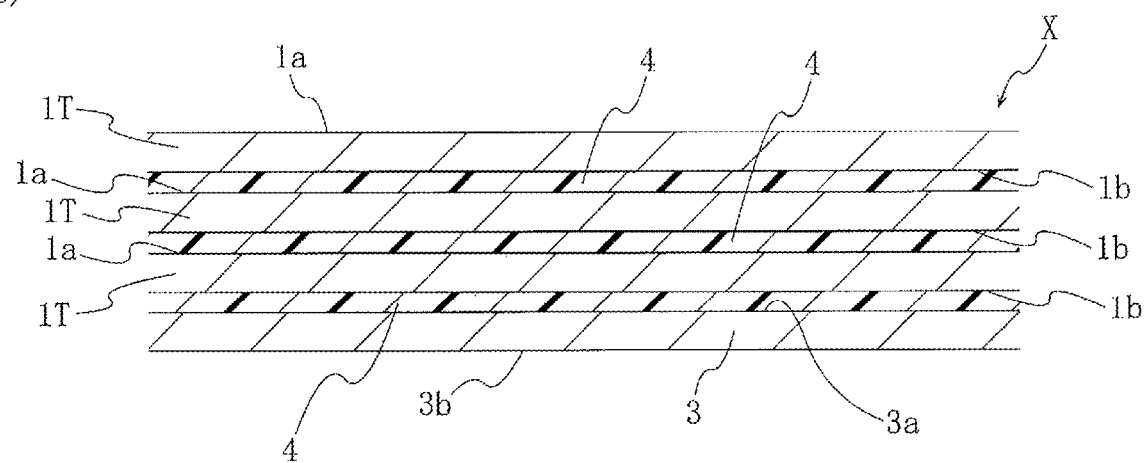

In the present method of manufacturing a semiconductor device, with respect to each wafer laminate X, a plurality of thinned wafers 1T can be sequentially laminated by repeating a series of processes including: the thinning step (FIG. 1) to thin the wafer 1 of the reinforced wafer 1R of each additional reinforced wafer 1R that is prepared; and the above-described additional bonding step and subsequent removal step (FIG. 7) for each wafer laminate X. FIG. 8(a) illustrates, as one example, the wafer laminate X obtained by arranging three thinned wafers 1T in multiple layers on the wafer 3. For the wafer laminate X, the wafer 3 may be thinned, as illustrated in FIG. 8(b), before the multilayering step. That is, with regard to the wafer laminate X, a grinder may be used to grind the wafer 3 from the back surface 3b side, and thereby the wafer 3 is thinned to a predetermined thickness. The thickness of the wafer 3 after thinning is, for example, from 1 to 200 µm.

Figure 9:
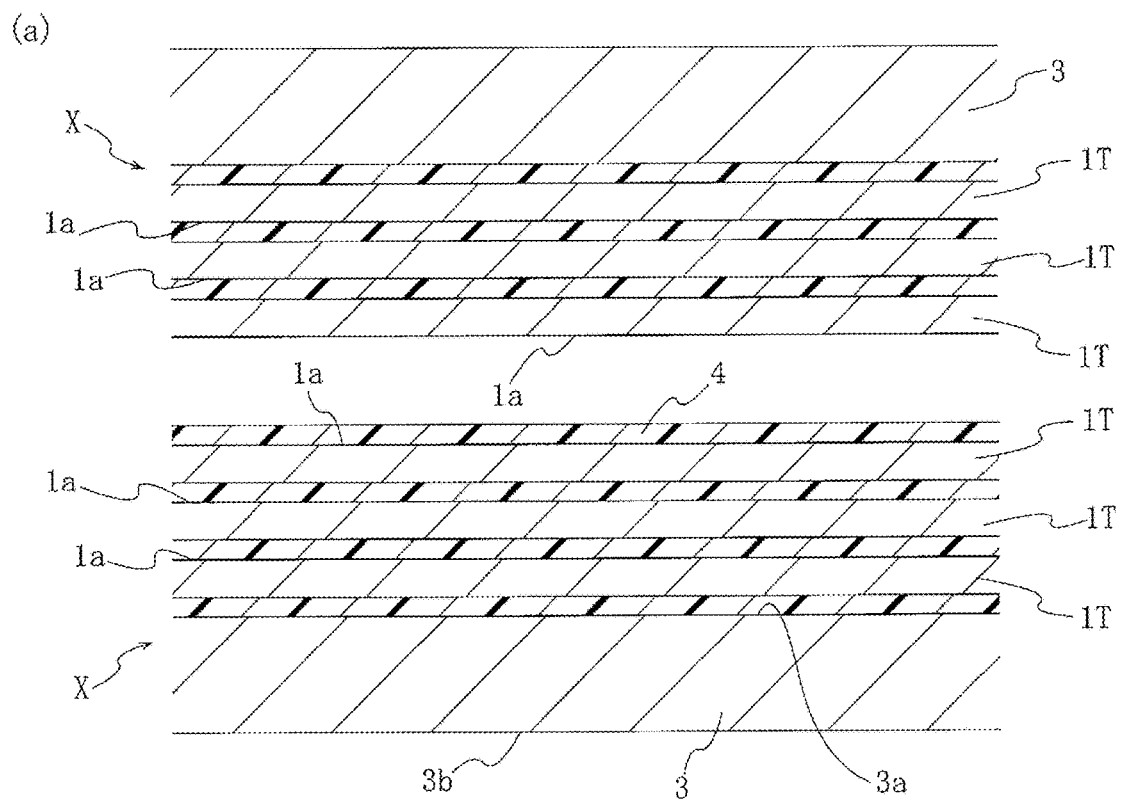
FIG. 9 illustrates some of the steps in the semiconductor device manufacturing method according to another embodiment of the first aspect of the present invention.
Figure 9:
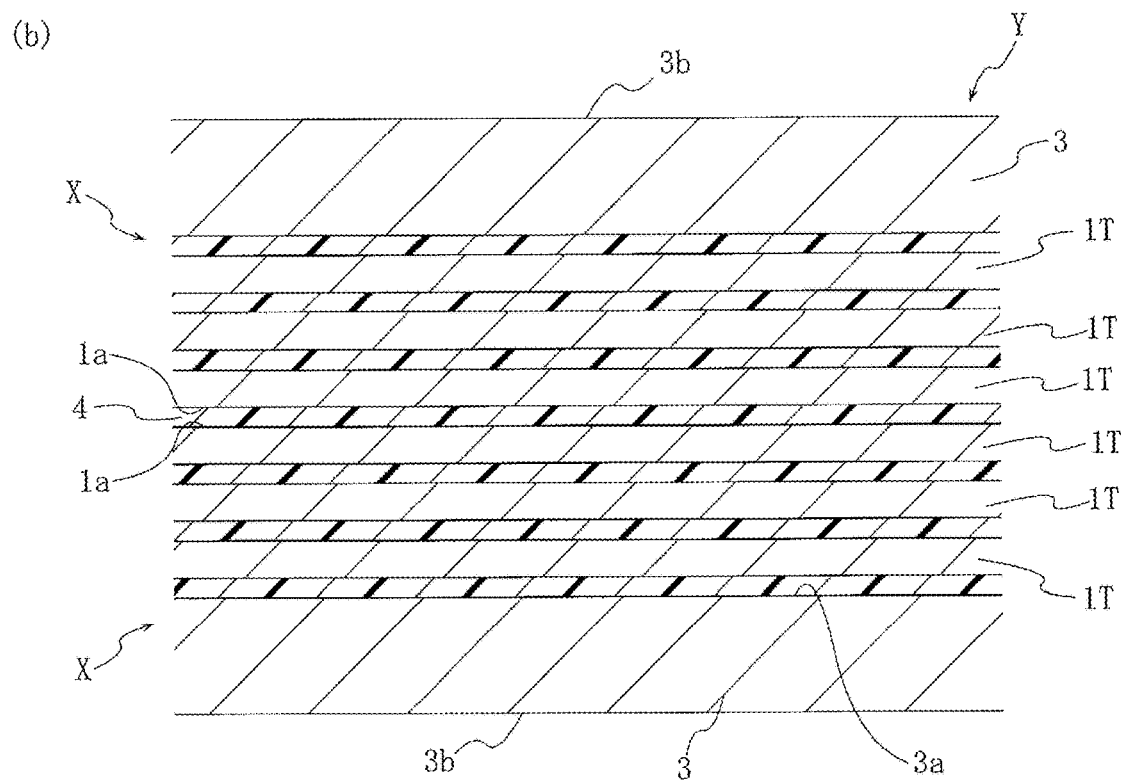

Next, for example, a multilayering step in which the two wafer laminates X illustrated in FIG. 8(a) are bonded as illustrated in FIGS. 9(a) and 9(b) is implemented. Specifically, the element forming surface 1a sides of the thinned wafers 1T of two wafer laminates X illustrated in FIG. 8(a) are bonded (face-to-face bonding) through an adhesive 4, and the wafer laminate Y (second wafer laminate) is formed. In the adhesive bonding in this step, the adhesive 4 is applied by spin coating to one or both of the surfaces to be bonded (the element forming surfaces 1a of the two thinned wafers 1T). FIG. 9(a) illustrates by way of example a case in which the adhesive 4 is coated onto one element forming surface 1a. In addition, prior to the coating of the adhesive 4, one or both surfaces to be bonded may be treated with a silane coupling agent. The heating temperature, heating time, and pressure conditions for the adhesive bonding in this step are the same as the heating temperature, heating time, and pressure conditions for the adhesive bonding in the bonding step described above with reference to FIGS. 3(a) and 3(b).

Figure 10:
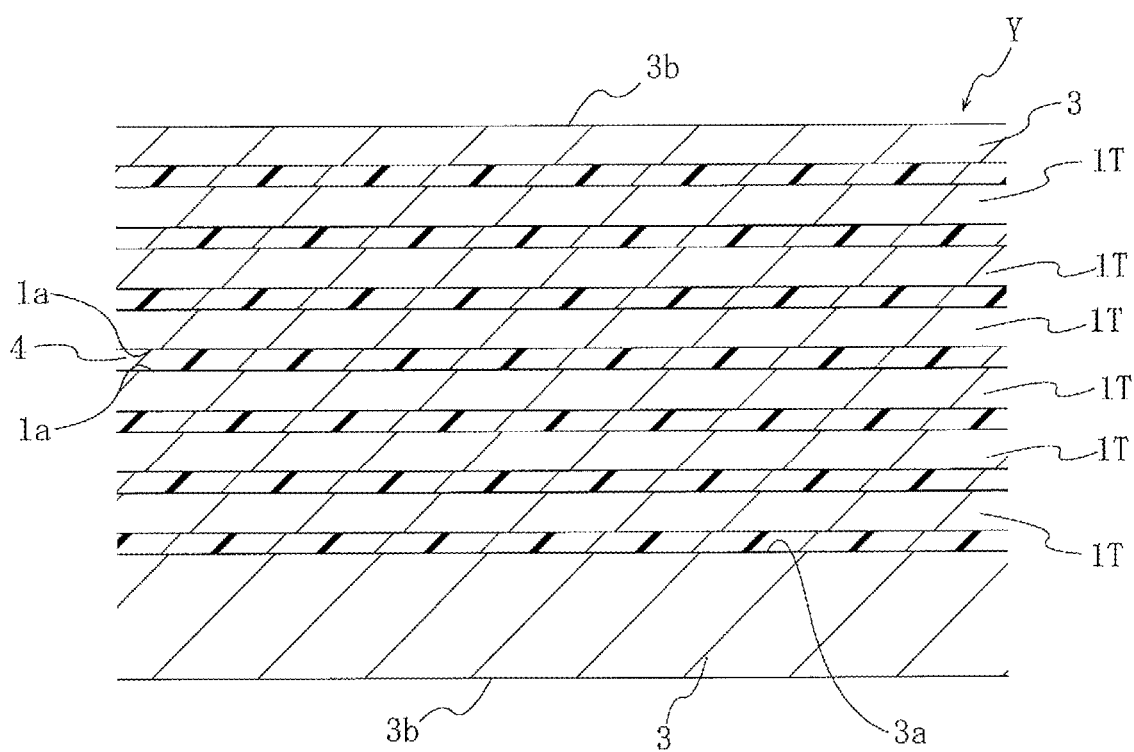
FIG. 10 illustrates some of the steps in the semiconductor device manufacturing method according to another embodiment of the first aspect of the present invention.

Next, as illustrated in FIG. 10, the wafer 3 located at one end in the lamination direction of the wafer laminate Y is thinned. Specifically, one wafer 3 is ground from the back surface 3b side using a grinder, and the wafer 3 is thereby thinned to a predetermined thickness. The thickness of the wafer 3 after thinning is, for example, from 1 to 20 µm.

Figure 11:
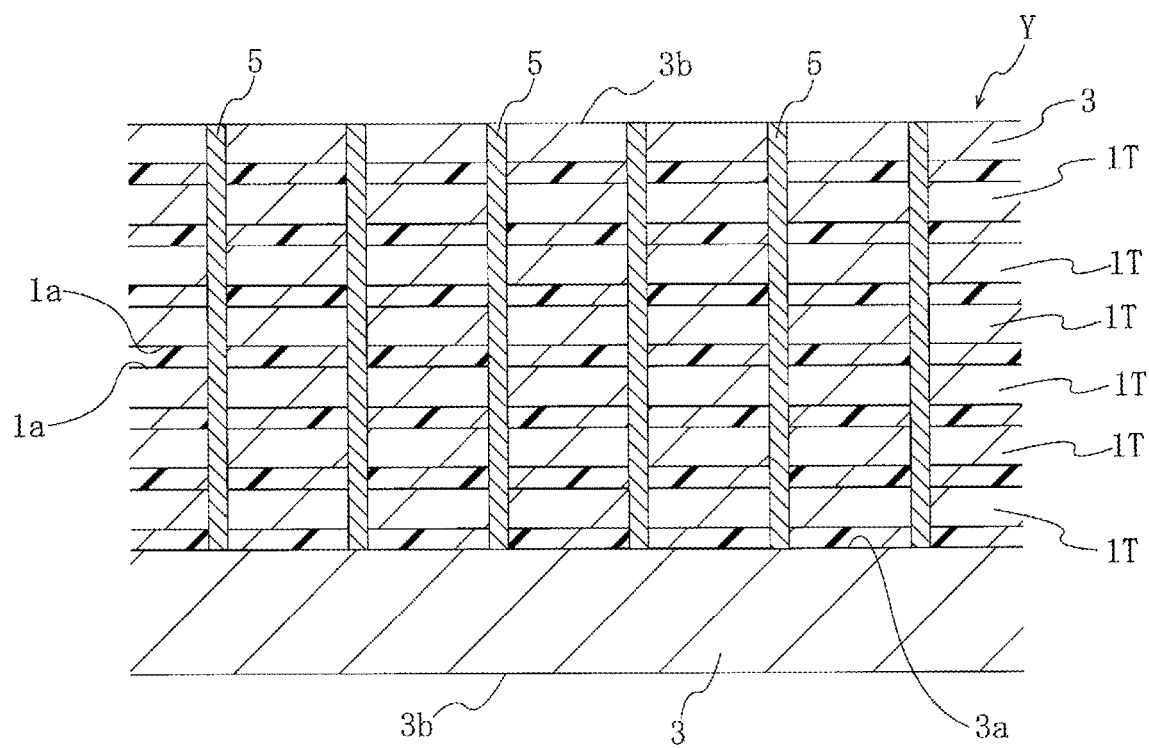
FIG. 11 illustrates some of the steps in the semiconductor device manufacturing method according to another embodiment of the first aspect of the present invention.

Next, as illustrated in FIG. 11, the through electrodes 5 are formed (through electrode forming step). The through electrodes 5 are used to electrically connect semiconductor elements formed in different wafers in the wafer laminate that is formed. In the present embodiment, the through electrodes 5 extend through the inside of the wafer laminate from the back surface 3*b* of the wafer 3 located at one end of the wafer laminate in the lamination direction to the element forming surface 3*a* of the wafer 3 located at the other end. The technique for forming the through electrodes is the same as the technique for forming the through electrodes described above with reference to FIG. 5.

Figure 12:
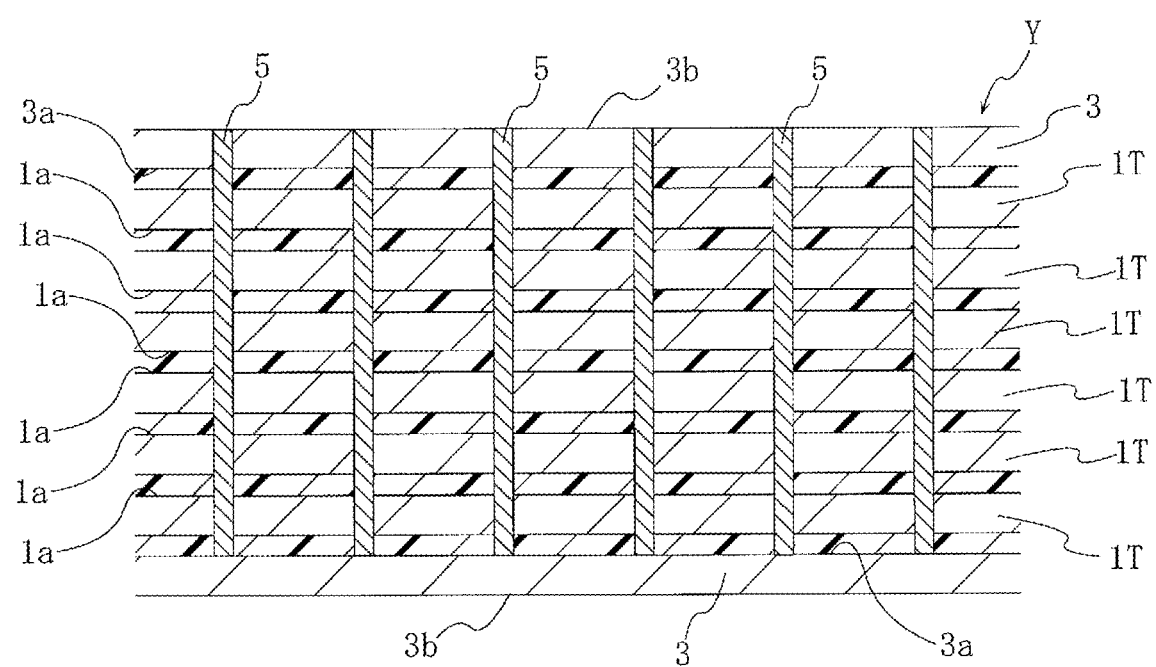
FIG. 12 illustrates some of the steps in the semiconductor device manufacturing method according to another embodiment of the first aspect of the present invention.

In the present method of manufacturing a semiconductor device, as illustrated in FIG. 12 next, the other wafer 3 (wafer 3 at the lower side in FIG. 12) may be thinned. In the present thinning step, the wafer 3 is thinned to a predetermined thickness, for example, by grinding on the back surface 3*b* side of the wafer 3. The thickness of the wafer 3 after thinning is, for example, from 5 to 400 µm. Such a configuration is suitable for reducing the thickness of a semiconductor device to be manufactured.

Subsequently, an external connection bump (not illustrated) may be formed on the back surface 3*b* of the wafer 3 positioned at the upper side in FIG. 12. Alternatively, a through electrode (not illustrated) extending through the wafer 3 positioned at the lower side in FIG. 12 and electrically connecting with a wiring structure (not illustrated) of the element forming surface 3*a* side of the wafer 3 may be formed, and an external connection bump (not illustrated) electrically connected to the through electrode thereof may be formed on the back surface 3*b* side of the wafer 3.

As described above, the semiconductor device having a three-dimensional structure in which semiconductor elements are integrated in their thickness direction can be manufactured. This semiconductor device may be divided into individual pieces by dicing.

Figure 13:
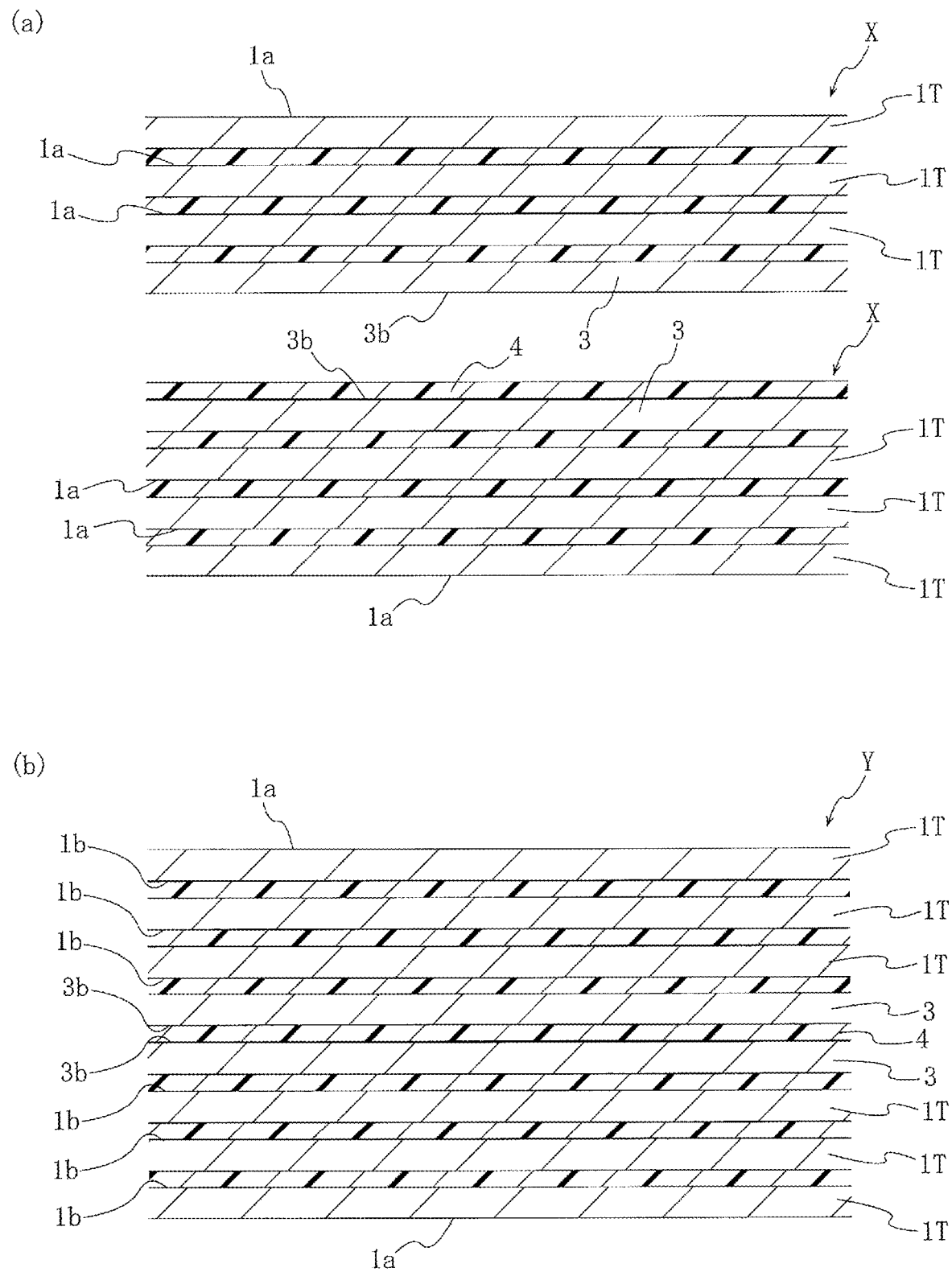
FIG. 13 illustrates some of the steps in a semiconductor device manufacturing method according to yet another embodiment of the first aspect of the present invention.

In the present semiconductor device manufacturing method, instead of the multilayering step through the face-to-face bonding of the wafer laminates X to each other, a multilayering step of back-to-back bonding of the wafer laminates X to each other may be implemented. For example, a multilayering step in which the two wafer laminates X illustrated in FIG. 8(*b*) are bonded as illustrated in FIGS. 13(*a*) and 13(*b*) may be implemented. In such a multilayering step, specifically, the back surface 3*b* sides of wafers 3 of the two wafer laminates X illustrated in FIG. 8(*b*) are bonded (back-to-back bonding) through the adhesive 4, and the wafer laminate Y (second wafer laminate) is formed. In the adhesive bonding in this step, the adhesive 4 is applied by spin coating to one or both of the surfaces to be bonded (back surfaces 3*b* of two wafers 3). FIG. 13(*a*) illustrates by way of example a case in which the adhesive 4 is coated onto one back surface 3*b*. In addition, prior to the coating of the adhesive 4, one or both surfaces to be bonded may be treated with a silane coupling agent. The heating temperature, heating time, and pressure conditions for the adhesive bonding in this step are the same as the heating temperature, heating time, and pressure conditions for the adhesive bonding in the bonding step described above with reference to FIGS. 3(*a*) and 3(*b*).

Figure 14:
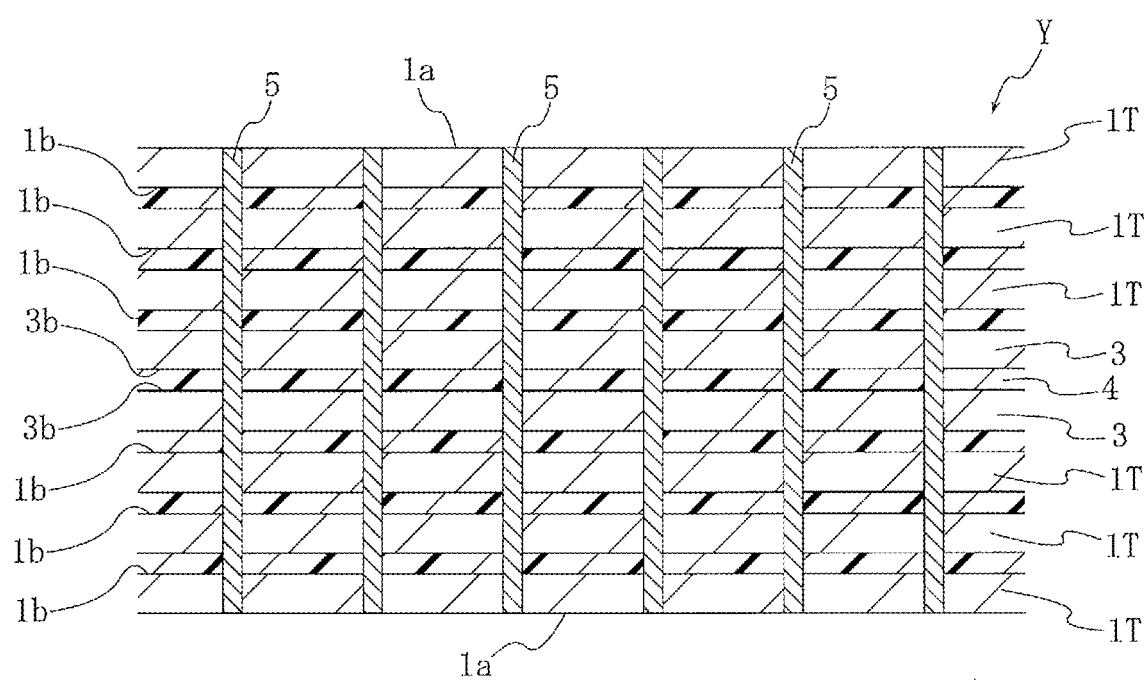
FIG. 14 illustrates some of the steps in the semiconductor device manufacturing method according to yet another embodiment of the first aspect of the present invention.
Figure 15:
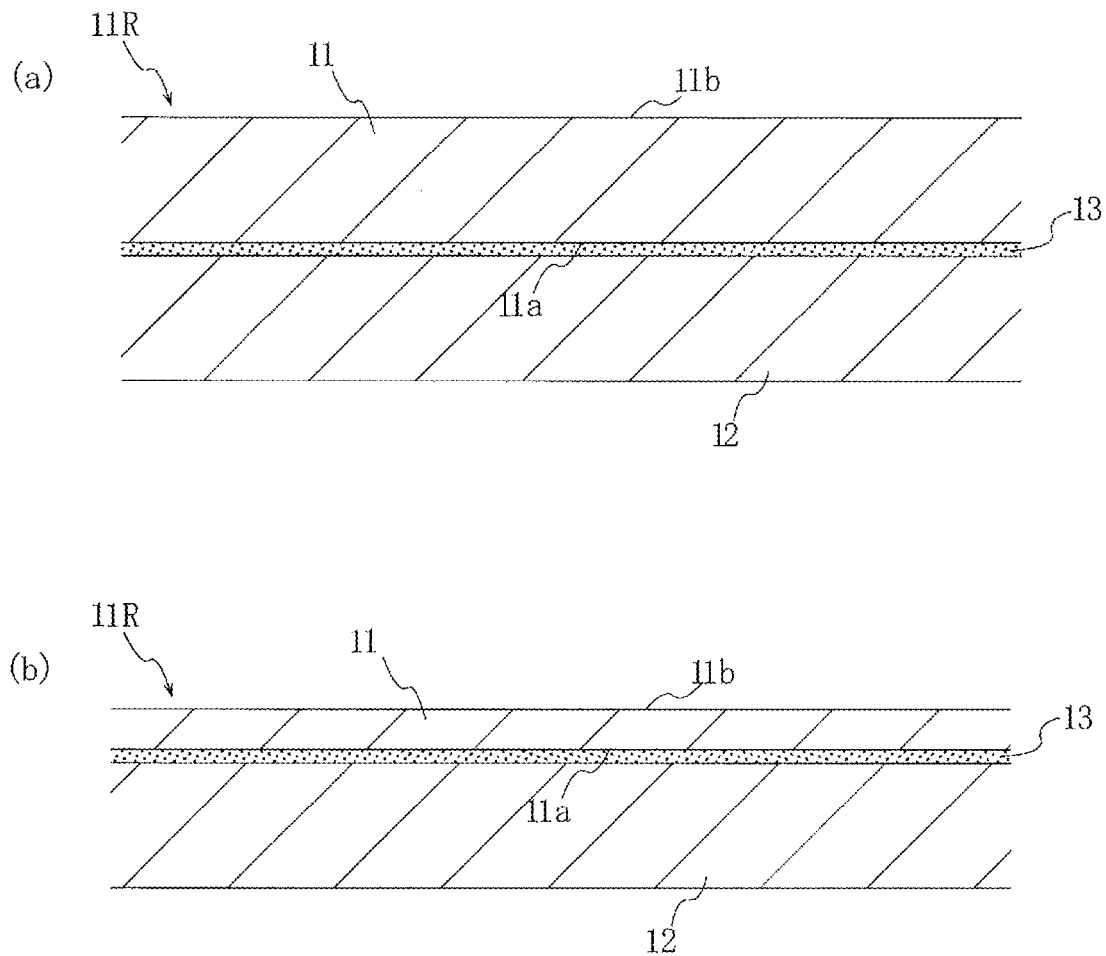
FIG. 15 illustrates some of the steps in a semiconductor device manufacturing method according to one embodiment of a second aspect of the present invention.
Figure 16:
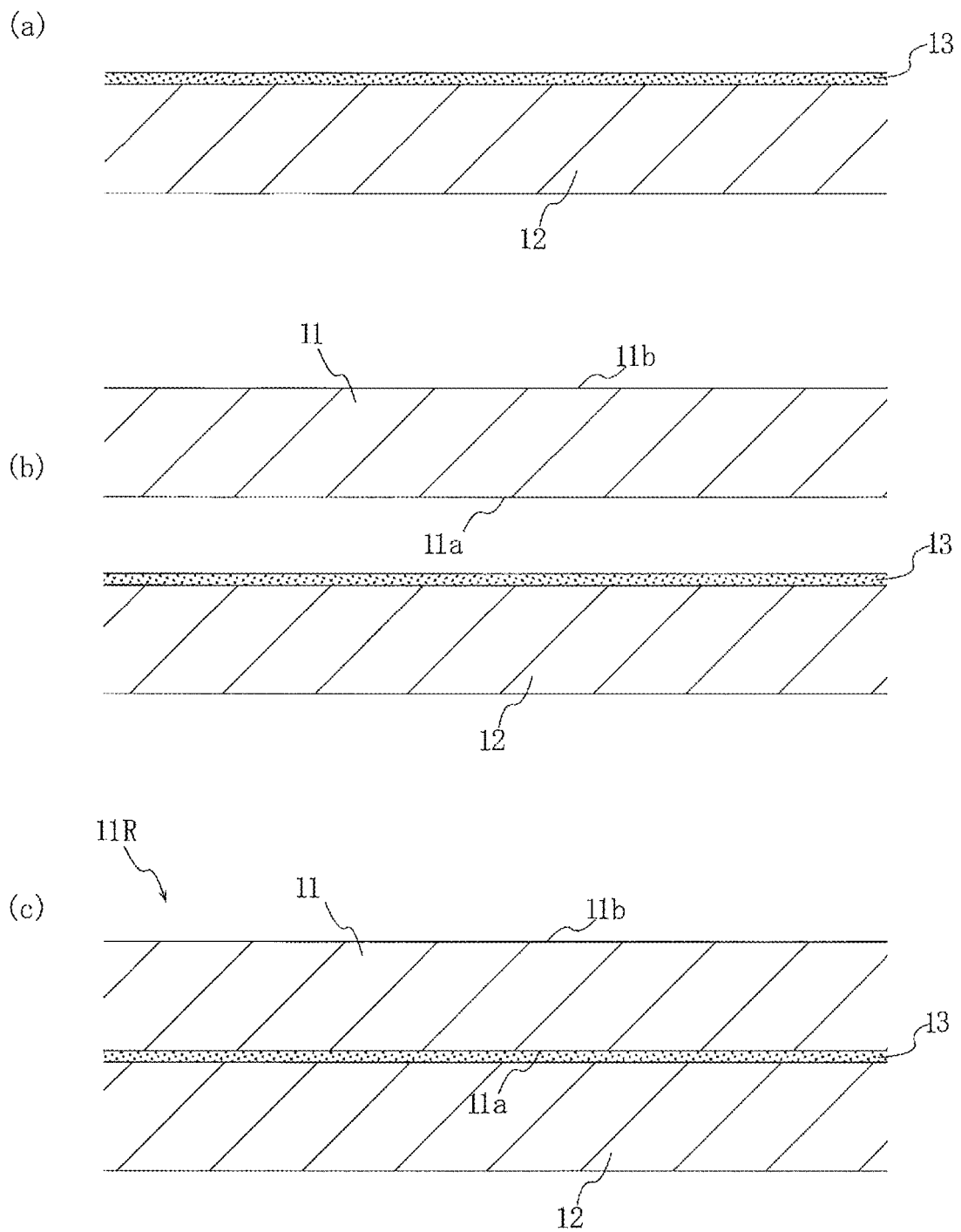
FIG. 16 illustrates some of the steps in the semiconductor device manufacturing method according to one embodiment of the second aspect of the present invention.

Next, as illustrated in FIG. 14, the through electrodes 5 are formed (through electrode forming step). The through electrodes 5 are used to electrically connect semiconductor elements formed in different wafers in the wafer laminate that is formed. In the present embodiment, the through electrodes 5 extend through the inside of the wafer laminate from the element forming surface 1*a* of the thinned wafer 1T located at one end of the wafer laminate in the lamination direction to the element forming surface 1*a* of the thinned wafer 1T located at the other end. The technique for forming the through electrodes is the same as the technique for forming the through electrodes described above with reference to FIG. 5.

Subsequently, an insulating film (not illustrated) may be formed on the element forming surface 1*a* of the thinned wafer 1T positioned at the upper end in FIG. 14, and an external connection bump (not illustrated) may be formed on the insulating film. Alternatively, an insulating film (not illustrated) may be formed on the element forming surface 1*a* of the thinned wafer 1T positioned at the lower end in FIG. 14, and an external connection bump (not illustrated) may be formed on the insulating film.

As described above, the semiconductor device having a three-dimensional structure in which semiconductor elements are integrated in their thickness direction can be manufactured. This semiconductor device may be divided into individual pieces by dicing.

In the present method of manufacturing a semiconductor device, as described above, the wafer (the wafer 1 of the reinforced wafer 1R) affixed to the supporting substrate S through the temporary adhesive layer 2 for achieving temporary adhesion is thinned and then adhesive bonded (bonding step) to the wafer 3, which is the base wafer, or is thinned and then adhesive bonded (additional bonding step) to the thinned wafer 1T of the wafer laminate X, after which the supporting substrate S is removed (removal step) from the thinned wafer 1T. Such a configuration is suitable for adhesive bonding a thin wafer to a thicker, mechanically strong base wafer while avoiding wafer damage, and thus is suitable for forming structures in which thin wafers are arranged in multiple layers.

In addition, with the present semiconductor device manufacturing method, as described above, the element forming surface 1*a* sides of thinned wafers 1T of two wafer laminates X are adhesively bonded (face-to-face bonding), or the back surface 3*b* sides of the base wafers 3 are adhesively bonded (back-to-back bonding) to achieve multilayering (multilayering step) of thin wafers. The wafer laminate Y thus obtained has a symmetrical laminated configuration in the thickness direction thereof. In the wafer laminate Y obtained by the aforementioned face-to-face bonding in the multilayering step, the element forming surfaces (element forming surface 1*a* of the thinned wafer 1T, element forming surface 3*a* of the wafer 3) of all of the wafers included therein face the face-to-face bonding site side (inner side). In the wafer laminate Y obtained by the aforementioned back-to-back bonding in the multilayering step, the back surfaces (back surface 1*b* of the thinned wafer 1T, back surface 3*b* of the wafer 3) of all of the wafers included therein face the back-to-back bonding site side (inner side). The wafer laminates Y having this type of symmetrical laminated configuration in the thickness direction are less prone to warping.

As described above, the present semiconductor device manufacturing method is suitable for multilayering thin wafers through adhesive bonding while suppressing warping of the wafer laminate.

In the embodiment described above, the adhesive 4 used in the bonding step and the adhesive 4 used in the additional bonding step each contain a polymerizable group-containing polyorganosilsesquioxane. As described above, the polymerizable group-containing polyorganosilsesquioxane is suitable for achieving a relatively low polymerization temperature or curing temperature of, for example, approximately 30 to 200° C., and is suitable for achieving high heat resistance after curing. Thus, the wafer-to-wafer adhesive bonding with the adhesive containing the polymerizable group-containing polyorganosilsesquioxane is suitable for achieving high heat resistance in an adhesive layer to be formed between the wafers as well as achieving lower curing temperature for forming the adhesive layer and thus preventing damages to the elements in the wafer as an adherend.

In the embodiment described above, the temporary adhesive for forming the temporary adhesive layer 2 within the reinforced wafer 1R contains: a polyvalent vinyl ether compound; a compound that has two or more hydroxy groups or carboxy groups that are capable of forming an acetal bond by reacting with a vinyl ether group of the polyvalent vinyl ether compound, the compound capable of forming a polymer with the polyvalent vinyl ether compound; and a thermoplastic resin. The temporary adhesive thus configured is suitable, in the form of the temporary adhesive layer 2 formed by curing between the supporting substrate S and the wafer 1, for achieving a relatively high softening temperature of, for example, approximately 130 to 250° C. while ensuring high adhesive strength that can withstand the grinding or the like in the thinning step of the wafer 1.

In the embodiment described above for the present semiconductor device manufacturing method, the temporary adhesive layer 2 inside the reinforced wafer 1R to be subjected to the bonding step or the additional bonding step has the above-described composition suited for achieving a relatively high softening temperature, and the adhesive 4 used in the same step is provided with a composite configuration as an adhesive that contains a polymerizable group-containing polyorganosilsesquioxane suited for realizing a relatively low curing temperature and high heat resistance after curing. Such a composite configuration is suitable for implementing both the bonding step and each additional bonding step and for implementing the subsequent removal step. That is, the composite configuration thereof is suitable for implementing the bonding step and additional bonding step at a relatively low temperature condition and achieving good adhesive bonding to the other wafer (wafer 3 in the bonding step, the other thinned wafer 1T that is one constituent element of the wafer laminate X in the additional bonding step) of the thinned wafer 1T while maintaining the temporary adhesion of the supporting substrate S and the thinned wafer 1T in the reinforced wafer 1R, and the composite configuration thereof is suitable for implementing the subsequent removal step at a relatively high temperature condition to soften the temporary adhesive layer 2 and remove the supporting substrate S from the thinned wafer 1T while maintaining the adhesive bonding between the thinned wafer 1T and the other wafer. The configuration of releasing the temporary adhesion by the temporary adhesive layer 2 through softening the temporary adhesive layer 2 when removing the supporting substrate S from the thinned wafer 1T is suitable for avoiding or suppressing a strong stress applied locally to the thinned wafer 1T to thereby avoid damage to the thinned wafer.

A semiconductor device manufacturing method according to a second aspect of the present invention will be described below.

FIG. 15 to FIG. 20 illustrate a semiconductor device manufacturing method according to an embodiment of the present invention. This manufacturing method is a method of manufacturing a semiconductor device having a three-dimensional structure in which semiconductor elements are integrated in the thickness direction thereof, and FIG. 15 to FIG. 20 illustrate manufacturing steps in partial cross-sectional views.

In the present semiconductor device manufacturing method, first, a reinforced wafer 11R as illustrated in FIG. 15(a) is prepared (preparation step). The number of reinforced wafers 11R to be prepared is four or more and is determined according to the number of lamination layers of semiconductor elements in a semiconductor device to be manufactured.

The reinforced wafer 11R has a laminated structure that includes: a wafer 11; a supporting substrate 12; and a temporary adhesive layer 13 between the wafer 11 and the supporting substrate 12.

The wafer 11 is a wafer including a semiconductor wafer main body in which a semiconductor element can be fabricated and includes an element forming surface 11a and a back surface 11b opposite from the element forming surface 11a. In the present embodiment, the element forming surface is a surface of a side on which a plurality of semiconductor elements (not illustrated) are formed in the wafer through a transistor formation step. Each semiconductor element of the wafer 11 includes, for example, a multi-layered wiring structure portion including an exposed electrode pad on a surface. Alternatively, the wafer 11 may be a wafer in which various semiconductor elements are already fabricated on the element forming surface 11a side, and a wiring structure necessary for the semiconductor elements may be subsequently formed on the element forming surface 11a. Examples of a constituent material for forming the semiconductor wafer main body of the wafer 11 include silicon (Si), germanium (Ge), silicon carbide (SiC), gallium arsenide (GaAs), gallium nitride (GaN), and indium phosphide (InP). The thickness of such a wafer 11 is preferably not greater than 1000 µm, more preferably not greater than 900 µm, and even more preferably not greater than 800 µm from the perspective of reducing the grinding time in grinding step described later. In addition, the thickness of the wafer 11 is, for example, not less than 500 µm.

The supporting substrate 12 in the reinforced wafer 11R is used to reinforce the wafer 11 to be thinned through a thinning step described below. Examples of the supporting substrate 12 include silicon wafers and glass wafers. From the perspective of ensuring function as a reinforcing element, the thickness of the supporting substrate 12 is preferably not less than 300 µm, more preferably not less than 500 µm, and even more preferably not less than 700 µm. In addition, the thickness of the supporting substrate 12 is, for example, not greater than 800 µm. Such a supporting substrate 12 is bonded to the element forming surface 11a side of the wafer 11 through the temporary adhesive layer 13.

The temporary adhesive layer 13 is used to achieve temporary adhesion between the wafer 11 and the supporting substrate 12, and the temporary adhesion can be subsequently released. As an example of the adhesive for forming such a temporary adhesive layer 13, an adhesive is used that contains a polymeric material that exhibits tackiness or adhesiveness in the temporary adhesive layer 13 at a predetermined temperature range, the polymeric material having a softening temperature in a high temperature range exceeding the abovementioned temperature range, the adhesive thereof being provided with: adhesive strength capable of withstanding the grinding described below for forming the wafer 11, heat resistance for withstanding the wafer bonding step described below or the like associated with heating, and an easy-to-peel function for appropriately implementing the removal step described below. For example, a silicone-based tacky adhesive, an acrylic-based tacky adhesive, or a wax-type adhesive can be used as the adhesive for forming the temporary adhesive layer 13. As the adhesive for forming the temporary adhesive layer 13, the adhesives described in JP 2008-13589 A, JP 2008-13590 A, or JP 2008-49443 A may be used. Alternatively, an adhesive disclosed in JP 2015-200836 can be used as the adhesive. The adhesive disclosed herein contains: a polyvalent vinyl ether compound; and a compound that has two or more hydroxy groups or carboxy groups that are capable of forming an acetal bond by reacting with a vinyl ether group of the polyvalent vinyl ether compound, the compound capable of polymerizing with the polyvalent vinyl ether compound, and the softening temperature of the resulting polymer is relatively high at approximately 130 to 250° C., and therefore, a high softening temperature can be exhibited after curing.

As the temporary adhesive for forming such a temporary adhesive layer 13, a temporary adhesive exemplified as a temporary adhesive for forming the temporary adhesive layer 2 in the first aspect of the present invention is preferably used. That is, the temporary adhesive for forming the temporary adhesive layer 13 preferably contains at least: the polyvalent vinyl ether compound (A) described above; the compound (B) having two or more hydroxy groups or carboxy groups that are capable of forming an acetal bond by reacting with a vinyl ether group of the polyvalent vinyl ether compound (A), the compound (B) capable of forming a polymer with the polyvalent vinyl ether compound (A), and the thermoplastic resin (C). The thickness of the temporary adhesive layer 13 as described above is from 1 to 20 µm, for example.

Such reinforced wafer 11R thus configured can be produced, for example, through the following steps. First, as illustrated in FIG. 16(a), the temporary adhesive layer 13 is formed on the supporting substrate 12. Specifically, the temporary adhesive layer 13 can be formed by coating an adhesive composition for forming the temporary adhesive layer 13 onto the supporting substrate 12 by, for example, spin coating to form a temporary adhesive composition layer, and then drying and solidifying this composition layer through heating. The heating temperature in the heating is, for example, from 100 to 300° C., and the heating time is, for example, from 30 seconds to 30 minutes. Next, as illustrated in FIGS. 16(b) and 16(c), the supporting substrate 12 and the wafer 11 are bonded through the temporary adhesive layer 13. As described above, the wafer 11 includes the element forming surface 11a and the back surface 11b opposite from the element forming surface 11a. In the present step, for example, the supporting substrate 12 and the wafer 11 are affixed through the temporary adhesive layer 13 under pressure, after which the supporting substrate 12 and the wafer 11 are adhered by the temporary adhesive layer 13 through heating. In the affixing, the pressure is, for example, from 300 to 5000 g/cm², and the temperature is, for example, from 30 to 200° C. In addition, in the adhesion with the temporary adhesive layer 13, the heating temperature is, for example, from 100 to 300° C., and the heating time is, for example, from 30 seconds to 30 minutes. As described above, the reinforced wafer 11R having a laminated structure including the wafer 11, the supporting substrate 12, and the temporary adhesive layer 13 between the wafer 11 and the supporting substrate 12 can be fabricated.

In the present method of manufacturing a semiconductor device, as illustrated in FIG. 16(b) next, the wafer 11 of each reinforced wafer 11R is thinned (thinning step). Specifically, with the wafer 11 in a state of being supported by the supporting substrate 12, the wafer 11 is thinned to a predetermined thickness by grinding the wafer 11 from the back surface 11b side using a grinder. The thickness of the wafer 11 after thinning is, for example, from 1 to 20 µm.

Next, the back surface 11b sides of wafers 11 of two reinforced wafers 11R that have undergone the thinning step are bonded (bonding step). For example, as illustrated in FIG. 17(a), an adhesive layer 14 is formed on the back surface 11b of the wafer 11 of one of the two reinforced wafers 11R subjected to the thinning step, the two back surfaces 11b sides are affixed through the adhesive layer 14, and the adhesive layer 14 is cured to thereby bond the two reinforced wafers 11R as illustrated in FIG. 17(b). As a result, a wafer double-layer body 1X is formed with two supporting substrates 12. The number of wafer double-layer bodies 1X to be formed is two or more and is determined according to the number of lamination layers of semiconductor elements in the semiconductor device to be manufactured. In addition, the thickness of the adhesive layer 14 in the wafer double-layer body 1X is, for example, from 0.5 to 20 µm.

In such a bonding step, for example, an adhesive may be coated onto both of the two back surfaces 11b to be bonded to thereby form adhesive layers 14, and the back surface 11b sides may then be affixed through the adhesive layers 14, and the adhesive layers 14 may be cured after this affixing. Furthermore, from the perspective of improving tight adherence with the adhesive layer 14, in this step, prior to the formation of the adhesive layer 14, a silane coupling agent may be coated in advance onto one or both of the two back surfaces 11b to be bonded (silane coupling agent treatment).

The adhesive layer 14 is used to realize a bonding state between the wafers 11 and is formed from a thermosetting adhesive. Examples of a tacky adhesive main component for forming the thermosetting adhesive include polyorganosilsesquioxane, benzocyclobutene (BCB) resin, and novolac-based epoxy resin. From the perspective of achieving excellent heat resistance and cracking resistance that can withstand the temperature environment of the present method that includes various heating conditions and temperature fluctuations, the tacky adhesive main component in the adhesive layer 14 is preferably a polyorganosilsesquioxane-containing thermosetting adhesive. As the polyorganosilsesquioxane-containing thermosetting adhesive, the adhesives described in WO 2015/087686 and WO 2016/204114 can be adopted.

The composition for forming the adhesive layer 14 preferably includes the abovementioned polyorganosilsesquioxane-containing thermosetting adhesive and more preferably includes, as a thermosetting resin, a polymerizable group-containing polyorganosilsesquioxane (that is, a polyorganosilsesquioxane having a polymerizable functional group). The polymerizable functional group contained in the polymerizable group-containing polyorganosilsesquioxane is preferably an epoxy group or a (meth)acryloyloxy group. The polymerizable group-containing polyorganosilsesquioxane is suitable for achieving high heat resistance in the adhesive layer 14 that is formed, as well as for achieving a lower curing temperature for forming the adhesive layer 14 and thus suppressing damage to the elements in the wafer 11 as an adherend. If the composition for forming the adhesive layer 14 contains the polymerizable group-containing polyorganosilsesquioxane, the content ratio of the polymerizable group-containing polyorganosilsesquioxane in the composition is, for example, not less than 70 mass %, preferably from 80 to 99.8 mass %, and more preferably from 90 to 99.5 mass %.

If a polymerizable group-containing polyorganosilsesquioxane is contained in the composition for forming the adhesive layer 14, the one described as the polymerizable group-containing polyorganosilsesquioxane included in the adhesive 4 in the first aspect of the present invention can be used as the polymerizable group-containing polyorganosilsesquioxane.

The composition for forming the adhesive layer 14 preferably contains at least one type of curing catalyst in addition to the above-described polymerizable group-containing polyorganosilsesquioxane.

Examples of the curing catalyst, when the composition for forming the adhesive layer 14 contains an epoxy group-containing polyorganosilsesquioxane, include thermal cationic polymerization initiators. Examples of the curing catalyst, when the composition for forming the adhesive layer 14 contains a (meth)acryloyloxy group-containing polyorganosilsesquioxane, include thermal radical polymerization initiators. The content of the curing catalyst in the composition for forming the adhesive layer 14 is preferably from 0.1 to 3.0 parts by mass per 100 parts by mass of the polymerizable group-containing polyorganosilsesquioxane.

As the thermal cationic polymerization initiator and the thermal radical polymerization initiator described above, the thermal cationic polymerization initiators and thermal radical polymerization initiators described as those contained in the adhesive 4 in the first aspect of the present invention can be used.

The composition for forming the adhesive layer 14 may contain one type or two or more types of additional curable compounds in addition to the polymerizable group-containing polyorganosilsesquioxane described above. Examples of the curable compound include epoxy compounds other than the polymerizable group-containing polyorganosilsesquioxane described above, (meth)acryloyloxy group-containing compounds, vinyl group-containing compounds, oxetane compounds, and vinyl ether compounds. As these compounds, compounds described as being contained in the adhesive 4 in the first aspect of the present invention can be used.

The composition for forming the adhesive layer 14 preferably contains a solvent to adjust the coating properties and the like thereof. Examples of the solvent include propylene glycol monomethyl ether acetate, methyl ethyl ketone, methyl isobutyl ketone, cyclohexanone, toluene, xylene, ethyl acetate, butyl acetate, 3-methoxybutyl acetate, methoxypropyl acetate, ethylene glycol monomethyl ether acetate, methanol, ethanol, isopropyl alcohol, 1-butanol, 1-methoxy-2-propanol, 3-methoxybutanol, ethoxyethanol, diisopropyl ether, ethylene glycol dimethyl ether, and tetrahydrofuran.

The composition for forming the adhesive layer 14 may further contain various types of additives, such as a silane coupling agent, an antifoaming agent, an antioxidant, an anti-blocking agent, a leveling agent, a surfactant, an extender, an anti-corrosive agent, an antistatic agent, and a plasticizer.

With regard to the heat resistance of the above-described thermosetting adhesive for forming the adhesive layer 14, the pyrolysis temperature of the adhesive thereof is preferably not lower than 200° C., more preferably not lower than 260° C., and even more preferably not lower than 300° C. The pyrolysis temperature is a temperature in a curve obtained by thermogravimetric analysis performed using a differential thermal-thermogravimetric simultaneous analyzer, that is, a curve representing temperature dependence of thermal gravity in a predetermined temperature range for a sample to be analyzed, the temperature indicated by a point of intersection of a tangent to a portion where there is no weight loss or the weight is gradually decreasing at a constant rate at the initial temperature increasing process and a tangent at an inflection point within a portion where a significant weight loss is occurring at the middle temperature increasing process subsequent to the initial temperature increasing process. As the differential thermal-thermogravimetric simultaneous analyzer, for example, "TG-DTA6300 (trade name)" available from Seiko Instruments Inc. can be used.

In the formation of the adhesive layer 14, for example, the composition for forming the adhesive layer 14 is coated through spin coating onto the back surface 11*b* of the wafer 11 to be bonded to thereby form an adhesive composition layer, and the composition layer is then dried and solidified through heating. The heating temperature in the heating is, for example, from 50 to 150° C., and the heating time is, for example, from 5 to 120 minutes.

In the above-described bonding step of the present semiconductor device manufacturing method, specifically, two reinforced wafers 11R are affixed under pressure through the adhesive layer 14, after which the adhesive layer 14 is cured by heating. In the affixing, the pressure is, for example, from 300 to 5000 g/cm², and the temperature is, for example, from 30 to 200° C. The heating temperature for curing the adhesive layer 14 is, for example, from 30 to 200° C., and the heating time is, for example, from 5 to 120 minutes. If the composition for forming the adhesive layer 14 contains an epoxy group-containing polyorganosilsesquioxane as a curable resin and a thermosetting agent, the affixing of the back surfaces 11*b* of the reinforced wafers 11R through the composition or adhesive is preferably implemented at a temperature of from room temperature to not higher than 80° C., and after the affixing, the adhesive is preferably cured at a temperature of from 50 to 190° C. Such a configuration is suitable for suppressing dimensional changes of the adhesive interposed between the wafers 11 when affixing, and also for achieving a lower curing temperature for forming the adhesive layer 14 and thus suppressing damage to the elements in the wafer 11 as an adherend.

Figure 18:
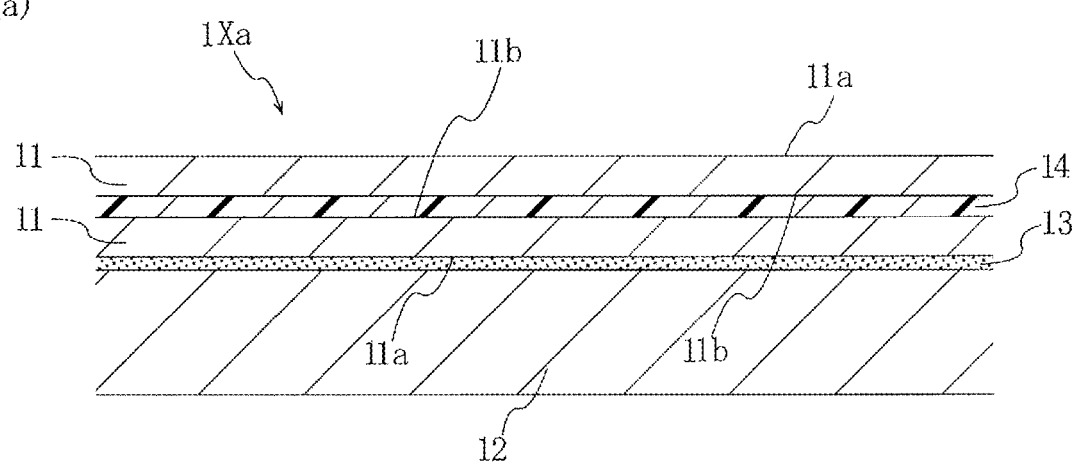
FIG. 18 illustrates some of the steps in the semiconductor device manufacturing method according to one embodiment of the second aspect of the present invention.
Figure 18:
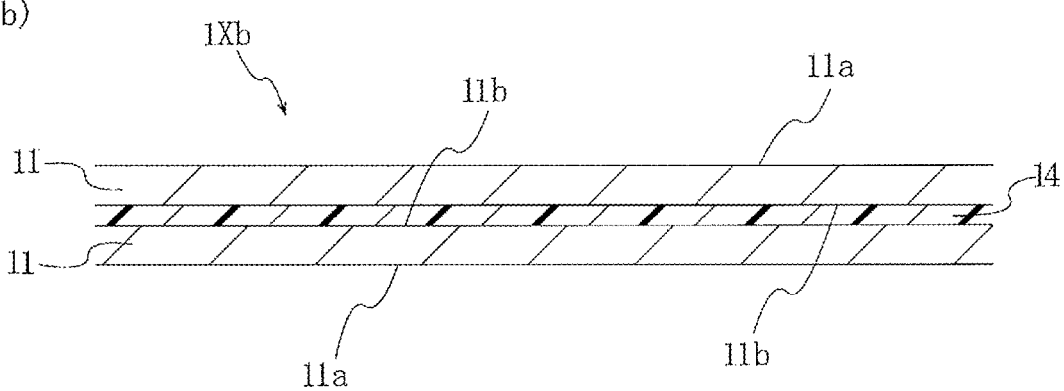

In the method for manufacturing a semiconductor device, as illustrated in FIG. 18(*a*) or 18(*b*), at least one support substrate 12 of each of the wafer double-layer bodies 1X is removed (removal step). Specifically, for each wafer double-layer body 1X, the temporary adhesion by the temporary adhesive layer 13 between the supporting substrate 12 to be removed and the wafer 11 is released, and the supporting substrate 12 is removed. FIG. 18(*a*) illustrates a wafer double-layer body 1Xa in which one supporting substrate 12 is removed from the wafer multi-laminate 1X. FIG. 18(*b*) illustrates a wafer double-layer body 1Xb in which both supporting substrates 12 are removed from the wafer multi-laminate 1X.

Each supporting substrate 12 can be removed through a mechanical peeling operation or a removal operation. An example of a technique for mechanical peeling is technique in which a workpiece in which the supporting substrate 12 and the wafer 11 are temporarily adhered through the temporary adhesive layer 13 is held in a chuck, and in that state, a blade is inserted into the temporary adhesive layer 13 while air is inserted therein. Alternatively, if the temporary adhesive layer 13 contains, as an adhesive component thereof, an aforementioned polymeric material that exhibits tackiness or adhesiveness in a predetermined temperature range, the polymeric material having a softening temperature in a high temperature range exceeding the predetermined temperature range thereof, for example, the temporary adhesive layer 13 may be heated at a predetermined high temperature to decrease the adhesive force and enable easy peeling, after which the supporting substrate 12 may be slid relative to the wafer 11, and the supporting substrate 12 may be separated or removed. These techniques for the removal of the supporting substrate 12 can similarly be employed in the removal step described below. If the wafer 11 in the reinforced wafer 11R described above is not configured with a wiring structure that includes an insulating film or a wiring pattern on the element forming surface 11a side thereof, a wiring structure is formed on the element forming surface 11a of the wafer 11 after the removal step. The same applies after the removal step described below.

Next, as illustrated in FIG. 18 (a), for example, a wafer multi-laminate 1Y is formed (multilayering step) from a predetermined quantity of wafer double-layer bodies 1X that have been subjected to the removal step. FIG. 18(a) illustrates an example in which the wafer multi-laminate 1Y is formed from two wafer double-layer bodies 1Xa obtained through the removal step illustrated in FIG. 18(a).

In the multilayering step of the present semiconductor device manufacturing method, the element forming surface 11a sides of the wafers 11 exposed through the removal step in the wafer double-layer bodies 1X are bonded together. For example, the adhesive layer 14 is formed on the element forming surface 11a of one of the wafers 11 of two wafer double-layer bodies 1X that have been subjected to the removal step, the two element forming surfaces 11a sides are affixed through the adhesive layer 14, and the adhesive layer 14 is cured to bond the two wafer double-layer bodies 1X. From the perspective of improving tight adherence with the adhesive layer 14, in this step, prior to the formation of the adhesive layer 14, a silane coupling agent may be coated in advance onto one or both of the two element forming surfaces 11a, which are the surfaces to be bonded (silane coupling agent treatment). Furthermore, the number of wafer laminations of the wafer multi-laminate 1Y formed in this step is 4 or greater and is determined according to the number of lamination layers of semiconductor elements in the semiconductor device to be manufactured. For example, with respect to two wafer double-layer bodies 1Xa obtained through the removal step and one wafer double-layer body 1Xb obtained through the removal step, the element forming surfaces 11a of the wafers 11 exposed through these removal steps are bonded through the adhesive layer 14, and thereby the wafer multi-laminate 1Y (having the number of wafer laminations of six) illustrated in FIG. 19(b) can also be formed.

The adhesive layer 14 used in the formation of the wafer multi-laminate 1Y is used to achieve a bonding state between the wafers 11 and is formed from by a thermosetting adhesive. The configuration of the adhesive layer 14, and the bonding technique and the conditions for bonding between the wafers 11 through the adhesive layer 14 are the same as those described above with respect to the adhesive layer 14 used to form the wafer double-layer body 1X.

In the present semiconductor device manufacturing method, as illustrated in FIG. 20(a) next, the supporting substrate 12 located at one end in the lamination direction of the wafer multi-laminate 1Y that has been subjected to the above-described multilayer step is removed (a removal step after the multilayering step). This configuration in which the temporary adhesion between the predetermined wafers 11 after the multilayering step is released and the supporting substrate 12 is removed is preferable from the perspective of handling of the wafer 11 that is thin due to being subjected to the thinning step described above.

Next, as illustrated in FIG. 20(b), through electrodes 15 are formed (through electrode forming step). The through electrodes 15 are used to electrically connect semiconductor elements formed in the different wafers 11 in the wafer multi-laminate 1Y. The through electrodes 15 can be formed, for example, by forming openings that pass through all of the wafers 11 and adhesive layers 14; forming insulating films (not illustrated) on inner wall surfaces of the openings; forming barrier layers (not illustrated) on the insulating film surfaces; forming seed layers (not illustrated) for electroplating on the barrier layer surfaces; and filling the openings with a conductive material, such as copper, by an electroplating method. In addition, a technique described, for example, in JP 2016-004835 A may be employed to form the through electrodes 15. Specifically, wiring structures (not illustrated) formed on the element forming surface 11a sides of each wafer 11 are mutually connected through the formed through electrodes 15. After the through electrodes 15 are formed, in the present embodiment, as illustrated in FIG. 20(c), the other supporting substrate 12 is removed from the wafer multi-laminate 1Y (removal step after the through electrode forming step).

As described above, the semiconductor device having a three-dimensional structure in which semiconductor elements are integrated in their thickness direction can be manufactured. This semiconductor device may be divided into individual pieces by dicing.

With the present semiconductor device manufacturing method, further wafer lamination can be implemented after the aforementioned removal step following the multilayering step. Specifically, the further lamination is implemented as follows.

Figure 21:
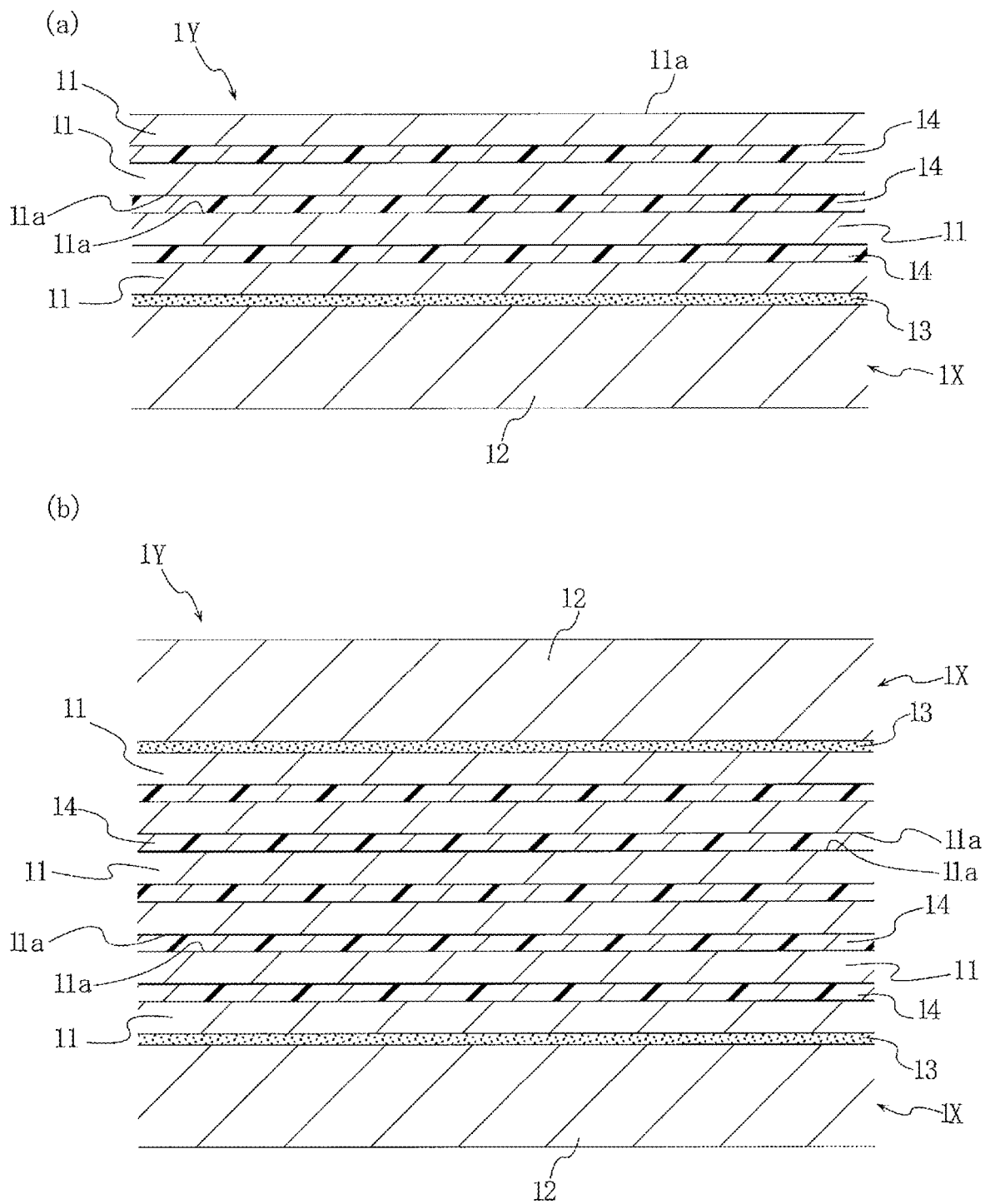
FIG. 21 illustrates some of the steps in the semiconductor device manufacturing method according to one embodiment of the second aspect of the present invention.

First, as illustrated in FIG. 21(a), the supporting substrate 12 located at one end in the lamination direction of the wafer multi-laminate 1Y that has been subjected to the above-described multilayering step is removed (a removal step after the multilayering step).

Next, as illustrated in FIG. 21(b), the element forming surface 11a side of the wafer 11 of a separately prepared wafer double-layer body 1X, the element forming surface side being exposed through the removal step, is bonded to the exposed element forming surface 11a side of the wafer 11 located at the one end in the lamination direction of the wafer multi-laminate 1Y (additional multilayering step). FIG. 21(b) illustrates an example of a case in which the wafer double-layer body 1Xa obtained through the removal step illustrated in FIG. 18(a) is subjected to an additional multilayering step. In each bond between the element forming surfaces 11a in such an additional multilayering step, for example, the adhesive layer 14 is formed on the two element forming surfaces 11a, which are the surfaces to be bonded, the two element forming surface 11a sides are affixed through the adhesive layer 14, and the adhesive layer 14 is cured to bond the two element forming surfaces 11a. From the perspective of improving tight adherence with the adhesive layer 14, in this step, prior to the formation of the adhesive layer 14, a silane coupling agent may be coated in advance onto one or both of the two element forming surfaces 11a, which are the surfaces to be bonded (silane coupling agent treatment).

Figure 22:
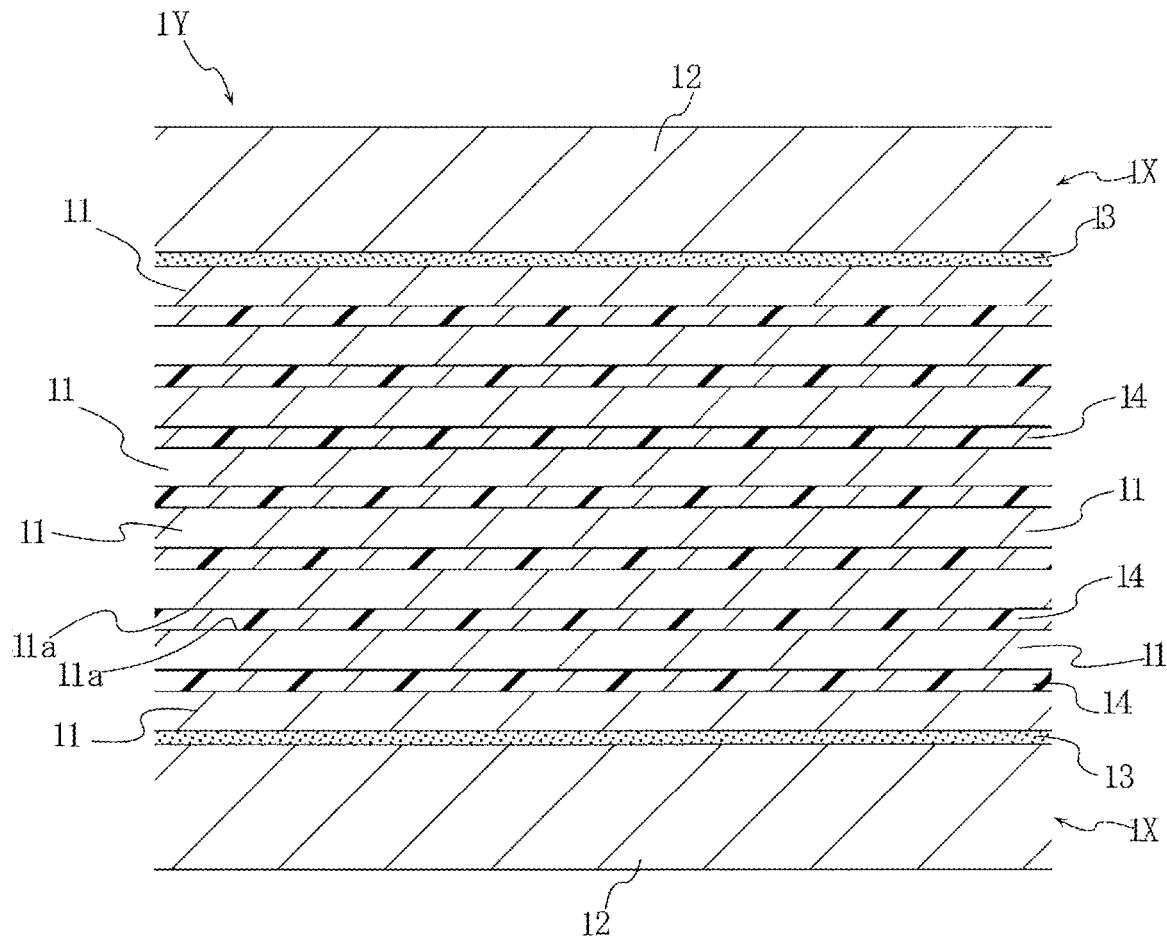
FIG. 22 illustrates some of the steps in the semiconductor device manufacturing method according to one embodiment of the second aspect of the present invention.

In the present semiconductor device manufacturing method, a series of processes including the removal step described above with reference to FIG. 21(a) and the additional multilayering step described above with reference to FIG. 21(b) can be implemented a predetermined number of times according to the number of lamination layers of semiconductor elements in the semiconductor device to be manufactured. FIG. 22 illustrates, as an example, the wafer multi-laminate 1Y obtained by implementing this series of processes two times.

Figure 23:
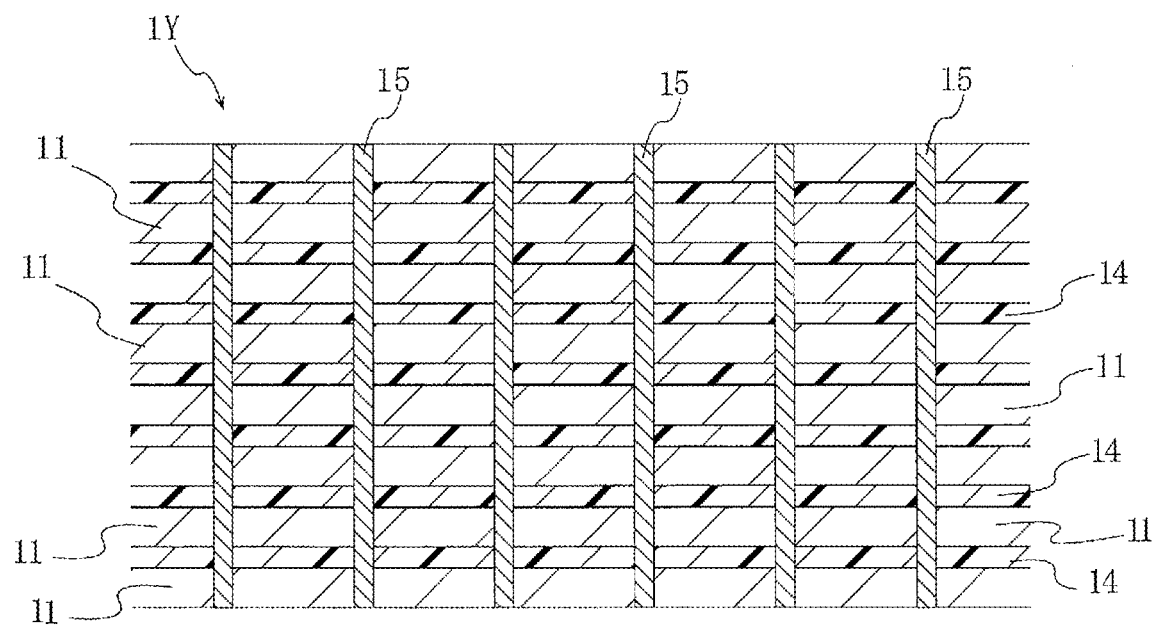
FIG. 23 illustrates some of the steps in the semiconductor device manufacturing method according to one embodiment of the second aspect of the present invention.

Subsequently, as illustrated in FIG. 23, a step (a removal step after the last additional multilayering step) of removing the supporting substrate 12 located at one end in the lamination direction of the wafer multi-laminate 1Y that has been subjected to the last additional multilayering step; a step of forming the through electrodes 15 in the wafer multi-laminate 1Y; and a step (removal step after the through electrode forming step) of removing the other supporting substrate 12 from the wafer multi-laminate 1Y are implemented. Specifically, the technique for forming the through electrodes 15 is the same as that described above with reference to FIG. 23(b).

As described above, the semiconductor device having a three-dimensional structure in which semiconductor elements are further layered in the thickness direction thereof can be manufactured. This semiconductor device may be divided into individual pieces by dicing.

Each of the above-described bonds between the wafers 11 in the present semiconductor device manufacturing method, that is, each of the bonds between the element forming surface 11a sides of the wafers 11, and the bonds between the back surface 11b sides may be obtained through direct bonding instead of adhesive bonding. Direct bonding refers to a bonding technique in which a resin-based adhesive material is not used. Examples of such direct bonding include normal temperature bonding, direct bonding through an oxide film provided on a wafer surface such as an element forming surface, and inter-electrode direct bonding for a case in which an exposed electrode is provided on the wafer surface (for example, Cu—Cu bonding between Cu electrode pads).

In the bonding step described above with reference to FIGS. 17(a) and 17(b), the back surface 11b sides of wafers 1 in two reinforced wafers 11R that have been subjected to the thinning step are bonded together (back-to-back bonding) to form the wafer double-layer body 1X. In other words, the wafer double-layer body 1X formed in the bonding step has a laminated configuration in which the back surface 11b sides of the wafers 11 are bonded together and is thereby symmetrical in the thickness direction thereof. The wafer double-layer body 1X (wafer laminate) having a symmetrical laminated configuration in the thickness direction is less prone to warping.

In addition, in the multilayering step described above with reference to FIGS. 19(a) and 19(b), the wafer multi-laminate 1Y in which four or more wafers are laminated is formed by bonding the element forming surface 11a sides of the wafers 11 of a desired quantity of two or more wafer double-layer bodies 1X, the wafers 11 thereof being exposed through the removal step. The wafer multi-laminate 1Y that is formed has a laminated configuration that is symmetrical in the thickness direction by bonding together the element forming surface 11a sides exposed in the wafer double-layer bodies 1X. The wafer multi-laminate 1Y illustrated in FIG. 19(a) includes two supporting substrates 12 and four thin wafers 11 interposed therebetween and has a symmetrical laminated configuration in the thickness direction in which one face-to-face bonding site is positioned between two back-to-back bonding sites in the laminate thickness direction. Furthermore, the wafer multi-laminate 1Y illustrated in FIG. 19(b) includes two supporting substrates 12 and six thin wafers 11 interposed therebetween and has a symmetrical laminated configuration in the thickness direction in which three back-to-back bonding sites and two face-to-face bonding sites are symmetrically positioned in the laminate thickness direction. The wafer multi-laminate 1Y (wafer laminate) having a symmetrical laminated configuration in the thickness direction is less prone to warping.

Accordingly, the present semiconductor device manufacturing method is suitable for manufacturing a semiconductor device while suppressing warping in the wafer laminate.

In addition, with the present semiconductor device manufacturing method, as described above with reference to FIG. 15(b), a thinning step is implemented in which the wafer 11 to be laminated is thinned by grinding the back surface 11b side of the wafer 11. In order to properly implement this thinning, specifically, as described above, the wafer 11 is subjected to a thinning step in a state of being bonded to a supporting substrate 12 through a temporary adhesive layer 13 in order to avoid damage to the wafer 11 during thinning. Furthermore, in the bonding step described above with reference to FIGS. 17(a) and 17(b), the back surface 11b sides of thin wafers 11 in two reinforced wafers 11R that have been subjected to this type of thinning step are bonded together to form the wafer double-layer body 1X. The present semiconductor device manufacturing method configured in this manner is suitable for multilayering thin wafers 11.

As described above, the present semiconductor device manufacturing method is suitable for multilayering thin wafers while suppressing warping of the wafer laminate.

In the present semiconductor device manufacturing method, as described above, the through electrode 15 is formed extending through the inside of the wafer multi-laminate 1Y from the element forming surface 11a of the wafer 11 located at one end in the lamination direction of the wafer laminate 1Y to the element forming surface 11a of the wafer 11 located at the other end. Such through electrodes 5 can appropriately electrically connect the semiconductor elements at short distances in a semiconductor device to be manufactured. Thus, with respect to a semiconductor device that is to be manufactured, the formation of the through electrodes 15 is suitable for realizing excellent and efficient digital signal processing, for suppressing attenuation of high-frequency signals, and also for suppressing power consumption.

Figure 17:
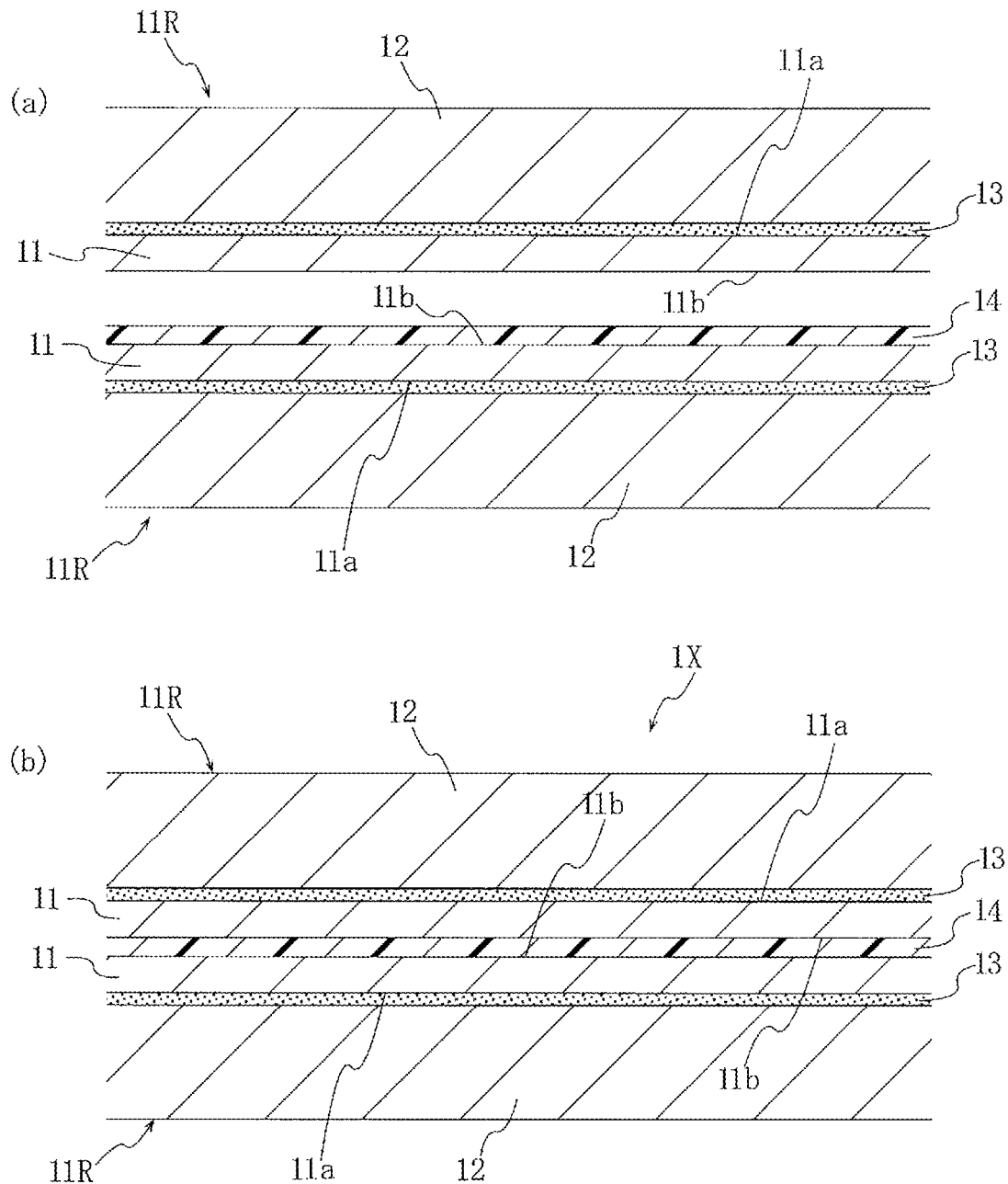
FIG. 17 illustrates some of the steps in the semiconductor device manufacturing method according to one embodiment of the second aspect of the present invention.
Figure 19:
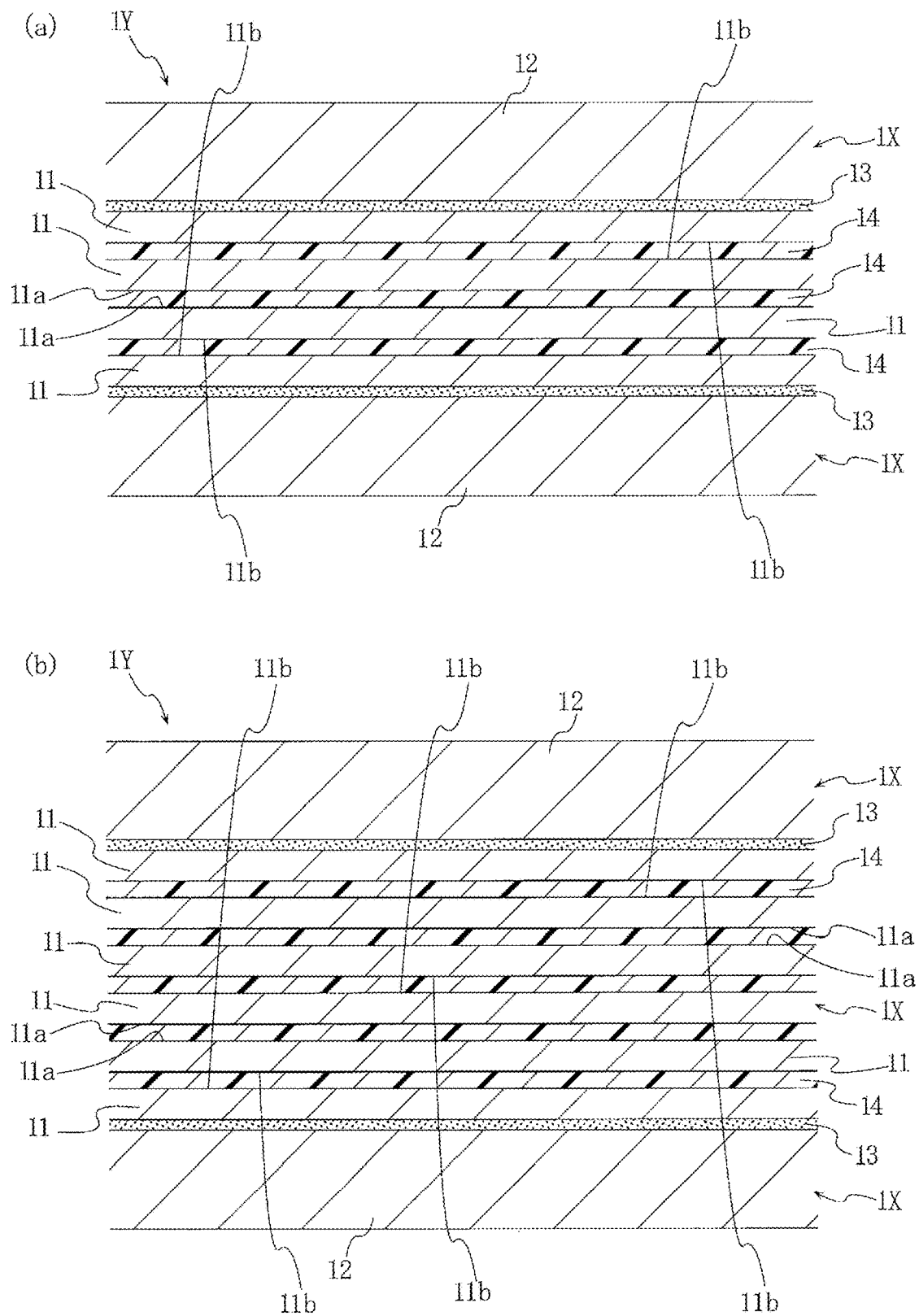
FIG. 19 illustrates some of the steps in the semiconductor device manufacturing method according to one embodiment of the second aspect of the present invention.
Figure 20:
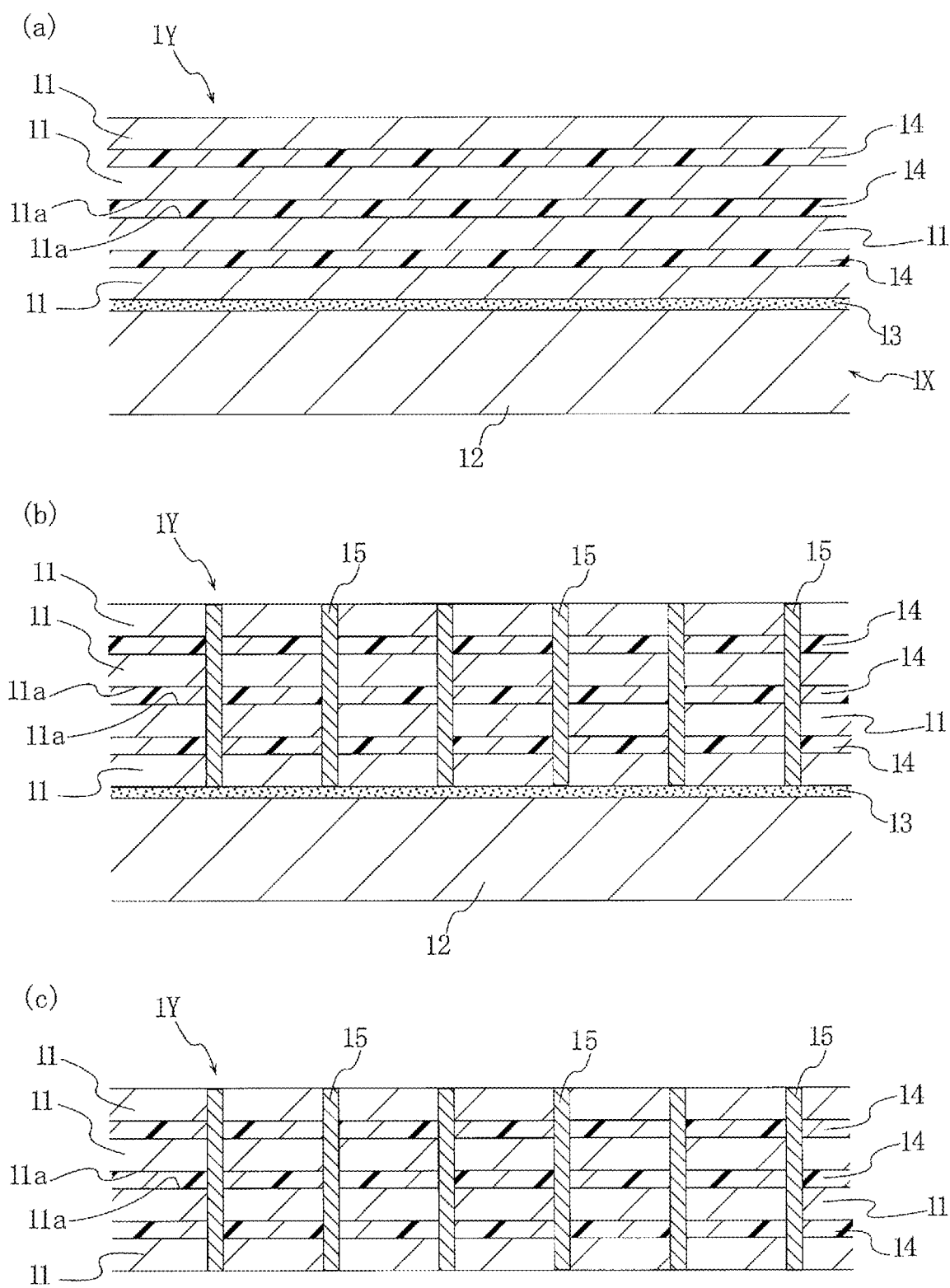
FIG. 20 illustrates some of the steps in the semiconductor device manufacturing method according to one embodiment of the second aspect of the present invention.

In comparison to direct bonding, the adhesive bonding implemented in the above-described bonding step as illustrated for example in FIG. 17; and the adhesive bonding implemented in the above-described multilayering step as illustrated for example in FIG. 19 are preferable from the perspective of the flatness required in the bonding surfaces of the wafers 11 being low. In direct bonding, a high level of flatness on in the order of nanoscale, for example, is required on the wafer bonding surface. In contrast, with adhesive bonding, the adhesive layer that is formed exhibits a function of substantially absorbing, reducing and eliminating inclining and deviation of the wafer bonding surface from an ideal plane, and thus the requirement for flatness of the wafer bonding surface is alleviated compared to direct bonding. Such a configuration is preferable from the perspective of the ease of manufacturing a semiconductor device produced through multilayering of thin wafers 11 and also from the perspective of improving the manufacturing yield of semiconductor devices.

Thus, in the above-described bonding step illustrated for example in FIG. 17 and in the above-described multilayering step illustrated for example in FIG. 19, the adhesive bonding between wafers 11, in which an adhesive containing a polymerizable group-containing polyorganosilsesquioxane is used, is suitable, as described above, for achieving high heat resistance in the adhesive layer 14 that is formed, and also for reducing the curing temperature for forming the adhesive layer 14 and thus suppressing damage to the elements in the wafer as an adherend.

EXAMPLES

Production of Adhesive

An adhesive was obtained by mixing 100 parts by mass of an epoxy group-containing polyorganosilsesquioxane obtained as described below, 115 parts by mass of propylene glycol monomethyl ether acetate, 0.45 parts by mass (as a solid content) of an antimony sulfonium salt ("SI-150L (trade name)" available from Sanshin Chemical Industry Co., Ltd.), and 0.05 parts by mass of (4-hydroxyphenyl) dimethylsulfonium methyl sulfite ("SAN-AID SI Auxiliary Agent (trade name)" available from Sanshin Chemical Industry Co., Ltd.).

Synthesis of Epoxy Group-Containing Polyorganosilsesquioxane

In a 300 mL flask equipped with a reflux condenser, a nitrogen gas inlet tube, a stirrer, and a thermometer, while nitrogen gas was introduced, 161.5 mmol (39.79 g) of 2-(3,4-epoxycyclohexyl)ethyltrimethoxysilane, 9 mmol (1.69 g) of phenyltrimethoxysilane, and 165.9 g of acetone as a solvent were mixed, and the temperature was raised to 50° C. Then, to the mixture, 4.7 g of a 5% potassium carbonate aqueous solution (1.7 mmol as potassium carbonate) was added dropwise over 5 minutes, and then 1700 mmol (30.6 g) of water was added dropwise over 20 minutes. No significant temperature rise occurred in the mixture during the drop-wise addition procedure. After the drop-wise addition procedure, a polycondensation reaction was performed at 50° C. for 4 hours while nitrogen gas was introduced into the flask. A product in the reaction solution after the polycondensation reaction, when analyzed, had a number average molecular weight of 1900 and a molecular weight dispersity of 1.5. In addition, the reaction solution allowed to stand to cool was repeatedly washed with water until a lower layer solution (aqueous phase) generated by a phase separation became neutral, then an upper layer solution was collected. The solvent was distilled off from the upper layer solution under conditions of 1 mmHg and 40° C. until the amount of the solvent became 25 mass %, and a colorless transparent liquid product (epoxy group-containing polyorganosilsesquioxane) was obtained.

Production of a First Wafer Laminate

Two first wafer laminates were produced as follows.

First, a first silicon wafer and a reinforced second silicon wafer were prepared in the production of each first wafer laminate. The first silicon wafer had a diameter of 300 mm, a thickness of 775 μm, and one surface treated with a silane coupling agent. In the silane coupling agent treatment of the first silicon wafer, a silane coupling agent ("KBE403 (trade name)" available from Shin-Etsu Chemical Co., Ltd.) was coated on one surface of the first silicon wafer by spin coating, followed by heating at 120° C. for 5 minutes. The reinforced second silicon wafer was produced as follows.

First, a composition for forming a temporary adhesive layer was coated by spin coating on a silicon substrate (a diameter of 300 mm and a thickness of 775 μm) serving as a supporting substrate, and a temporary adhesive composition layer was formed. The composition layer was dried by heating at 200° C. for 2 minutes and then at 230° C. for 4 minutes, and the temporary adhesive layer was formed. The composition for forming a temporary adhesive layer was prepared by mixing 0.24 parts by mass of diethylene glycol divinyl ether, 5.4 parts by mass of a p-hydroxystyrene/styrene copolymer ("MARUKA LYNCUR CST-50 (trade name)", a molar ratio of p-hydroxystyrene and styrene of 50:50, a weight average molecular weight of 4400, and a softening point of 150° C., available from Maruzen Petrochemical Co., Ltd.), 1.8 parts by mass of a polyvinyl butyral resin ("S-LEC KS-1 (trade name)", a thermoplastic resin with a molecular weight of $2.7 \times 10^4$ and a softening point of 200° C., available from Sekisui Chemical Co., Ltd.), 1.8 parts by mass of polycaprolactone ("Placed H1P (trade name)", a thermoplastic resin with a weight average molecular weight of 10000 and a softening point of 100° C., available from Daicel Corporation), 0.18 parts by mass of trans-cinnamic acid (a pKa of 4.44, available from Wako Pure Chemical Industries, Ltd.) as a polymerization accelerator, 0.045 parts by mass of a fluorine oligomer ("F-554 (trade name)" available from DIC Corporation) as a surfactant, and 22 parts by mass of cyclohexane as a solvent. Then, the silicon substrate and the second silicon wafer (a diameter of 300 mm and a thickness of 775 μm) were bonded via the temporary adhesive layer. Specifically, the silicon substrate and the second silicon wafer were affixed via the temporary adhesive layer under pressure under conditions of a temperature of 150° C. and a pressure of 3000 g/cm², then the temporary adhesive layer was solidified by heating at 230° C. for 5 minutes, and the silicon substrate and the second silicon wafer were bonded via the temporary adhesive layer. Then, the second silicon wafer in a state of being supported by the silicon substrate was ground using a grinder (available from DISCO Corporation), and the second silicon wafer was thinned to a thickness of 10 μm. Then, a silane coupling agent ("KBE403 (trade name)" available from Shin-Etsu Chemical Co., Ltd.) was coated by spin coating on the surface (ground surface) of the thinned second silicon wafer, followed by heating at 120° C. for 5 minutes (silane coupling agent treatment). The reinforced second silicon wafer described above was thus produced.

In the production of the first wafer laminate, next, the adhesive containing the epoxy group-containing polyorganosilsesquioxane was coated by spin coating onto the silane coupling agent-treated surface (first surface) of the first silicon wafer, and an adhesive coating was formed. Then, the first silicon wafer having this adhesive coating was heated at 80° C. for 4 minutes and then heated at 100° C. for 2 minutes. Through this, the adhesive on the first surface of the first silicon wafer was dried, and an adhesive layer with a thickness of 2.5 μm was formed. Then, the first silicon wafer having the adhesive layer and the thinned second silicon wafer in the reinforced second silicon wafer described above were affixed via the adhesive layer on the first silicon wafer under pressure, followed by heating at 150° C. for 30 minutes and then heating at 170° C. for 30 minutes to cure the adhesive layer, and both silicon wafers were bonded to each other. The affixing was performed under conditions of a temperature of 50° C. and a pressure of 3000 g/cm².

Then, in the reinforced second silicon wafer having undergone the adhesive bonding with the first silicon wafer, the temporary adhesion by the temporary adhesive layer between the silicon substrate serving as a supporting substrate and the thinned second silicon wafer was released, and the silicon substrate was removed from the thinned second silicon wafer. Specifically, after a heat treatment at 230° C. for 5 minutes, the silicon substrate was slid at a relative speed of 1 mm/sec with respect to the thinned second silicon wafer, and the silicon substrate was removed (removal step) from the thinned second silicon wafer or the wafer laminate including the thinned second silicon wafer. Subsequently, the temporary adhesive residue on the thinned second silicon wafer was removed by washing using propylene glycol monomethyl ether. As described above, the first wafer laminate of the present example was produced using the above-described adhesive containing the polymerizable group-containing polyorganosilsesquioxane and the temporary adhesive.

Production of a Second Wafer Laminate

A second wafer laminate was produced in the following manner by adhesive bonding two first wafer laminates.

In the production of the second wafer laminate, the surface of the thinned second silicon wafer side (the surface exposed by being subjected to the removal step described above) of each of the first wafer laminates produced as described above was treated with a silane coupling agent. In the silane coupling agent treatment, a silane coupling agent (trade name "KBE403" available from Shin-Etsu Chemical Co., Ltd.) was applied by spin coating onto a surface of the thinned second silicon wafer and was then heated at 120° C. for 5 minutes.

Next, the adhesive containing the epoxy group-containing polyorganosilsesquioxane was coated by spin coating onto the silane coupling agent-treated surface (second surface) of the thinned second silicon wafer of one first wafer laminate to form an adhesive coating, after which the first wafer laminate having this adhesive coating was heated at 80° C. for 4 minutes and then heated at 100° C. for 2 minutes. Through this, the adhesive on the second surface of the first wafer laminate was dried, and an adhesive layer with a thickness of 2.5 μm was formed.

Next, the multilayering step was implemented. Specifically, the first wafer laminate with the adhesive layer and the silane coupling agent-treated surface of the other first wafer laminate were affixed under pressure through the adhesive layer, and then heated for 30 minutes at 150° C., and further heated for 30 minutes at 170° C., and as a result, the adhesive layer was cured, and the two first wafer laminates were bonded (face-to-face bonding). The affixing was performed under conditions of a temperature of 50° C. and a pressure of 3000 g/cm². A second wafer laminate of the present example was produced as described above.

Measuring the Amount of Warpage

Regarding the above-described second wafer laminate produced through the multilayering step, the amount of warpage (SORI) stipulated by the SEMI standard (specifically, SEMI MF1451-0707) was measured using a shape measuring device (trade name "LTV-3000", available from Kobelco Research Institute, Inc.) and was found to be 11 μm. In this measurement, a least squares reference plane was calculated from the surface shape data of the measured object obtained through corrections pertaining to self-weight deflection of the measured object, and the amount of warpage corresponded to a difference between a maximum value and a minimum value of a deviation of the surface shape data from the least squares reference plane. Meanwhile, the amount of warpage was similarly measured for the above-described first wafer laminate prior to the multilayering step, using the shape measuring device (trade name "LTV-3000", available from Kobelco Research Institute, Inc.) and was found to be 47 μm. Thus, in the second wafer laminate having a symmetrical laminated configuration in the thickness direction, warpage was suppressed more than in the first wafer laminate.

Coating Thickness Measurement

The adhesive produced as described above was applied by spin coating onto a silicon substrate (diameter: 300 mm, thickness: 775 μm) to form an adhesive coating. The amount of adhesive used in one spin coating was 20 g, and the rotational speed in spin coating was 1200 rpm. In addition, the adhesive coating on the substrate was heated for 30 minutes at 150° C., and then heated for 30 minutes at 170° C., and thereby a cured coating was formed on the base material. The thickness of the formed coating was measured using a micro-shape measuring instrument (trade name "Surf Corder ET4000A", available from Kosaka Laboratory Ltd.) and was found to be 2.5 μm. The above-described wafer laminate according to the present example included this type of cured coating as an adhesive layer bonding the first and second silicon wafers.

To summarize the above, configurations and variations of the present invention are listed below as addenda.

[Addendum 1]

A semiconductor device manufacturing method including:
    a preparation step of preparing a reinforced wafer having a laminated structure that includes a wafer including an element forming surface and a back surface opposite therefrom, a supporting substrate, and a temporary adhesive layer for forming temporary adhesion, the temporary adhesive layer being provided between the supporting substrate and the element forming surface side of the wafer;
    a thinning step in which the wafer of the reinforced wafer is ground from the back surface side to form a thinned wafer;
    a bonding step in which a surface of the reinforced wafer and a surface of another wafer including an element forming surface and a back surface opposite therefrom are bonded, and thereby a wafer laminate is formed;
    a removal step of removing the supporting substrate of the wafer laminate; and
    a multilayering step in which a surface of the wafer laminate that has been subjected to the removal step is bonded to a surface of another wafer laminate to form a wafer laminate; wherein
    the wafer laminate obtained through the multilayering step has a laminated configuration that is symmetric in the thickness direction thereof.

[Addendum 2]

The semiconductor device manufacturing method according to addendum 1, the method including:
    a preparation step of preparing two reinforced wafers each having a laminated structure that includes a wafer including an element forming surface and a back surface opposite therefrom, a supporting substrate, and a temporary adhesive layer for forming temporary adhesion, the temporary adhesive layer being provided between the supporting substrate and the element forming surface of the wafer;
    a thinning step of grinding the wafer of the reinforced wafer from the back surface side to form a thinned wafer;
    a bonding step that is implemented with each of the reinforced wafers, and in which an element forming surface side of a base wafer including the element forming surface and a back surface opposite therefrom is bonded, through an adhesive, to the back surface side of the thinned wafer of the reinforced wafer to form a first wafer laminate;
    a removal step of removing the supporting substrate of each first wafer laminate; and
    a multilayering step in which the element forming surface sides of the thinned wafers or the back surface sides of the base wafers of two of the first wafer laminates that have been subjected to the removal step are bonded through an adhesive, and a second wafer laminate is formed.

[Addendum 3]

The semiconductor device manufacturing method according to addendum 2, wherein a thickness of the wafer is not greater than 1000 µm, not greater than 900 µm, or not greater than 800 µm, and is not less than 500 µm.

[Addendum 4]

The semiconductor device manufacturing method according to addendum 2 or 3, wherein the supporting substrate is a silicon wafer or a glass wafer, and a thickness thereof is not less than 300 µm, not less than 500 µm, or not less than 700 µm, and not greater than 800 µm.

[Addendum 5]

The semiconductor device manufacturing method according to any one of addenda 2 to 4, the method further including prior to the multilayering step:
- a preparation step of preparing at least one additional reinforced wafer having a laminated structure that includes a wafer including an element forming surface and a back surface opposite therefrom, a supporting substrate, and a temporary adhesive layer for forming temporary adhesion, the temporary adhesive layer being provided between the supporting substrate and the element forming surface side of the wafer;
- a step of forming a thinned wafer by grinding the wafer in each of the additional reinforced wafers from the back surface side of the wafer;
- at least one additional bonding step in which the back surface side of the thinned wafer in the additional reinforced wafer is bonded through an adhesive to the element forming surface side of the thinned wafer of the first wafer laminate; and
- a removal step of removing the supporting substrate of the first wafer laminate that has been subjected to the additional bonding step.

[Addendum 6]

The semiconductor device manufacturing method according to any one of addenda 2 to 5, further including forming a through electrode extending through the plurality of thinned wafers and at least one base wafer in the second wafer laminate.

[Addendum 7]

The semiconductor device manufacturing method according to any one of addenda 2 to 5, further including, prior to the multilayering step, forming in each first wafer laminate, a through electrode extending through the inside of a first wafer laminate from an element forming surface of a thinned wafer located at one end of the first wafer laminate in a lamination direction to an element forming surface of a base wafer located at another end thereof.

[Addendum 8]

The semiconductor device manufacturing method according to any one of addenda 2 to 7, the method further including thinning the base wafer by grinding the back surface side of the base wafer.

[Addendum 9]

The semiconductor device manufacturing method according to any one of addenda 2 to 8, wherein the adhesive contains a polymerizable group-containing polyorganosilsesquioxane.

[Addendum 10]

The semiconductor device manufacturing method according to addendum 9, wherein the polymerizable-group containing polyorganosilsesquioxane is an epoxy group-containing polyorganosilsesquioxane.

[Addendum 11]

The semiconductor device manufacturing method according to any one of addenda 2 to 10, wherein a temporary adhesive for forming the temporary adhesive layer includes: a polyvalent vinyl ether compound; a compound that has two or more hydroxy groups or carboxy groups that are capable of forming an acetal bond by reacting with a vinyl ether group of the polyvalent vinyl ether compound, the compound capable of forming a polymer with the polyvalent vinyl ether compound; and a thermoplastic resin.

[Addendum 12]

The semiconductor device manufacturing method according to addendum 11, wherein the polyvalent vinyl ether compound is at least one compound selected from the group consisting of 1,4-butanediol divinyl ether, diethylene glycol divinyl ether, and triethylene glycol divinyl ether.

[Addendum 13]

The semiconductor device manufacturing method according to addendum 11 or 12, wherein the compound that has two or more hydroxy groups or carboxy groups that are capable of forming an acetal bond by reacting with a vinyl ether group of the polyvalent vinyl ether compound, the compound capable of forming a polymer with the polyvalent vinyl ether compound, is a compound containing: a constituent unit represented by the abovementioned formula (b) (wherein, X denotes a hydroxy group or a carboxy group; the X's of the quantity of $n_2$ may be identical or different from each other; $n_2$ is an integer of 1 or greater; and $Z_2$ denotes a group obtained by removing a quantity of $(n_2+2)$ hydrogen atoms from a structural formula of a saturated or unsaturated aliphatic hydrocarbon, a saturated or unsaturated alicyclic hydrocarbon, an aromatic hydrocarbon, a heterocyclic compound, or a bonded body in which these are bonded through a single bond or a linking group); and a constituent unit derived from at least one type of polymerizable monomer selected from the group consisting of chain olefins, cyclic olefins, aromatic vinyl compounds, unsaturated carboxylic acid esters, vinyl carboxylic acid esters, and unsaturated dicarboxylic acid diesters.

[Addendum 14]

The semiconductor device manufacturing method according to addendum 11 or 12, wherein the compound that has two or more hydroxy groups or carboxy groups that are capable of forming an acetal bond by reacting with a vinyl ether group of the polyvalent vinyl ether compound, the compound capable of forming a polymer with the polyvalent vinyl ether compound, is a styrene-based polymer, a (meth) acrylic-based polymer, a polyvinyl alcohol, a novolac resin, or a resol resin.

[Addendum 15]

The semiconductor device manufacturing method according to addendum 11 or 12, wherein the compound that has two or more hydroxy groups or carboxy groups that are capable of forming an acetal bond by reacting with a vinyl ether group of the polyvalent vinyl ether compound, the compound capable of forming a polymer with the polyvalent vinyl ether compound, is a compound containing a compound having two or more of at least one type of constituent unit (repeating unit) selected from the group consisting of formulas (b-1) to (b-6) above.

[Addendum 16]

The semiconductor device manufacturing method according to any one of addenda 11 to 15, wherein the thermoplastic resin is at least one selected from the group consisting of polyvinyl acetal resins, polyester resins, polyurethane resins, and polyamide resins.

[Addendum 17]

The semiconductor device manufacturing method according to any one of addenda 11 to 16, wherein the bonding step includes curing treatment to cure the adhesive at a temperature lower than the softening point of the polymer, and the removal step includes softening treatment to soften the temporary adhesive layer at a temperature higher than the softening point of the polymer.

[Addendum 18]

The semiconductor device manufacturing method according to addendum 1, the method including:

a preparation step of preparing at least four reinforced wafers each having a laminated structure that includes a wafer including an element forming surface and a back surface opposite therefrom, a supporting substrate, and a temporary adhesive layer for forming temporary adhesion, the temporary adhesive layer being provided between the supporting substrate and the element forming surface side of the wafer;

a thinning step of grinding the back surface side of the wafer of each reinforced wafer to thin the wafer;

a bonding step of bonding the back surface sides of the wafers of two reinforced wafers that have been subjected to the thinning step, and forming at least two wafer double-layer bodies having the supporting substrate;

a removal step of removing at least one supporting substrate of each of the wafer double-layer bodies; and a multilayering step of bonding exposed element forming surface sides of the wafers of the at least two wafer double-layer bodies to form a wafer multi-laminate, the element forming surface sides thereof being exposed by being subjected to the removal step.

[Addendum 19]

The semiconductor device manufacturing method according to addendum 18, wherein a thickness of the wafer is not greater than 1000 μm, not greater than 900 μm, or not greater than 800 μm, and is not less than 500 μm.

[Addendum 20]

The semiconductor device manufacturing method according to addendum 18 or 19, wherein the supporting substrate is a silicon wafer or a glass wafer, and a thickness thereof is not less than 300 μm, not less than 500 μm, or not less than 700 μm, and not greater than 800 μm.

[Addendum 21]

The semiconductor device manufacturing method according to any one of addenda 18 to 20, further including a step of removing a supporting substrate located at one end in the lamination direction of the wafer multi-laminate.

[Addendum 22]

The semiconductor device manufacturing method according to any one of addenda 18 to 21, further including an additional multilayering step of bonding an element forming surface side of a wafer of the wafer double-layer body, the element forming surface side being exposed through the removal step, to an exposed element forming surface side of a wafer located at one end in the lamination direction of the wafer multi-laminate.

[Addendum 23]

The semiconductor device manufacturing method according to any one of addenda 18 to 22, further including a step of forming a through electrode extending through the inside of the wafer multi-laminate from an element forming surface of a wafer located at one end of the wafer multi-laminate in the lamination direction to an element forming surface of a wafer located at another end.

[Addendum 24]

The semiconductor device manufacturing method according to any one of addenda 18 to 23, wherein bonding of the back surface sides in the bonding step is implemented using an adhesive containing a polymerizable group-containing polyorganosilsesquioxane as a thermosetting resin.

[Addendum 25]

The semiconductor device manufacturing method according to addendum 24, wherein the polymerizable-group containing polyorganosilsesquioxane is an epoxy group-containing polyorganosilsesquioxane.

[Addendum 26]

The semiconductor device manufacturing method according to addendum 24 or 25, wherein, in the bonding step, the adhesive is applied to one or both of the two back surfaces that are to be bonded, the back surfaces are affixed through the adhesive, and the adhesive is cured after the affixing.

[Addendum 27]

The semiconductor device manufacturing method according to addendum 26, wherein in the bonding step, one or both of the back surfaces to be bonded are treated with a silane coupling agent prior to the application of the adhesive.

[Addendum 28]

The semiconductor device manufacturing method according to addendum 26 or 27, wherein in the bonding step, the affixing is performed at a temperature of from room temperature to 80° C., and after the affixing, the adhesive is cured at a temperature of from 30 to 200° C.

[Addendum 29]

The semiconductor device manufacturing method according to any one of addenda 18 to 28, wherein bonding of the element forming surface sides in the multilayering step is implemented using an adhesive containing a polymerizable group-containing polyorganosilsesquioxane as a thermosetting resin.

[Addendum 30]

The semiconductor device manufacturing method according to addendum 29, wherein the polymerizable-group containing polyorganosilsesquioxane is an epoxy group-containing polyorganosilsesquioxane.

[Addendum 31]

The semiconductor device manufacturing method according to addendum 29 or 30, wherein, in the multilayering step, the adhesive is applied to one or both of the two element forming surfaces that are to be bonded, the element forming surfaces are affixed through the adhesive, and the adhesive is cured after the affixing.

[Addendum 32]

The semiconductor device manufacturing method according to addendum 31, wherein in the multilayering step, one or both of the two element forming surfaces to be bonded are treated with a silane coupling agent prior to the application of the adhesive.

[Addendum 33]

The semiconductor device manufacturing method according to addendum 31 or 32, wherein in the multilayering step, the affixing is performed at a temperature of from room temperature to 80° C., and after the affixing, the adhesive is cured at a temperature of from 30 to 200° C.

[Addendum 34]

The semiconductor device manufacturing method according to any one of addenda 18 to 33, wherein a temporary adhesive for forming the temporary adhesive layer includes: a polyvalent vinyl ether compound; a compound that has two or more hydroxy groups or carboxy groups that are capable of forming an acetal bond by reacting with a vinyl ether group of the polyvalent vinyl ether compound, the compound capable of forming a polymer with the polyvalent vinyl ether compound; and a thermoplastic resin.

[Addendum 35]

The semiconductor device manufacturing method according to addendum 34, wherein the polyvalent vinyl ether compound is at least one compound selected from the group consisting of 1,4-butanediol divinyl ether, diethylene glycol divinyl ether, and triethylene glycol divinyl ether.

[Addendum 36]

The semiconductor device manufacturing method according to addendum 34 or 35, wherein the compound that has two or more hydroxy groups or carboxy groups that are capable of forming an acetal bond by reacting with a vinyl ether group of the polyvalent vinyl ether compound, the compound capable of forming a polymer with the polyvalent vinyl ether compound, is a compound containing: a constituent unit represented by the abovementioned formula (b) (wherein, X denotes a hydroxy group or a carboxy group; the X's of the quantity of $n_2$ may be identical or different from each other; $n_2$ is an integer of 1 or greater; and $Z_2$ denotes a denotes a group in which a quantity of $(n_2+2)$ hydrogen atoms is removed from a structural formula of a saturated or unsaturated aliphatic hydrocarbon, a saturated or unsaturated alicyclic hydrocarbon, an aromatic hydrocarbon, a heterocyclic compound, or a bonded body in which these are bonded through a single bond or a linking group); and a constituent unit derived from at least one type of polymerizable monomer selected from the group consisting of chain olefins, cyclic olefins, aromatic vinyl compounds, unsaturated carboxylic acid esters, vinyl carboxylic acid esters, and unsaturated dicarboxylic acid diesters.

[Addendum 37]

The semiconductor device manufacturing method according to addendum 34 or 35, wherein the compound that has two or more hydroxy groups or carboxy groups that are capable of forming an acetal bond by reacting with a vinyl ether group of the polyvalent vinyl ether compound, the compound capable of forming a polymer with the polyvalent vinyl ether compound, is a styrene-based polymer, a (meth) acrylic-based polymer, a polyvinyl alcohol, a novolac resin, or a resol resin.

[Addendum 38]

The semiconductor device manufacturing method according to addendum 34 or 35, wherein the compound that has two or more hydroxy groups or carboxy groups that are capable of forming an acetal bond by reacting with a vinyl ether group of the polyvalent vinyl ether compound, the compound capable of forming a polymer with the polyvalent vinyl ether compound, is a compound containing a compound having two or more of at least one type of constituent unit (repeating unit) selected from the group consisting of formulas (b-1) to (b-6) above.

[Addendum 39]

The semiconductor device manufacturing method according to any one of addenda 34 to 38, wherein the thermoplastic resin is at least one selected from the group consisting of polyvinyl acetal resins, polyester resins, polyurethane resins, and polyamide resins.

REFERENCE SIGNS LIST

X, Y Wafer laminate
S Supporting substrate
1 Wafer
1T Thinned wafer
1a, 3a Element forming surface
1b, 3b Back surface
1R Reinforced wafer
3 Wafer (base wafer)
2 Temporary adhesive layer
4 Adhesive
5 Through electrode
11R Reinforced wafer
11 Wafer
11a Element forming surface
11b Back surface
12 Supporting substrate
13 Temporary adhesive layer
14 Adhesive Layer
15 Through electrode
1X Wafer double-layer body
1Y Wafer multi-laminate

The invention claimed is:

1. A semiconductor device manufacturing method comprising:
a preparation step of preparing a reinforced wafer having a laminated structure that includes a wafer including an element forming surface and a back surface opposite therefrom, a supporting substrate, and a temporary adhesive layer forming temporary adhesion, the temporary adhesive layer being provided between the supporting substrate and a side of the element forming surface of the wafer;
a thinning step in which the wafer of the reinforced wafer is ground from a side of the back surface, forming a thinned wafer;
a bonding step in which a surface of the reinforced wafer and a surface of another wafer having an element forming surface and a back surface opposite therefrom are bonded, forming a wafer laminate;
a removal step of removing the supporting substrate from the wafer laminate; and
a multilayering step in which a surface of the wafer laminate that has been subjected to the removal step is bonded to a surface of another wafer laminate, forming a second wafer laminate from the wafer laminate and the another wafer laminate; wherein
the second wafer laminate obtained through the multilayering step has a laminated configuration that is symmetric in a thickness direction thereof.

2. A semiconductor device manufacturing method comprising:
a preparation step of preparing two reinforced wafers each having a laminated structure that includes a wafer including an element forming surface and a back surface opposite therefrom, a supporting substrate, and a temporary adhesive layer forming temporary adhesion, the temporary adhesive layer being provided between the supporting substrate and a side of the element forming surface of the wafer;
a thinning step of grinding the wafer of each of the reinforced wafers from a side of the back surface, forming a thinned wafer;
a bonding step that is implemented with each of the reinforced wafers, and in which a side of an element forming surface of a base wafer including the element forming surface and a back surface opposite therefrom is bonded, through an adhesive, to the side of the back surface of the thinned wafer of the reinforced wafer, whereby forming two first wafer laminates;

a removal step of removing the supporting substrate from each of the first wafer laminates; and a multilayering step in which the sides of the element forming surface of the thinned wafers or sides of the back surface of the base wafers of two of the first wafer laminates that have been subjected to the removal step are bonded through an adhesive, forming a second wafer laminate from the two first wafer laminates, wherein the second wafer laminate obtained through the multilayering step has a laminated configuration that is symmetrical in a thickness direction thereof.

3. The semiconductor device manufacturing method according to claim 2, the method further comprising prior to the multilayering step:

a preparation step of preparing at least one additional reinforced wafer having a laminated structure that includes a wafer including an element forming surface and a back surface opposite therefrom, a supporting substrate, and a temporary adhesive layer forming temporary adhesion, the temporary adhesive layer being provided between the supporting substrate and a side of the element forming surface of the wafer;

a step of forming a thinned wafer by grinding the wafer in each of the additional reinforced wafers from a side of the back surface of the wafer;

at least one additional bonding step in which the side of the back surface of the thinned wafer in the additional reinforced wafer is bonded through an adhesive to the side of the element forming surface of the thinned wafer of at least one of the first wafer laminates; and a removal step of removing the supporting substrate of the first wafer laminate that has been subjected to the additional bonding step.

4. The semiconductor device manufacturing method according to claim 2, further comprising forming a through electrode extending through the plurality of thinned wafers and at least one base wafer in the second wafer laminate.

5. The semiconductor device manufacturing method according to claim 2, further comprising, prior to the multilayering step, forming, in each first wafer laminate, a through electrode extending through an inside of the first wafer laminate from the element forming surface of the thinned wafer located at one end of the first wafer laminate in a lamination direction to the element forming surface of the base wafer located at another end.

6. The semiconductor device manufacturing method according to claim 2, the method further comprising thinning the base wafer by grinding the side of the back surface of the base wafer.

7. The semiconductor device manufacturing method according to claim 2, wherein the adhesive contains a polymerizable group-containing polyorganosilsesquioxane.

8. The semiconductor device manufacturing method according to claim 2, wherein a temporary adhesive forming the temporary adhesive layer comprises: a polyvalent vinyl ether compound; a compound that has two or more hydroxy groups or carboxy groups that are capable of forming an acetal bond by reacting with a vinyl ether group of the polyvalent vinyl ether compound, the compound capable of forming a polymer with the polyvalent vinyl ether compound; and a thermoplastic resin.

9. The semiconductor device manufacturing method according to claim 8, wherein the bonding step comprises curing treatment to cure the adhesive at a temperature lower than a softening point of the polymer; and the removal step comprises softening treatment to soften the temporary adhesive layer at a temperature higher than the softening point of the polymer.

10. A semiconductor device manufacturing method, the method comprising:

a preparation step of preparing at least four reinforced wafers each having a laminated structure that includes a wafer including an element forming surface and a back surface opposite therefrom, a supporting substrate, and a temporary adhesive layer forming temporary adhesion, the temporary adhesive layer being provided between the supporting substrate and a side of the element forming surface of the wafer;

a thinning step of grinding a side of the back surface of the wafer of each reinforced wafer to thin the wafer;

a bonding step of bonding the sides of the back surface of the wafers of two reinforced wafers that have been subjected to the thinning step, and forming at least two wafer double-layer bodies having the supporting substrate;

a removal step of removing at least one supporting substrate of each of the wafer double-layer bodies; and a multilayering step of bonding the sides of the element forming surface of the wafers of the at least two wafer double-layer bodies, forming a wafer multi-laminate, the sides of the element forming surface thereof being exposed by being subjected to the removal step, wherein the wafer laminate obtained through the multilayering step has a laminated configuration that is symmetrical in a thickness direction thereof.

11. The semiconductor device manufacturing method according to claim 10, further comprising removing the supporting substrate located at one end in a lamination direction of the wafer multi-laminate.

12. The semiconductor device manufacturing method according to claim 10, further comprising an additional multilayering step of bonding the side of the element forming surface of the wafer of the wafer double-layer body, the side of the element forming surface being exposed through the removal step, to the side of the element forming surface, the side being exposed, of the wafer located at one end in a lamination direction of the wafer multi-laminate.

13. The semiconductor device manufacturing method according to claim 10, the method further comprising forming a through electrode extending through an inside of the wafer multi-laminate from the element forming surface of the wafer located at one end of each of the wafer multi-laminate in a lamination direction to the element forming surface of the wafer located at another end.

14. The semiconductor device manufacturing method according to claim 10, wherein bonding of the sides of the back surface to each other in the bonding step is implemented using an adhesive containing a polymerizable group-containing polyorganosilsesquioxane as a thermosetting resin.

15. The semiconductor device manufacturing method according to claim 14, wherein, in the bonding step, the adhesive is applied to one or both two of the back surfaces that are to be bonded, the back surfaces are subjected to affixing through the adhesive, and the adhesive is cured after the affixing.

16. The semiconductor device manufacturing method according to claim 15, wherein in the bonding step, the one or both two of the back surfaces to be bonded are treated with a silane coupling agent prior to application of the adhesive.

17. The semiconductor device manufacturing method according to claim 15, wherein in the bonding step, the affixing is performed at a temperature of from room temperature to 80° C., and after the affixing, the adhesive is cured at a temperature of from 30 to 200° C.

18. The semiconductor device manufacturing method according to claim 10, wherein bonding of the sides of the element forming surface in the multilayering step is implemented using an adhesive containing a polymerizable group-containing polyorganosilsesquioxane as a thermosetting resin.

19. The semiconductor device manufacturing method according to claim 18, wherein, in the multilayering step, the adhesive is applied to one or both two of the element forming surfaces that are to be bonded, the element forming surfaces are subjected to affixing through the adhesive, and the adhesive is cured after the affixing.

20. The semiconductor device manufacturing method according to claim 19, wherein in the multilayering step, the one or both two of the element forming surfaces to be bonded are treated with a silane coupling agent prior to application of the adhesive.

21. The semiconductor device manufacturing method according to claim 19, wherein in the multilayering step, the affixing is performed at a temperature of from room temperature to 80° C., and after the affixing, the adhesive is cured at a temperature of from 30 to 200° C.

\* \* \* \* \*